United States Patent
Hu et al.

(10) Patent No.: US 12,211,789 B2
(45) Date of Patent: Jan. 28, 2025

(54) THREE DIMENSIONAL INTEGRATED CIRCUIT AND FABRICATION THEREOF

(71) Applicants: TAIWAN SEMICONDUCTOR MANUFACTURING COMPANY, LTD., Hsinchu (TW); NATIONAL YANG MING CHIAO TUNG UNIVERSITY, Hsinchu (TW)

(72) Inventors: Chenming Hu, Oakland, CA (US); Shu-Jui Chang, Hsinchu County (TW); Chen-Han Chou, Tainan (TW); Yen-Teng Ho, Hsinchu (TW); Chia-Hsing Wu, New Taipei (TW); Kai-Yu Peng, Miaoli County (TW); Cheng-Hung Shen, New Taipei (TW)

(73) Assignees: TAIWAN SEMICONDUCTOR MANUFACTURING COMPANY, LTD., Hsinchu (TW); NATIONAL YANG MING CHIAO TUNG UNIVERSITY, Hinchu (TW)

( * ) Notice: Subject to any disclaimer, the term of this patent is extended or adjusted under 35 U.S.C. 154(b) by 0 days.

(21) Appl. No.: 18/362,731

(22) Filed: Jul. 31, 2023

(65) Prior Publication Data
US 2023/0378056 A1 Nov. 23, 2023

Related U.S. Application Data

(62) Division of application No. 17/409,092, filed on Aug. 23, 2021, now Pat. No. 11,784,119.

(60) Provisional application No. 63/168,086, filed on Mar. 30, 2021.

(51) Int. Cl.
| | |
|---|---|
| H01L 23/522 | (2006.01) |
| H01L 21/02 | (2006.01) |
| H01L 21/8234 | (2006.01) |
| H01L 23/528 | (2006.01) |
| H01L 27/06 | (2006.01) |

(52) U.S. Cl.
CPC .... *H01L 23/5226* (2013.01); *H01L 21/02581* (2013.01); *H01L 21/02645* (2013.01); *H01L 21/02647* (2013.01); *H01L 21/823475* (2013.01); *H01L 23/5283* (2013.01); *H01L 27/0688* (2013.01)

(58) Field of Classification Search
None
See application file for complete search history.

(56) References Cited

U.S. PATENT DOCUMENTS

| | | | |
|---|---|---|---|
| 2017/0170260 A1* | 6/2017 | Dresselhaus | ........ H01L 29/0665 |
| 2020/0098875 A1 | 3/2020 | Sung | |
| 2020/0105774 A1 | 4/2020 | Penumatcha | |
| 2020/0232107 A1 | 7/2020 | Li | |
| 2020/0312839 A1 | 10/2020 | Majhi | |

(Continued)

*Primary Examiner* — Alexander G Ghyka
(74) *Attorney, Agent, or Firm* — Maschoff Brennan

(57) ABSTRACT

A method includes following steps. First transistors are formed over a substrate. An interconnect structure is formed over the plurality of first transistors. A dielectric layer is formed over the interconnect structure. 2D semiconductor seeds are formed over the dielectric layer. The 2D semiconductor seeds are annealed. An epitaxy process is performed to laterally grow a plurality of 2D semiconductor films respectively from the plurality of 2D semiconductor seeds. Second transistors are formed on the plurality of 2D semiconductor films.

20 Claims, 52 Drawing Sheets

(56) References Cited

U.S. PATENT DOCUMENTS

2020/0411426 A1 12/2020 Lajoie
2020/0411520 A1 12/2020 Lajoie
2020/0411524 A1 12/2020 Arslan

* cited by examiner

THREE DIMENSIONAL INTEGRATED CIRCUIT AND FABRICATION THEREOF

PRIORITY CLAIM AND CROSS-REFERENCE

This application is a divisional of U.S. patent application Ser. No. 17/409,092, filed Aug. 23, 2021, which claims the benefit of U.S. Provisional Application No. 63/168,086, filed on Mar. 30, 2021, all of which are herein incorporated by reference in their entirety.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 23-25A, 26A-27A, and 28 illustrate exemplary perspective views and cross sectional views of various stages for manufacturing a 3D IC structure according to some embodiments of the present disclosure.

FIGS. 29-31A and 32-34 illustrate exemplary cross sectional views of various stages for manufacturing a 3D IC structure according to some other embodiments of the present disclosure.

DETAILED DESCRIPTION

Figure 1A:
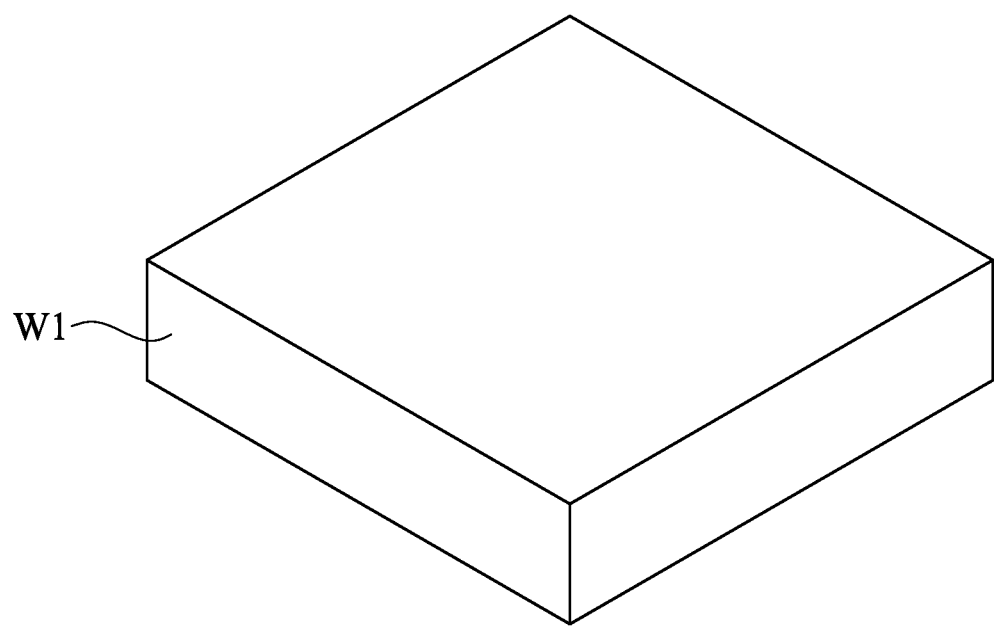
FIGS. 1A-11 illustrate perspective views and cross-sectional views of intermediate stages in manufacturing a 3D integrated circuit (IC) structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

Semiconductor devices are scaled down in essentially a two-dimensional (2D) in nature, in that the volume occupied by the integrated components is essentially on the surface of the semiconductor wafer. Although improvement in lithography has resulted in considerable improvement in 2D integrated circuit (IC) formation, there are physical limits to the density that can be achieved in two dimensions. One of these limits is the minimum size allows for making these components.

Therefore, the present disclosure in various embodiments provides one or more semiconductor islands formed on an amorphous surface of an interconnect structure. The semiconductor islands can serve as active regions of transistors, which in turn allows for forming a three-dimensional (3D) IC having lower transistors at a lower level (e.g., lower than the interconnect structure) and higher transistors at a higher level (e.g., higher than the interconnect structure), which in turn aids in placing more transistors in a given area. Moreover, the present disclosure in various embodiments forms the semiconductor islands by first annealing defective 2D semiconductor seeds into a substantially defect-free (or called defect-less) 2D semiconductor seeds, and then laterally growing 2D semiconductor islands from the substantially defect-free 2D semiconductor seeds, which in turn allows the resultant semiconductor islands having no or negligible crystalline defects.

FIGS. 1A-11 illustrate perspective views and cross-sectional views of intermediate stages in manufacturing a 3D integrated circuit (IC) structure in accordance with some embodiments. It is understood that additional operations can be provided before, during, and after processes shown by FIGS. 1A-11, and some of the operations described below can be replaced or eliminated, for additional embodiments of the method. The order of the operations/processes may be interchangeable.

Figure 1B:
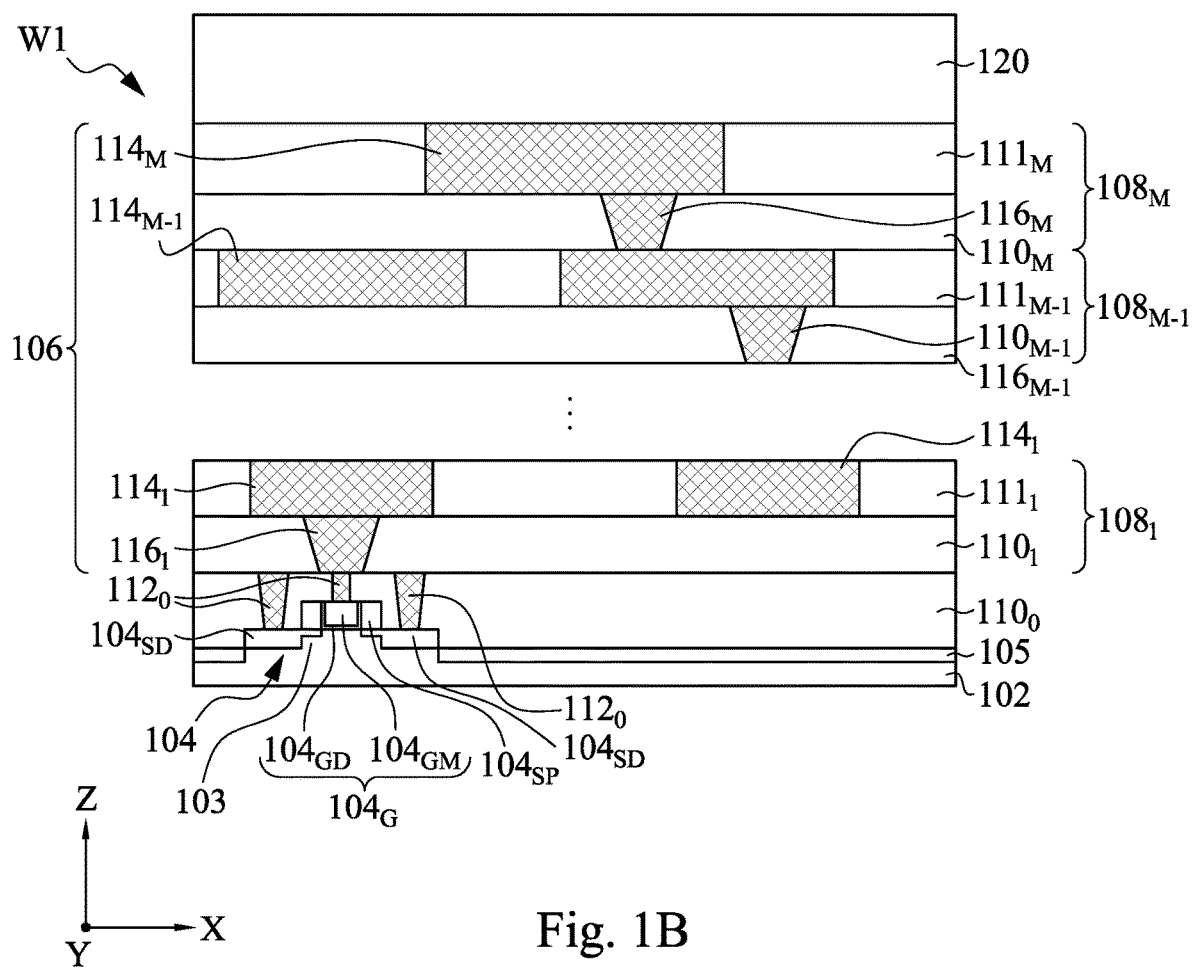

FIG. 1A illustrates a perspective view of an intermediate structure of a wafer W1 in an IC manufacturing process, and FIG. 1B is a cross sectional view of FIG. 1A. In FIGS. 1A and 1B, the semiconductor wafer W1 is an intermediate structure of an IC manufacturing process where transistors and an interconnect structure have been formed. In some embodiments, the semiconductor wafer W1 may comprise a substrate 102. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 104 (illustrated in FIG. 1B as a single transistor) are formed on the substrate 102. The one or more active and/or passive devices 104 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, an interconnect structure 106 is formed over the one or more active and/or passive devices 104 and the substrate 102. The interconnect structure 106 electrically interconnects the one or more active and/or passive devices 104 to form functional electrical circuits within the semiconductor structure 100. The interconnect structure 106 may comprise one or more metallization layers $108_1$ to $108_M$, wherein M is the number of the one or more metallization layers $108_1$ to $108_M$. In some embodiments, the value of M may vary according to design specifications of the semiconductor structure 100. In what follows, the one or more metallization layers $108_1$ to $108_M$ may also be collectively referred to as the one or more metallization layers 108. The metallization layers $108_1$ to $108_M$ comprise dielectric layers $110_1$ to $110_M$ and dielectric layers $111_1$ to $111_M$, respectively. The dielectric layers $111_1$ to $111_M$ are formed over the corresponding dielectric layers $110_1$ to $110_M$. The metallization layers $108_1$ to $108_M$ comprise one or more horizontal interconnects, such as conductive lines $114_1$ to $114_M$, respectively extending horizontally or laterally in dielectric layers $111_1$ to $111_M$ and vertical interconnects, such as conductive vias $116_1$ to $116_M$, respectively extending vertically in dielectric layers $110_1$ to $110_M$. Formation of the interconnect structure 106 can be referred to as a back-end-of-line (BEOL) process.

Contact plugs $112_0$ electrically couple the overlying interconnect structure 106 to the underlying devices 104. In the depicted embodiments, the devices 104 are fin field-effect transistors (FinFET) that are three-dimensional MOSFET structure formed in fin-like strips of semiconductor protrusions 103 referred to as fins. The cross-section shown in FIG. 1B is taken along a longitudinal axis of the fin in a direction parallel to the direction of the current flow between the source/drain regions $104_{SD}$. The fin 103 may be formed by patterning the substrate 102 using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 103 by etching a trench into the substrate 102 using, for example, reactive ion etching (RIE). FIGS. 1A and 1B illustrate a single fin 103, although the substrate 102 may comprise any number of fins. In some other embodiments, the devices 104 are planar transistors or gate-all-around (GAA) transistors.

Shallow trench isolation (STI) regions 105 formed on opposing sidewalls of the fin 103 are illustrated in FIG. 1B. STI regions 105 may be formed by depositing one or more dielectric materials (e.g., silicon oxide) to completely fill the trenches around the fins and then recessing the top surface of the dielectric materials. The dielectric materials of the STI regions 105 may be deposited using a high density plasma chemical vapor deposition (HDP-CVD), low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 105 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 105 such that an upper portion of fins 103 protrudes from surrounding insulating STI regions 105. In some cases, the patterned hard mask used to form the fins 103 may also be removed by the planarization process.

In some embodiments, a gate structure $104_G$ of the FinFET device 104 illustrated in FIG. 1B is a high-k, metal gate (HKMG) gate structure that may be formed using a gate-last process flow. In a gate-last process flow a sacrificial dummy gate structure (not shown) is formed after forming the STI regions 105. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 105. As described in greater detail below, the dummy gate structure may be replaced by the HKMG gate structure $104_G$ as illustrated in FIG. 1B. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

In FIG. 1B, source/drain regions $104_{SD}$ and spacers $104_{SP}$ of the transistor 104 are formed, for example, self-aligned to the dummy gate structures. Spacers $104_{SP}$ may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers $104_{SP}$ along the sidewalls of the dummy gate structures extending laterally onto a portion of the surface of the fin 103.

Source/drain regions $104_{SD}$ are semiconductor regions in direct contact with the semiconductor fin 103. In some embodiments, the source/drain regions $104_{SD}$ may comprise heavily-doped regions and relatively lightly-doped drain extensions, or LDD regions. Generally, the heavily-doped regions are spaced away from the dummy gate structures using the spacers $104_{SP}$, whereas the LDD regions may be formed prior to forming spacers $104_{SP}$ and, hence, extend under the spacers $104_{SP}$ and, in some embodiments, extend further into a portion of the semiconductor fin 103 below the dummy gate structure. The LDD regions may be formed, for example, by implanting dopants (e.g., As, P, B, In, or the like) using an ion implantation process.

The source/drain regions $104_{SD}$ may comprise an epitaxially grown region. For example, after forming the LDD regions, the spacers $104_{SP}$ may be formed and, subsequently, the heavily-doped source and drain regions may be formed self-aligned to the spacers $104_{SP}$ by first etching the fins to form recesses, and then depositing a crystalline semiconductor material in the recess by a selective epitaxial growth (SEG) process that may fill the recess and may extend further beyond the original surface of the fin 103 to form raised source/drain epitaxy structures. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions $104_{SD}$ either in situ during SEG, or by an ion implantation process performed after the SEG, or by a combination thereof.

Once the source/drain regions $104_{SD}$ are formed, a first ILD layer (e.g., lower portion of the ILD layer $110_0$) is deposited over the source/drain regions $104_{SD}$. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer. The HKMG gate structures $104_G$, illustrated in FIG. 1B, may then be formed by first removing the dummy gate structures using one or more etching techniques, thereby creating recesses between respective spacers $104_{SP}$. Next, a replacement gate dielectric layer $104_{GD}$ comprising one or more dielectrics, followed by a replacement gate metal layer $104_{GM}$ comprising one or more metals, are deposited to completely fill the recesses. Excess portions of the gate structure layers $104_{GD}$ and $104_{GM}$ may be removed from over the top surface of first ILD using, for example, a CMP process. The resulting structure, as illustrated in FIG. 1B, may include remaining portions of the HKMG gate layers $104_{GD}$ and $104_{GM}$ inlaid between respective spacers $104_{SP}$.

The gate dielectric layer $104_{GD}$ includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate metal layer $104_{GM}$ may be a multilayered metal gate stack comprising a barrier layer, a work function layer, and a gate-fill layer formed successively on top of gate dielectric layer $104_{GD}$. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

After forming the HKMG structure $104_G$, a second ILD layer is deposited over the first ILD layer, and these ILD layers are in combination referred to as the ILD layer $110_0$, as illustrated in FIG. 1B. In some embodiments, the insulating materials to form the first ILD layer and the second ILD layer may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer and the second ILD layer may be deposited using any suitable method, such as CVD, physical vapor deposition (PVD), ALD, PEALD, PECVD, SACVD, FCVD, spin-on, and/or the like, or a combination thereof.

As illustrated in FIG. 1B, electrodes of electronic devices formed in the substrate 102 may be electrically connected to conductive lines $114_1$ to $114_M$ and the conductive vias $116_1$ to $116_M$ using contacts $112_0$ formed through the intervening dielectric layers. In the example illustrated in FIG. 1B, the contacts $112_0$ make electrical connections to the gate structure $104_G$ and the source/drain regions $104_{SD}$ of FinFET 104. The contacts $112_0$ may be formed using photolithography, etching and deposition techniques.

For example, a patterned mask may be formed over the ILD layer $110_0$ and used to etch openings that extend through the ILD layer $110_0$ to expose the gate structure $104_G$ as well as the source/drain regions $104_{SD}$. Thereafter, conductive liner may be formed in the openings in the ILD layer $110_0$. Subsequently, the openings are filled with a conductive fill material. The liner comprises barrier metals used to reduce out-diffusion of conductive materials from the contacts $112_0$ into the surrounding dielectric materials. In some embodiments, the liner may comprise two barrier metal layers. The first barrier metal comes in contact with the semiconductor material in the source/drain regions $104_{SD}$ and may be subsequently chemically reacted with the heavily-doped semiconductor in the source/drain regions $104_{SD}$ to form a low resistance ohmic contact, after which the unreacted metal may be removed. For example, if the heavily-doped semiconductor in the source/drain regions $104_{SD}$ is silicon or silicon-germanium alloy semiconductor, then the first barrier metal may comprise Ti, Ni, Pt, Co, other suitable metals, or their alloys, and may form silicide with the source/drain regions $104_{SD}$. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD $110_0$. The resulting conductive plugs extend into the ILD layer $110_0$ and constitute contacts $112_0$ making physical and electrical connections to the electrodes of electronic devices, such as the tri-gate FinFET 104 illustrated in FIG. 1B.

After forming the contacts $112_0$, the interconnect structure 106 including multiple interconnect levels may be formed, stacked vertically above the contact plugs $112_0$ formed in the ILD layer $110_0$, in accordance with a back end of line (BEOL) scheme adopted for the integrated circuit design. In the BEOL scheme illustrated in FIG. 1B, various interconnect levels have similar features. However, it is understood that other embodiments may utilize alternate integration schemes wherein the various interconnect levels may use different features. For example, the source/drain contacts $112_0$, which are shown as vertical connectors, may be extended to form conductive lines which transport current laterally.

The multiple interconnect levels include, for example, the conductive lines $114_1$ to $114_M$ and the conductive vias $116_1$ to $116_M$ that may be formed in the respective IMD layers $110_1$ to $110_M$ and $111_1$ to $111_M$ using any suitable method, such as a single damascene process, a dual damascene process, or the like. In some embodiments, the IMD layers $110_1$ to $110_M$ and $111_1$ to $111_M$ may include low-k dielectric materials having k values, for example, lower than about 4.0 or even 2.0 disposed between such conductive features. In some embodiments, the IMD layers may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The conductive lines $114_1$ to $114_M$ and the conductive vias $116_1$ to $116_M$ may comprise conductive materials such as copper, aluminum, tungsten, combinations thereof, or the like. In some embodiments, the conductive lines $114_1$ to $114_M$, and the conductive vias $116_1$ to $116_M$ may further comprise one or more barrier/adhesion layers (not shown) to protect the respective IMD layers $110_1$ to $110_M$ and $111_1$ to $111_M$ from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

An additional ILD layer 120 is formed over the metallization layer $108_M$ of interconnect structure 106 using, for example, PVD, CVD, ALD or the like. The ILD layer 120 serves as a substrate supporting 2D semiconductor materials, which will be discussed in greater detail below. Therefore, the ILD layer 120 plays a different role than the underlying IMD layers $110_1$ to $110_M$ and $111_1$ to $111_M$ and ILD layer $110_0$, and thus may have a different thickness and/or material than the IMD layers $110_1$ to $110_M$ and $111_1$ to $111_M$ and ILD layer $110_0$. For example, the ILD layer 120 may be thinner or thicker than one or more of the IMD layers $110_1$ to $110_M$ and $111_1$ to $111_M$ and ILD layer $110_0$. Alternatively, the ILD layer 120 may have a same thickness and/or material as one or more of the IMD layers $110_1$ to $110_M$ and $111_1$ to $111_M$ and ILD layer $110_0$.

In some embodiments, the ILD layer 120 may include low-k dielectric materials having k values, for example, lower than about 4.0 or even 2.0. For example, the ILD layer 120 may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like.

Figure 2A:
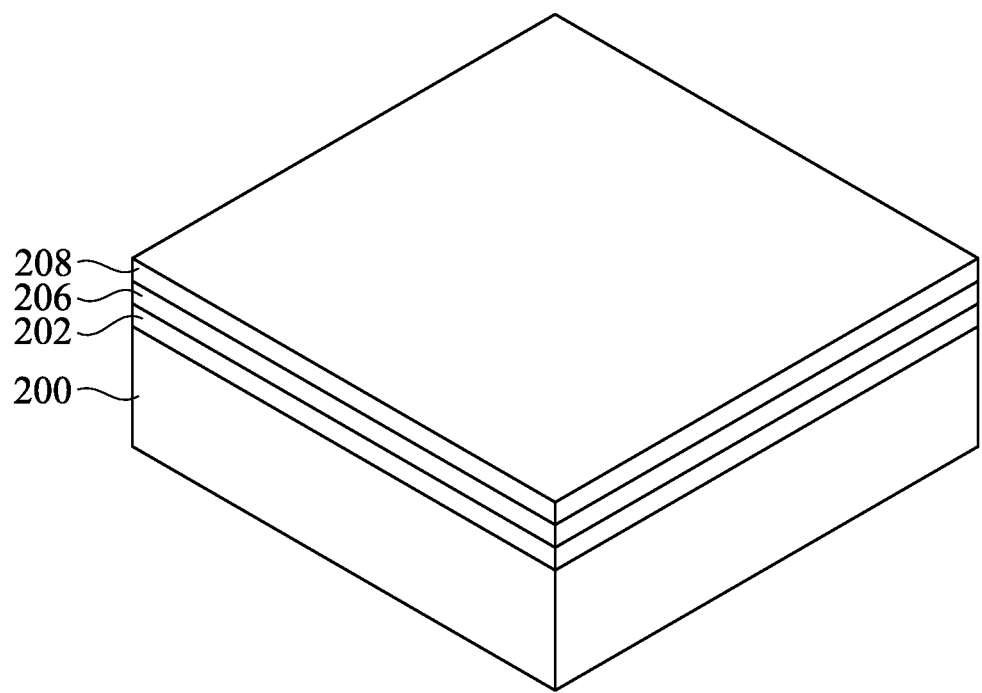

FIG. 2A illustrates a perspective view of an intermediate stage in formation of a 2D semiconductor layer 202 in accordance some embodiments of the present disclosure. 2D semiconductor materials are usually few-layer thick and exist as stacks of strongly bonded layers with weak interlayer van der Waals attraction, allowing the layers to be mechanically or chemically exfoliated into individual, atomically thin layers. The 2D semiconductor materials are promising candidates of the channel, source, drain materials of transistors. Examples of 2D semiconductor materials include transition metal dichalcogenides (TMDs), graphene, layered III-VI chalcogenide, graphene, hexagonal Boron Nitride (h-BN), black phosphorus or the like. The 2D semiconductor may include one or more layers and can have a thickness within the range of about 0.5-100 nm in some embodiments. One advantageous feature of the few-layered 2D semiconductor is the high electron mobility value, which is within a range of about 50-1000 $cm^2/V$-sec or even higher. It is understood that the bulk silicon, when cut to a low thickness (e.g., about 2 nm) comparable with a thickness of a 2D material film, can have its mobility degraded drastically.

In FIG. 2A, the 2D semiconductor layer 202 is grown on a crystalline substrate 200 for crystal orientation control. In some embodiments, the crystalline substrate 200 may comprise, for example, bulk silicon, doped or undoped, or an active layer of a semiconductor-on-insulator (SOI) substrate. In some embodiments, the crystalline substrate 200 may comprise a sapphire substrate. The sapphire substrate 200 may be a c-plane sapphire substrate (sometimes referred to as a c-sapphire) substrate. In accordance with alternative embodiments, the substrates with other planes (such as M plane, R plane, or A plane) may be adopted. Substrate 200 may be in the form of a wafer, and may have a round top-view shape or a rectangular top-view shape. The diameter of substrate 200 may be 3 inch, 12 inch, or greater. In some embodiments, the crystalline substrate 200 is a single-crystalline substrate so that the resultant 2D semiconductor layer 202 may be a single-crystalline structure with a controlled crystal orientation attributed to the crystalline substrate 200.

In some embodiments, the 2D semiconductor layer 202 is a transition metal dichalcogenide (TMD) material which has the formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of dichalcogenide materials that are suitable for the 2D semiconductor layer 202 include $MoS_2$, $WS_2$, $WSe_2$, $MoSe_2$, $MoTe_2$, $WTe_2$, the like, or a combination thereof. However, any suitable transition metal dichalcogenide material may alternatively be used. Once formed, the transition metal dichalcogenide material is in a layered structure with a plurality of two-dimensional layers of the general form X-M-X, with the chalcogen atoms in two planes separated by a plane of metal atoms.

Figure 2B:
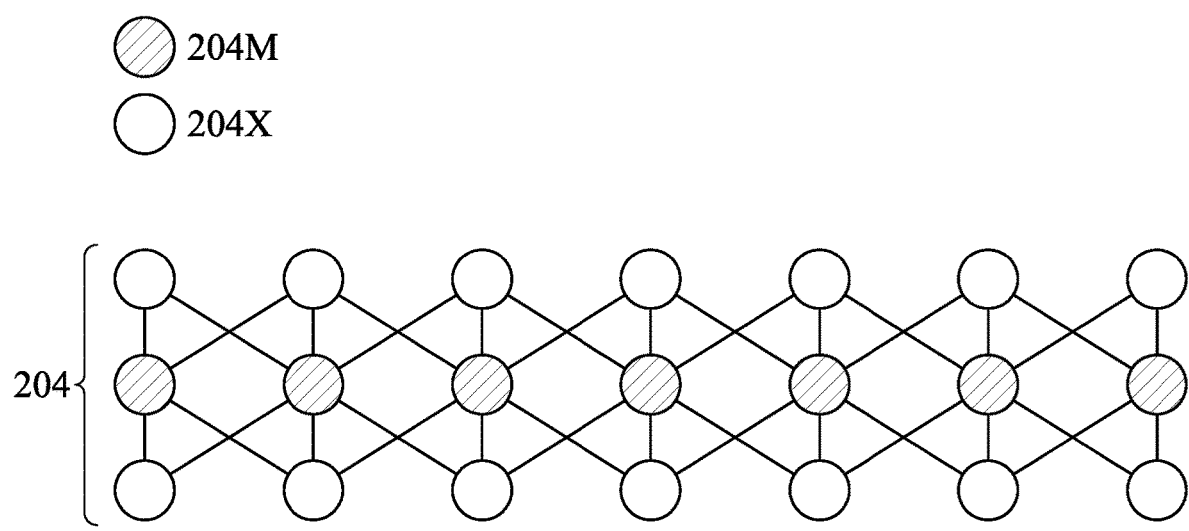

The 2D semiconductor layer 202 may be a mono-layer or may include a few mono-layers. FIG. 2B illustrates a schematic view of a mono-layer 204 of an example TMD in accordance with some example embodiments. In FIG. 2B, the one-molecule thick TMD material layer comprises transition metal atoms 204M and chalcogen atoms 204X. The transition metal atoms 204M may form a layer in a middle region of the one-molecule thick TMD material layer, and the chalcogen atoms 204X may form a first layer over the layer of transition metal atoms 204M, and a second layer underlying the layer of transition metal atoms 204M. The transition metal atoms 204M may be W atoms or Mo atoms, while the chalcogen atoms 204X may be S atoms, Se atoms, or Te atoms. In the example of FIG. 2B, each of the transition metal atoms 204M is bonded (e.g. by covalent bonds) to six chalcogen atoms 204X, and each of the chalcogen atoms 204X is bonded (e.g. by covalent bonds) to three transition metal atoms 204M. Throughout the description, the illustrated cross-bonded layers including one layer of transition metal atoms 204M and two layers of chalcogen atoms 204X in combination are referred to as a mono-layer 204 of TMD.

In some embodiments, the 2D semiconductor layer 202 is grown on the crystalline substrate 200 by using suitable deposition techniques. For example, in some embodiments where the 2D semiconductor layer 202 is TMD, the TMD layer 202 may be formed using CVD, with $MoO_3$ and a sulfur-containing gas such as sulfur vapor or $H_2S$ as process gases and $N_2$ as a carrier gas. The formation temperature may be between about 600° C. and about 700° C., in accordance with some exemplary embodiments, and higher or lower temperatures may be used. The process conditions are controlled to achieve the desirable total count of mono-layers 204. In accordance with alternative embodiments, plasma-enhanced (PECVD) or other applicable methods are used. In some embodiments, the 2D semiconductor layer 202 grown on the substrate 200 may include crystalline defects such as vacancy defects, interstitial defects, and/or other defects, and thus the 2D semiconductor layer 202 may be called a defective 2D semiconductor layer in some embodiments of the present disclosure. Although the defective 2D semiconductor layer 202 includes crystalline defects, it still includes an expected or controlled crystal orientation depending on the crystal orientation of the underlying crystalline substrate 200. In some embodiments, the defective 2D semiconductor layer 202 may be grown in a form of defective 2D semiconductor flakes or a continuous defective 2D semiconductor film.

The defective 2D semiconductor layer 202 is then transferred onto the ILD layer 120 of the wafer W1 and used in forming transistors. FIG. 2A also illustrates preparation for transferring the defective 2D semiconductor layer 202 onto the ILD layer 120 of the wafer W1. In FIG. 2A, a protection film 206 is formed on the defective 2D semiconductor layer 202. The protection film 206 has the function of protecting the defective 2D semiconductor layer 202 from the damage during the transfer process. In some embodiments, protection film 206 comprises a photoresist material such as polymethyl methacrylate (PMMA) or other suitable material, which is in a flowable form, and is coated on the defective 2D semiconductor layer 202, for example, using spin coating. The coated protection film 206 is cured and solidified. In accordance with alternative embodiments, other types of flowable and curable material or dry film that may provide protection may also be used. Thermal release tape 208 is then covered on PMMA film 206. Thermal release tape 208 may be formed of a material that may lose adhesion under a thermal condition or other conditions (such as radiation).

Figure 3A:
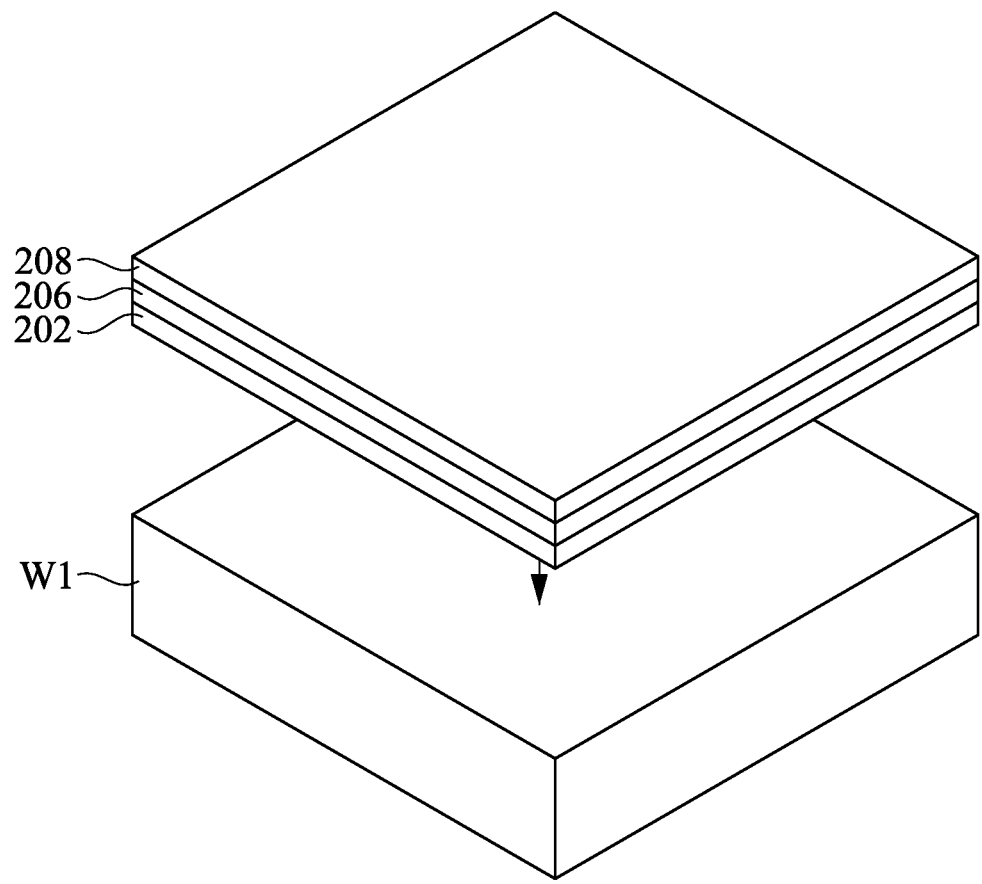
Figure 3B:
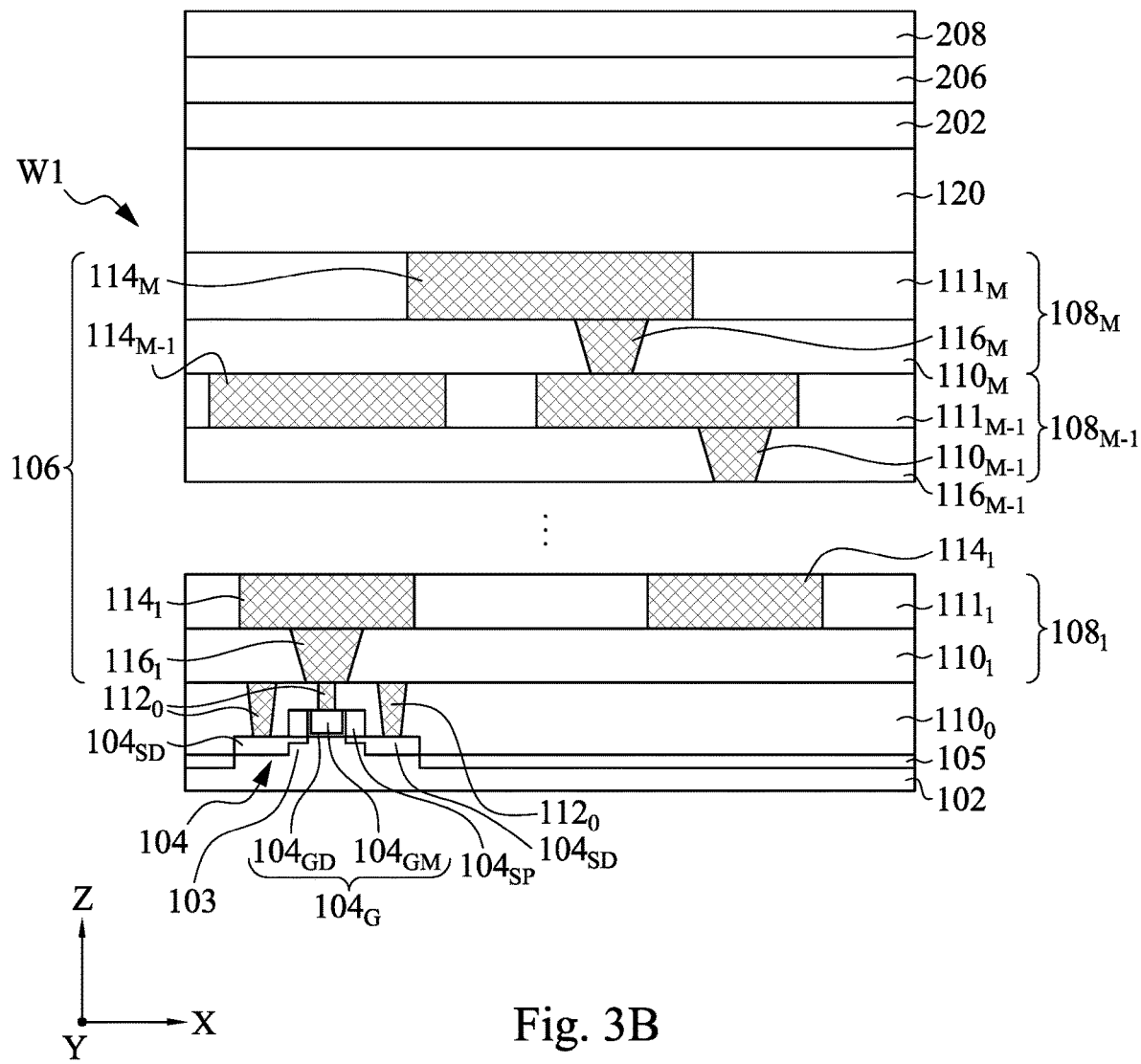

After the defective 2D semiconductor layer 202 is covered with the protection film 206 and the thermal release tape 208, the defective 2D semiconductor layer 202 is mechanically or chemically exfoliated from the underlying crystalline substrate 200. Then, the defective 2D semiconductor layer 202 and the overlying protection film 206 and thermal release tape 208 are transferred onto the ILD layer 120 of the wafer W1, as illustrated in FIGS. 3A-3B. Next, the thermal release tape 208 and protection layer 206 are removed from the defective 2D semiconductor layer 202. In accordance with some embodiments of the present disclosure, thermal release tape 208 is removed by baking the structure shown in FIG. 3B, for example, at a temperature in the range between about 120° C. and about 250° C., so that thermal release tape 208 loses adhesiveness, and hence may be removed from protection layer 206. The baking may be performed by placing the structure as shown in FIG. 3B on a hot plate (not shown). Next, the protection film 206 is removed, for example through etching or dissolving. In accordance with some embodiments in which protection film 206 is formed of a photoresist material (e.g., PMMA), the protection film 206 is removed by immersing the structure in hot acetone, for example, for a period of time in the range between about 20 minutes and about 70 minutes. The temperature of the hot acetone may be in the range between about 35° C. and about 90° C.

After removal of the protection film 206, the defective 2D semiconductor layer 202 remains on the ILD layer 120. It is appreciated that defective 2D semiconductor layer 202 is a single-crystalline film, regardless of the material and the lattice structure of the underlying material such as the amorphous material of the ILD layer 120 (e.g., silicon oxide or nitride). This is advantageous over growing a 2D material on the amorphous material of the ILD layer 120, because it is challenging to grow a single-crystalline 2D semiconductor film from the amorphous material.

Figure 4A:
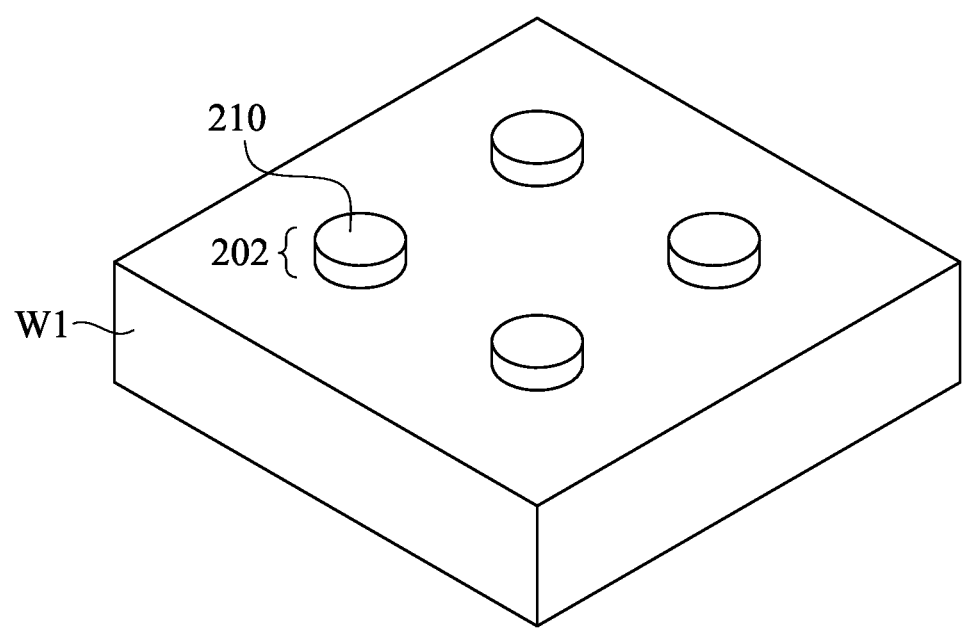
Figure 4B:
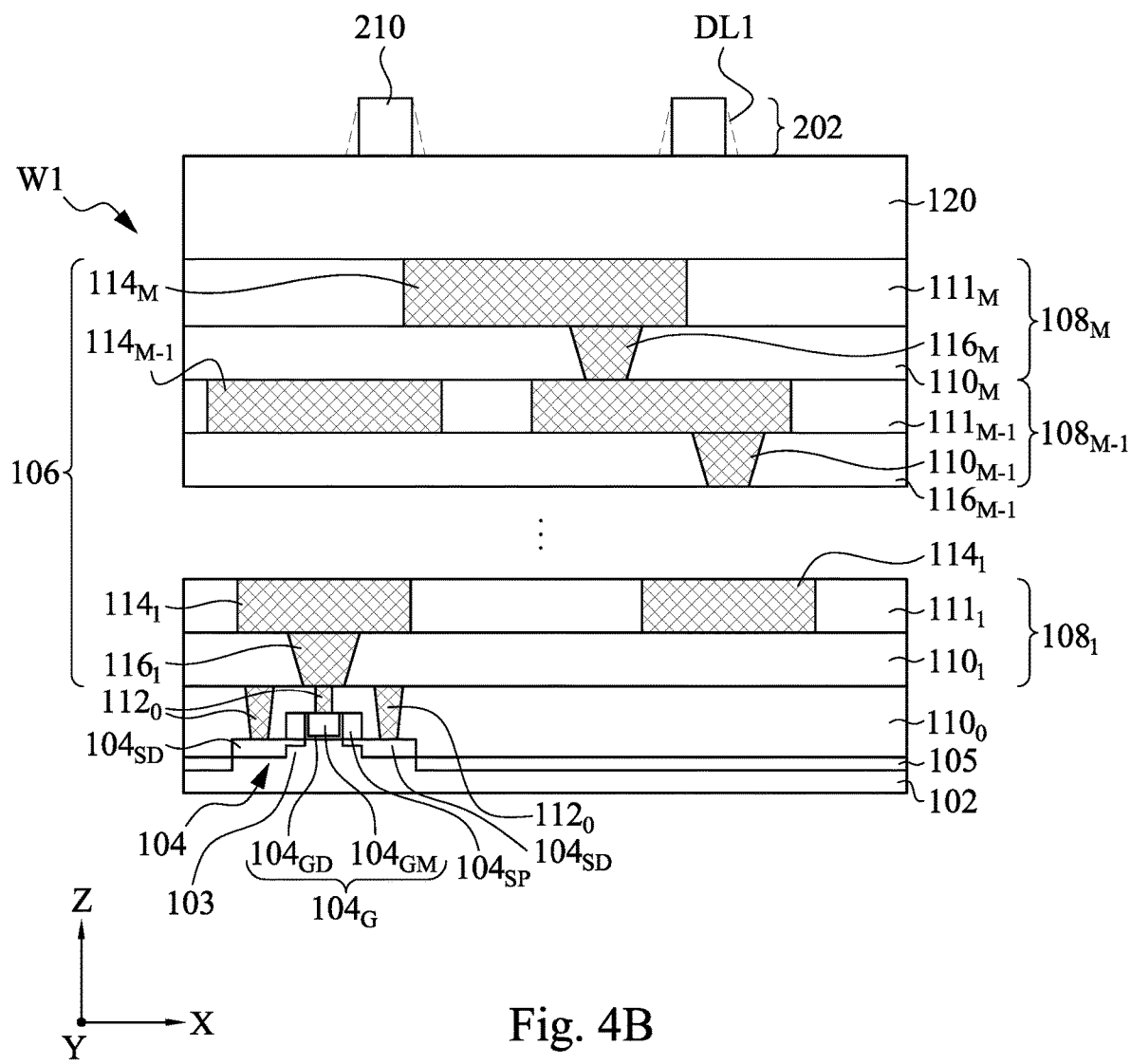

In FIGS. 4A-4B, the defective 2D semiconductor layer 202 is patterned into a plurality of defective 2D semiconductor seeds 210 by using suitable photolithography and etching techniques. In some embodiments, the defective 2D semiconductor seeds 210 are substantially equidistantly arranged in rows and columns from top view, and each seed 210 has a small volume less than about 0.05 $\mu m^3$ (e.g., having 10 $\mu m^2$ in surface area and 0.005 $\mu m$ in thickness). For example, a mask layer is first formed over the defective 2D semiconductor layer 202 and then patterned to form a pattern of the seeds 210, and then an etching process is performed on the defective 2D semiconductor layer 202 by using the patterned mask layer as an etch mask, thus patterning the defective 2D semiconductor layer 202 into the defective 2D semiconductor seeds 210.

In some embodiments, the patterned mask layer used for forming the defective 2D semiconductor seeds 210 may comprise an organic material, such as a photoresist material, and may be formed using a spin-on coating process, followed by patterning the photoresist material to have the pattern of the seeds 210 using suitable lithography techniques. For example, photoresist material is irradiated (exposed) and developed to remove portions of the photoresist material. In greater detail, a photomask (not shown) may be placed over the photoresist material, which may then be exposed to a radiation beam provided by a radiation source such as ultraviolet (UV) source, deep UV (DUV) source, extreme UV (EUV) source, and X-ray source. For example, the radiation source may be a mercury lamp having a wavelength of about 436 nm (G-line) or about 365 nm (I-line); a Krypton Fluoride (KrF) excimer laser with wavelength of about 248 nm; an Argon Fluoride (ArF) excimer laser with a wavelength of about 193 nm; a Fluoride ($F_2$) excimer laser with a wavelength of about 157 nm; or other light sources having an appropriate wavelength (e.g., below approximately 100 nm). In another example, the light source is an EUV source having a wavelength of about 13.5 nm or less.

Once the patterned mask has been formed over the defective 2D semiconductor layer 202, the defective 2D semiconductor layer 202 is patterned into the defective 2D semiconductor seeds 210 by using the patterned mask as an etch mask. The patterning process may be any acceptable etch process, such as a reactive ion etch (RIE), neutral beam etch (NBE), the like, or a combination thereof. The etching may be anisotropic, thus allowing the defective 2D semiconductor seeds 210 having substantially straight sidewalls. Although the defective 2D semiconductor seeds 210 illustrated in FIG. 4B have vertical sidewalls, the etching process may lead to tapered sidewalls, as indicated by dash line DL1, in accordance with some other embodiments.

Figure 5A:
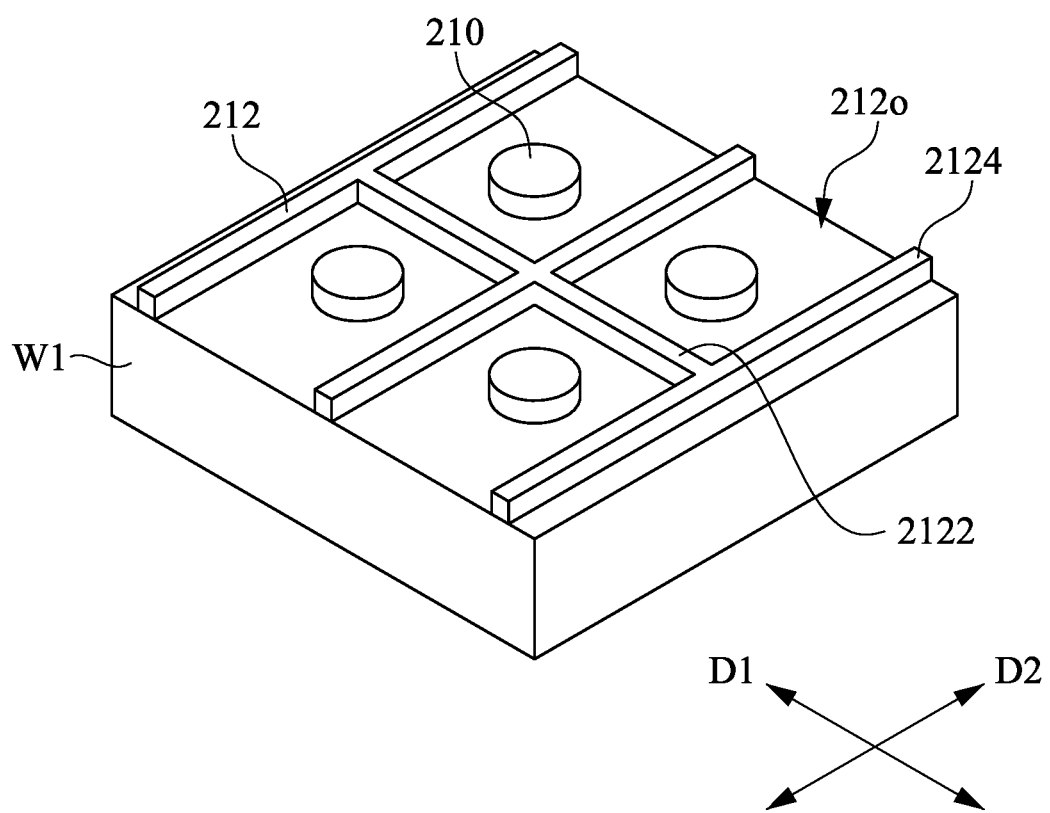
Figure 5B:
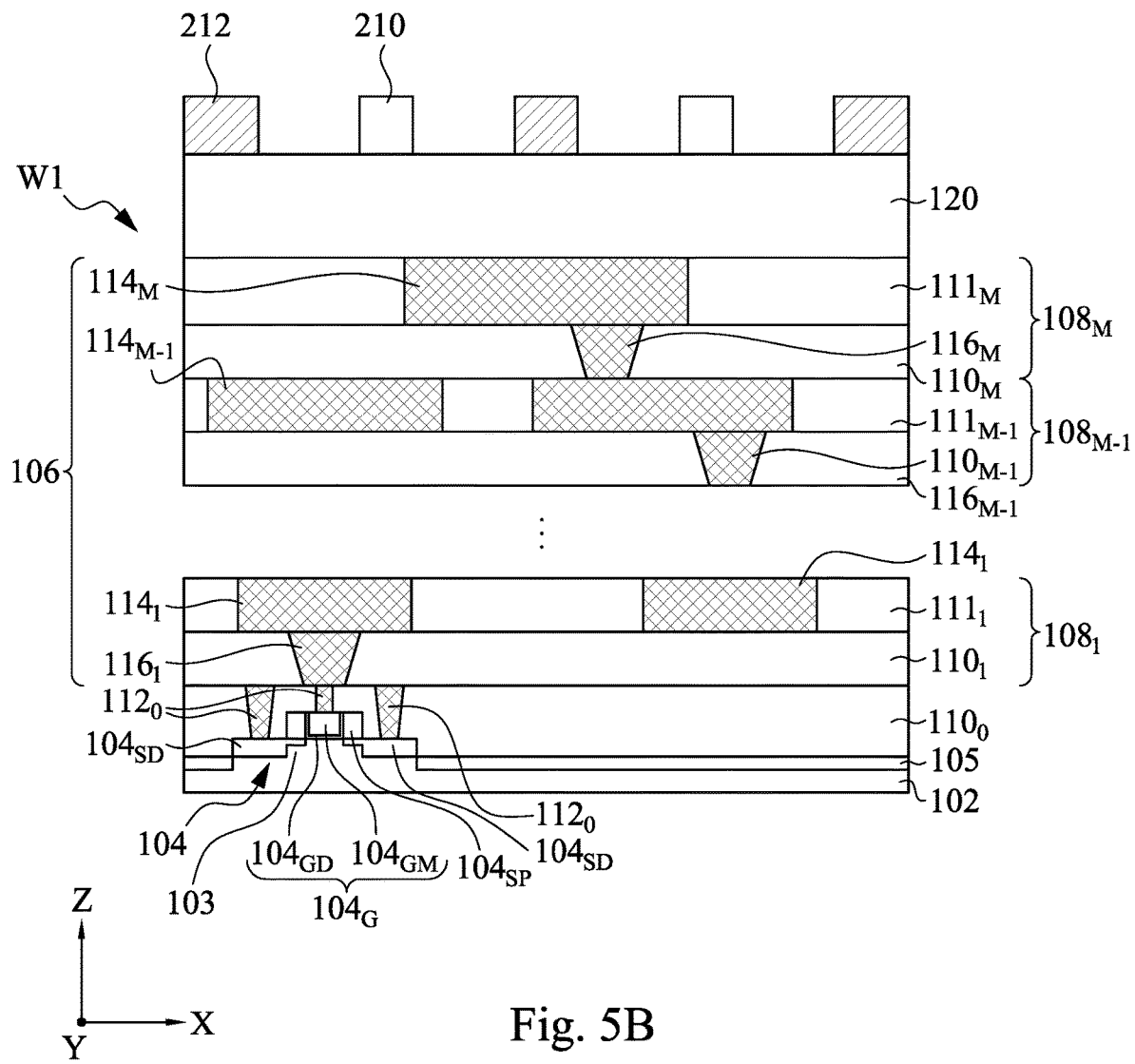
Figure 7A:
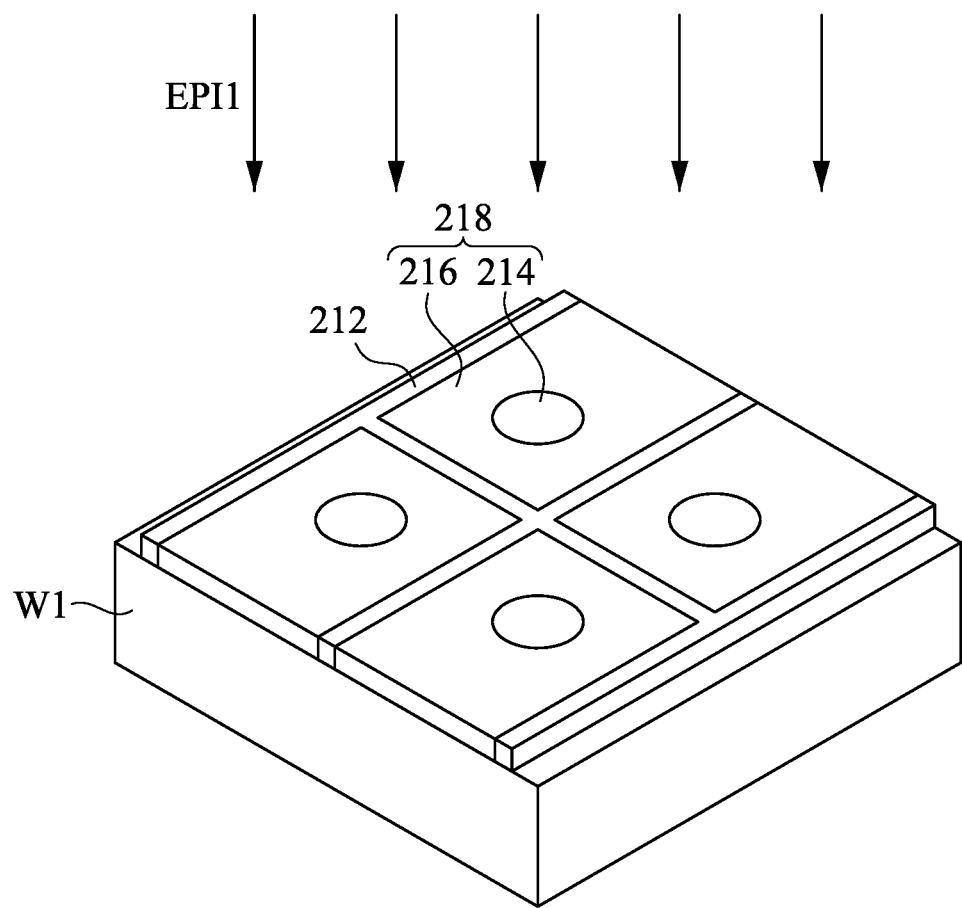
Figure 7B:
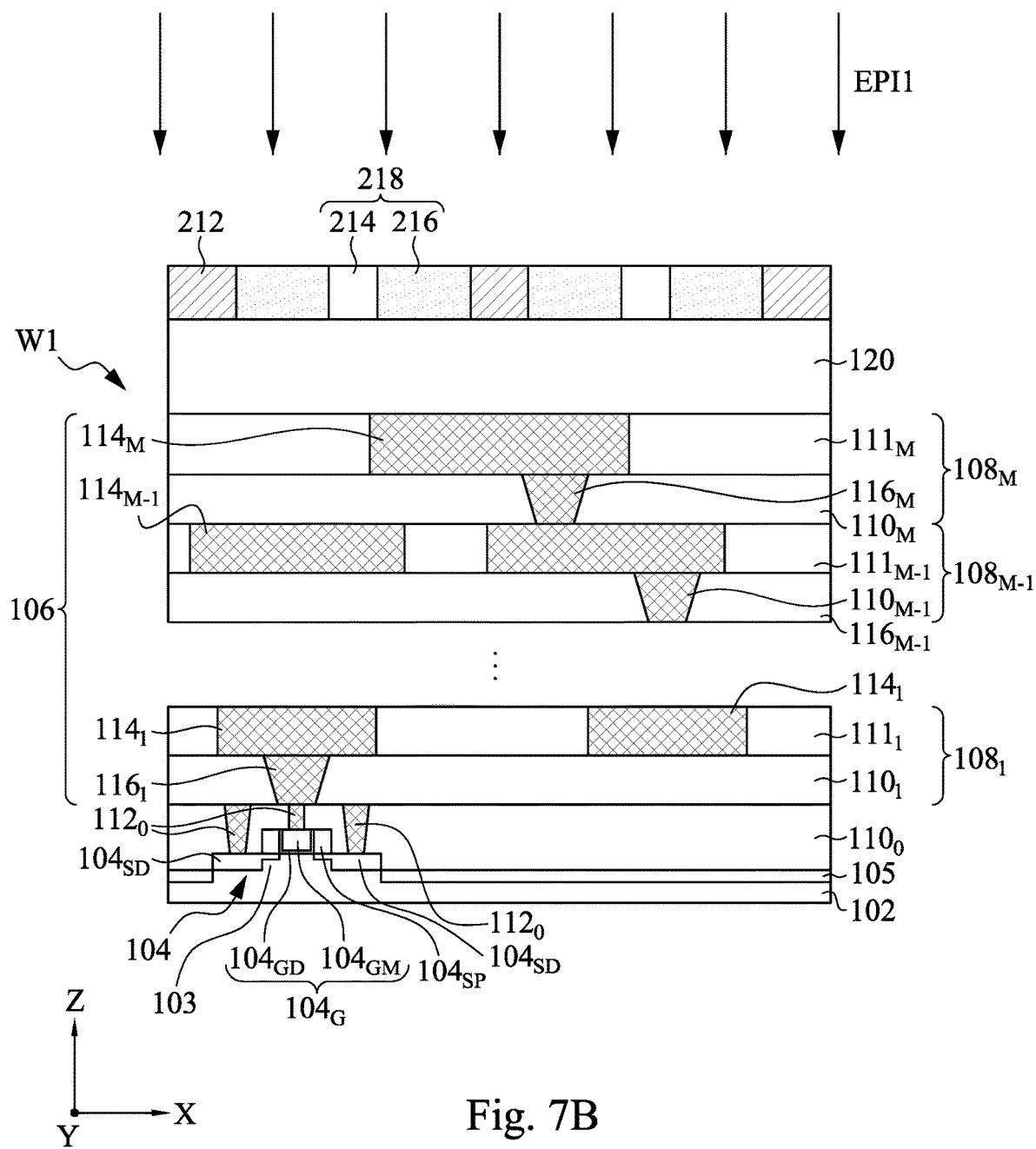

In FIGS. 5A-5B, a dielectric grid 212 is formed over the ILD layer 120 of the wafer W1 before following lateral growth from 2D semiconductor seeds (e.g., as illustrated in FIGS. 7A-7B). The dielectric grid 212 is localized to expected crystal grain boundaries that are supposed to form in the following lateral epitaxial growth process, which in turn prevents crystal grain boundaries formed in the subsequent lateral epitaxial growth. Stated differently, the pattern of the dielectric grid 212 and the pattern of the 2D semiconductor seeds 210 are co-designed and coordinated. Moreover, the pattern of the dielectric grid 212 and subsequently formed IC devices (e.g., transistors) are co-designed and coordinated as well. The dielectric grid 212 has grid cells 212o corresponding to the defective 2D semiconductor seeds 210 in a one-to-one manner. In some embodiments, the defective 2D semiconductor seeds 210 have centers substantially aligned with centers of the grid cells 212o. In some embodiments, the dielectric grid 212 includes a plurality of first grid lines 2122 extending in a first direction D1 and a plurality of second grid lines 2124 extending in a second direction D2 perpendicular to the first direction D1 and intersecting the plurality of first grid lines 2122. Each grid cell 210o is defined by corresponding two of the first grid lines 2122 and corresponding two of the second grid lines 2124, and thus has a rectangular or square top-view profile. In some embodiments, the defective 2D semiconductor seeds 210 have a circular or elliptical top-view profile and thus have a different top-view profile than the grid cells 210o.

In some embodiments, the dielectric grid 212 may include suitable dielectric materials such as low-k dielectric materials having k values, for example, lower than about 4.0 or even 2.0. For example, the ILD layer 120 may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like. The dielectric grid 212 is formed by, for example, depositing a dielectric layer over the defective 2D semiconductor seeds 210, followed by patterning the dielectric layer into the dielectric grid by using suitable photolithography and etching techniques.

Figure 6A:
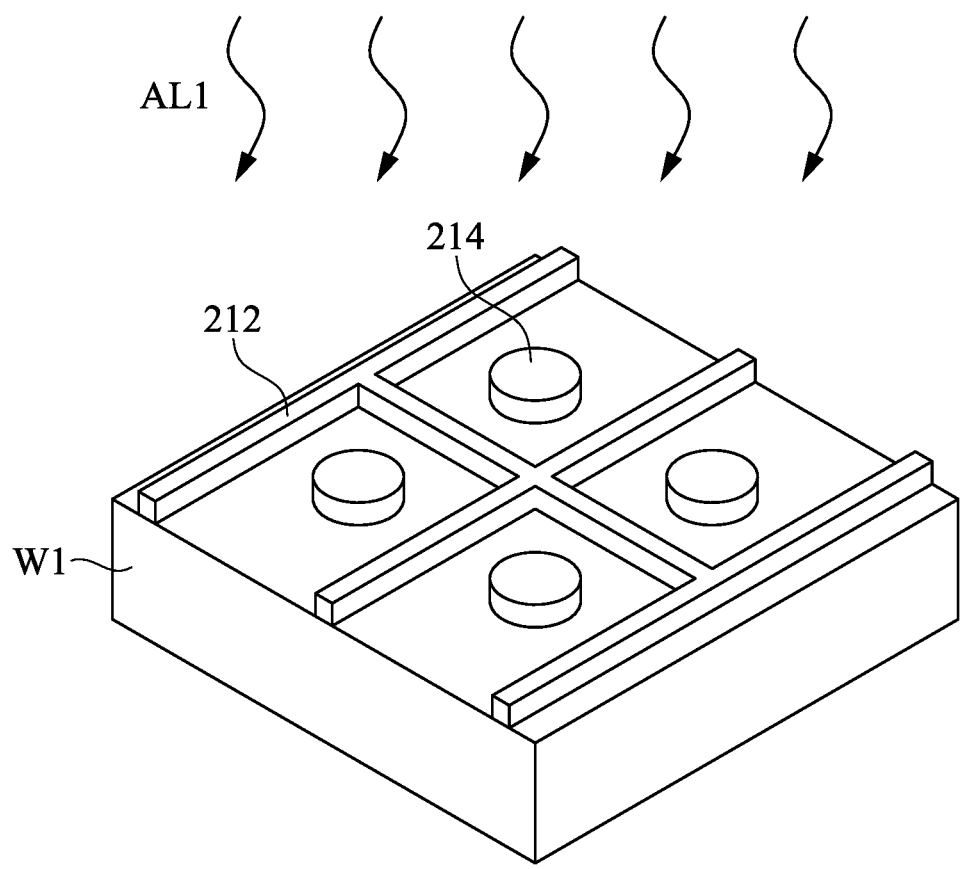
Figure 6B:
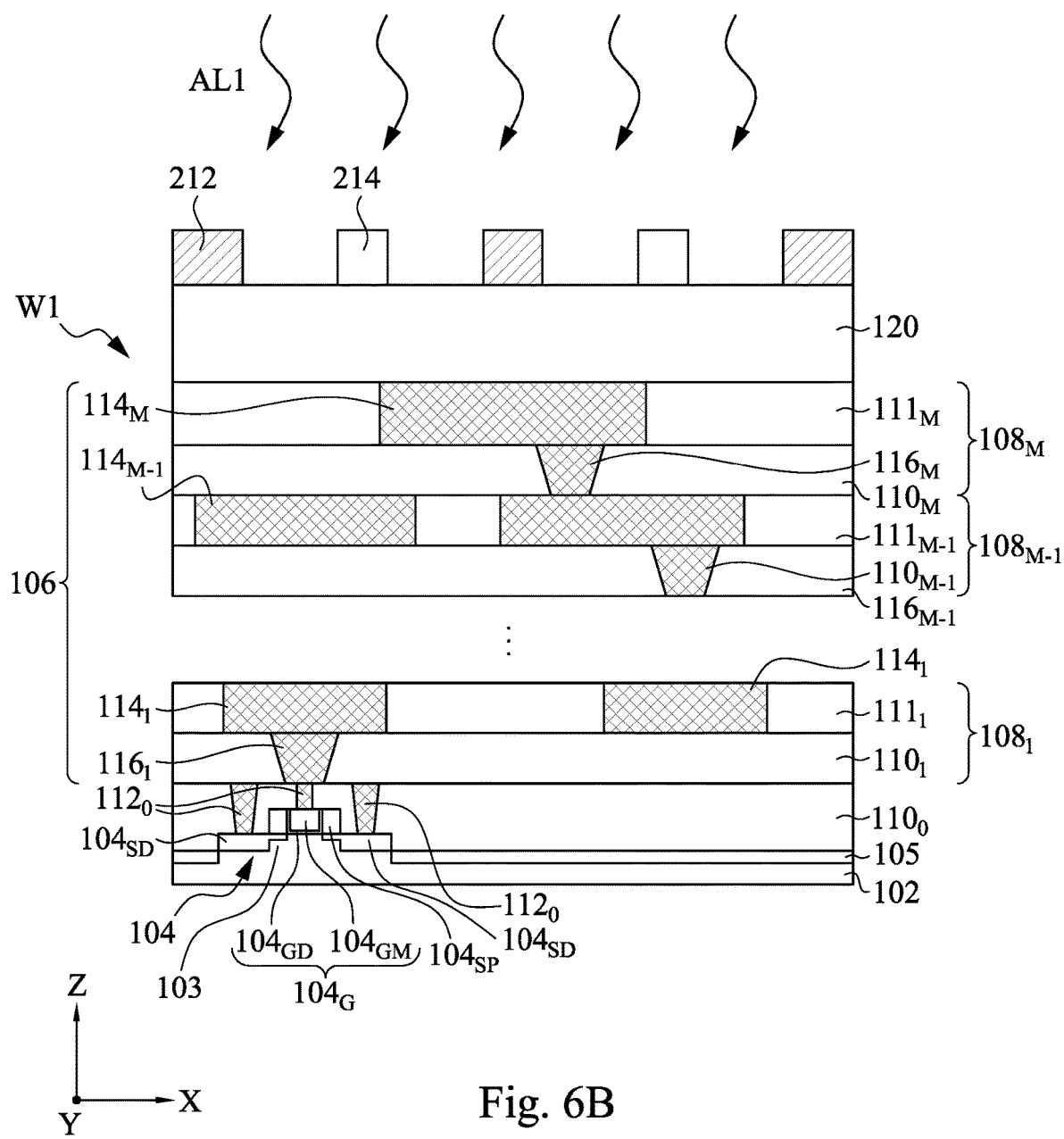

In FIGS. 6A-6B, an annealing process AL1 is performed to convert the defective 2D semiconductor seeds 210 into substantially defect-free (or called defect-less) 2D semiconductor seeds 214. For example, the annealing process AL1 is performed such that the crystalline defects (e.g., vacancies and/or interstitials) in each 2D semiconductor seed diffuse to edges of the 2D semiconductor seed and become annihilated, thus decreasing a number of the crystalline defects in each 2D semiconductor seed to lower than a threshold that qualifies as transistor channel, source, and/or drain. Because 2D semiconductor materials have no dangling bonds and hence no or negligible bonding force with the underlying amorphous material of the ILD layer 120, it is easier to diffuse the crystalline defects in 2D semiconductor materials than in 3D semiconductor materials (e.g., silicon, silicon germanium or the like). Moreover, because the 2D semiconductor seeds have a small size as compared to a blanket 2D semiconductor layer 202 (as illustrated in FIG. 3B), it is easier to diffuse the crystalline defects to edges of 2D semiconductor seeds 210 than diffusing crystalline defects to edges of the 2D semiconductor layer 202.

In some embodiments, the annealing process AL1 is performed at a temperature from about 400 degrees Centigrade to about 1000 degrees Centigrade, depending on the annealing ambient gas. In some embodiments, because the annealing process AL1 is performed on the small 2D semiconductor seeds, the annealing process AL1 can be performed at a temperature from about 300 degrees Centigrade to about 600 degrees Centigrade to prevent seed size shrinkage. If the annealing temperature is excessively high (e.g., higher than about 1000 degrees Centigrade), the excessively high temperature may melt or vaporize the 2D semiconductor material, or induce chemical reaction with process gases, thus resulting in increased defects in 2D semiconductor seeds. If the annealing temperature is excessively low (e.g., lower than about 300 degrees Centigrade), the excessive low temperature may provide insufficient activation energy for crystallization, or may result in unnecessary deposition phenomenon. In some detailed embodiments, the annealing process AL1 for forming defect-less 2D semiconductor seeds 214 is performed at a temperature of about 500 degrees Centigrade to about 600 degrees Centigrade, for a duration time about 1 minute to about 90 minutes, and using $H_2S$ or $H_2Se$ as an ambient gas.

In the depicted embodiments, the annealing process AL1 is performed after forming the dielectric grid 212, which in turn prevents the defect-less 2D semiconductor seeds 214 from any potential damages that may be caused by the deposition and etching process of forming the dielectric grid 212. However, in some other embodiments, the annealing process AL1 can be performed before forming the dielectric grid 212. In that case, the defect-less 2D semiconductor seeds 214 are formed before formation of the dielectric grid 212.

In FIGS. 7A-7B, an epitaxial growth process EPI1 is performed to laterally grow 2D semiconductor films 216 by using the defect-less 2D semiconductor seeds 214 as seeds, so that the 2D semiconductor films 216 laterally surround the defect-less 2D semiconductor seeds 214, respectively.

The 2D semiconductor films 216 have a surface area (e.g. top surface area) greater than a surface area of the defect-less 2D semiconductor seeds 214, and substantially the same thickness as the defect-less 2D semiconductor seeds 214. A defect-less 2D semiconductor seed 214 and a corresponding 2D semiconductor film 216 laterally grown from the defect-less 2D semiconductor seed 214 can be collectively referred to as a 2D semiconductor island 218 confined within a grid cell in the dielectric grid 212. The 2D semiconductor islands 218 are substantially equidistantly arranged in rows and columns from top view. Because the 2D semiconductor materials have no or negligible dangling bonds at their top surfaces, the epitaxial growth process EPI1 has no or negligible vertical growth rate, which in turn results in the 2D semiconductor films 216 having substantially planar top surfaces without angled facets.

In some embodiments, the 2D semiconductor films 216 include transition metal dichalcogenides (TMDs), graphene, layered III-VI chalcogenide, graphene, hexagonal Boron Nitride (h-BN), black phosphorus or the like. In some embodiments, the 2D semiconductor films 216 have a same 2D material as the defect-less 2D semiconductor seeds 214 or other 2D materials having a similar lattice constant with that of the seeds 214. For example, when the defect-less 2D semiconductor seeds 214 are formed of $MoS_2$, $WS_2$, $WSe_2$, or $MoSe_2$, the 2D semiconductor films 216 are formed of $MoS_2$, $WS_2$, $WSe_2$, or $MoSe_2$ as well, because $MoS_2$, $WS_2$, $WSe_2$, and $MoSe_2$ have comparable lattice parameters (e.g., in a range from about 0.30 nm to about 0.35 nm). In that case, the 2D semiconductor films 216 each may be one or more mono-layers 204 of TMD comprising comprises transition metal atoms 204M and chalcogen atoms 204X as illustrated in FIG. 2B. In some embodiments, the 2D semiconductor films 216 is epitaxially grown by using a deposition method such as CVD, low-pressure CVD (LPCVD), sub-atmospheric CVD (SACVD), or the like.

In the epitaxial growth EP1, the 2D semiconductor material has a higher growth rate from the 2D semiconductor seeds 214 than from the dielectric grid 212. More specifically, the dielectric grid 212 is formed of a dielectric material (e.g., silicon nitride) such that the 2D semiconductor material has no or negligible growth rate from the dielectric grid 212. In this way, the growth selectivity allows for the 2D semiconductor films 216 being grown only from the defect-less 2D semiconductor seeds 214. In some embodiments, because the defect-less 2D semiconductor seeds 214 are defect-less single-crystalline seeds, the 2D semiconductor films 216 grown from the seeds 214 are defect-less single-crystalline films. If the dielectric grid 212 is omitted, as the epitaxial growth EP1 continues, the 2D semiconductor films 216 grown from different seeds 214 may eventually meet to form grain boundaries, which may be unsuitable for serving as transistor channel, source, and/or drain regions. However, because the dielectric grid 212 has been formed on expected crystal grain boundaries before the epitaxial growth process EP1, the dielectric grid 212 can prevent the 2D semiconductor films 216 grown from different seeds 214 from meeting and forming grain boundaries.

Figure 8:
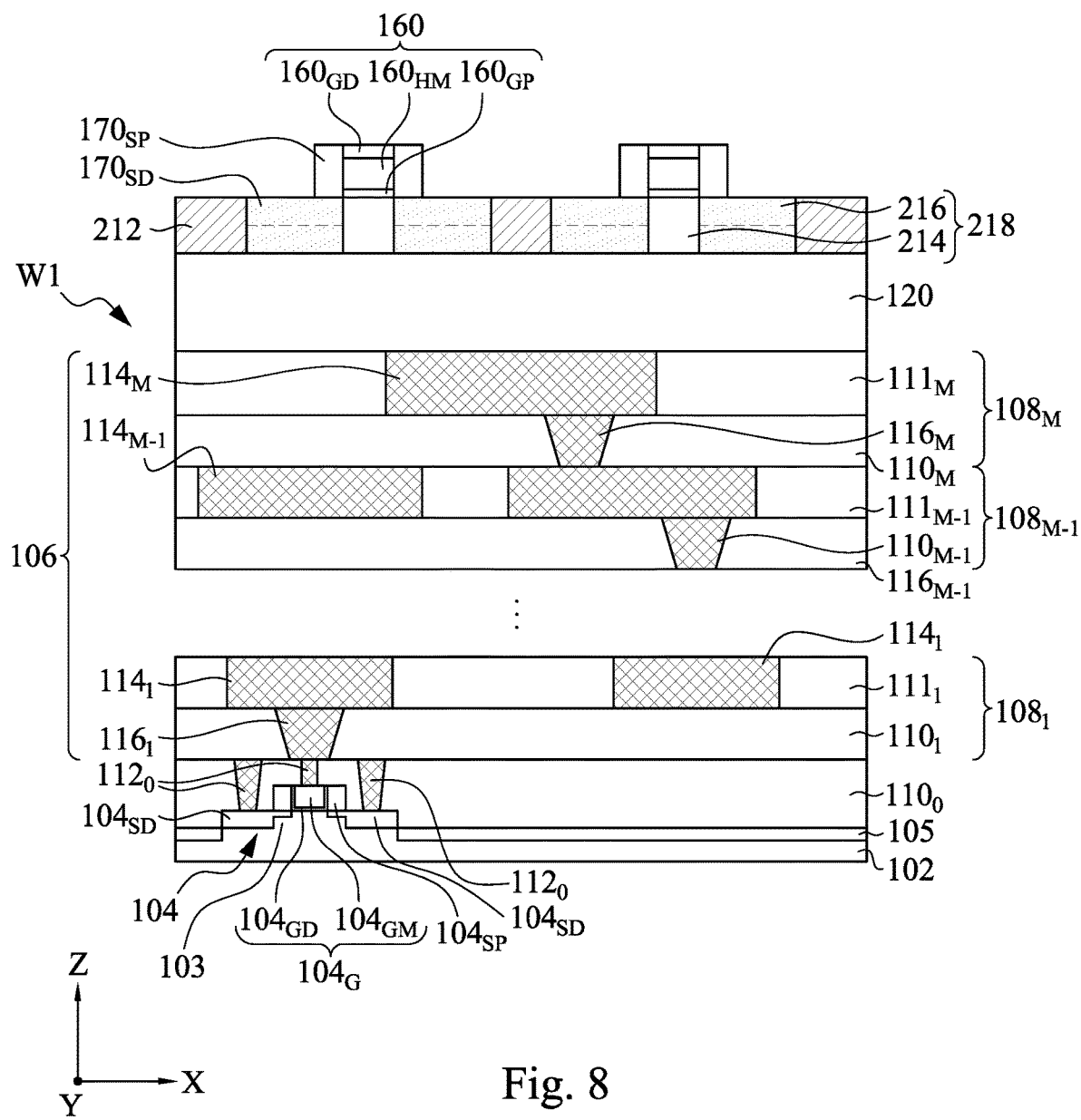

In FIG. 8, once the 2D semiconductor islands 218 have been formed, dummy gate structures 160, gate spacers $170_{SP}$, and source/drain regions $170_{SD}$ are formed. In some embodiments, the dummy gate structure 160 may comprise a dummy gate dielectric $160_{GD}$, a dummy gate material $160_{GP}$, and a hard mask $160_{HM}$. First a dummy gate dielectric material (e.g., silicon oxide, silicon nitride, or the like) may be deposited. Next a dummy gate material (e.g., amorphous silicon, polysilicon, or the like) may be deposited over the dummy gate dielectric and then planarized (e.g., by CMP). A hard mask layer (e.g., silicon nitride, silicon carbide, or the like) may be formed over the dummy gate material and patterned into the hard masks $160_{HM}$. The dummy gate structures 160 are then formed by patterning the dummy gate dielectric and dummy gate material using the hard masks $160_{HM}$ as an etch mask. The materials used to form the dummy gate structures 160 may be deposited using any suitable method such as CVD, PECVD, ALD, (PEALD) or the like, or by thermal oxidation of the semiconductor surface, or combinations thereof. The resulting dummy gate structures 160 may extend across one or more 2D semiconductor islands 218.

Source/drain regions $170_{SD}$ and spacers $170_{SP}$, illustrated in FIG. 8, are formed, for example, self-aligned to the dummy gate structures 160. Spacers $170_{SP}$ may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures, while leaving the spacers $170_{SP}$ along the sidewalls of the dummy gate structures 160 extending laterally onto portions of the surfaces of the 2D semiconductor islands 218.

Source/drain regions $170_{SD}$ are doped semiconductor regions in the 2D semiconductor islands 218. In some embodiments, the source/drain regions $170_{SD}$ may comprise heavily-doped regions and relatively lightly-doped drain extensions, or LDD regions. Generally, the heavily-doped regions are spaced away from the dummy gate structures 160 using the spacers $170_{SP}$, whereas the LDD regions may be formed prior to forming spacers $170_{SP}$ and, hence, extend under the spacers $170_{SP}$ and, in some embodiments, extend further into portions of the 2D semiconductor islands 218 below the dummy gate structures 160. These doped regions may be formed, for example, by implanting n-type or p-type dopants (e.g., As, P, B, In, or the like) into source/drain regions of the 2D semiconductor islands 218 by using an ion implantation process, except for channel regions of the 2D semiconductor islands 218 directly below the dummy gate structures 160; or by first depositing a dopant source layer over source/drain regions of the 2D semiconductor islands 218 and then diffusing dopants from the dopant source layer into the 2D semiconductor islands 218 by annealing.

Figure 9:
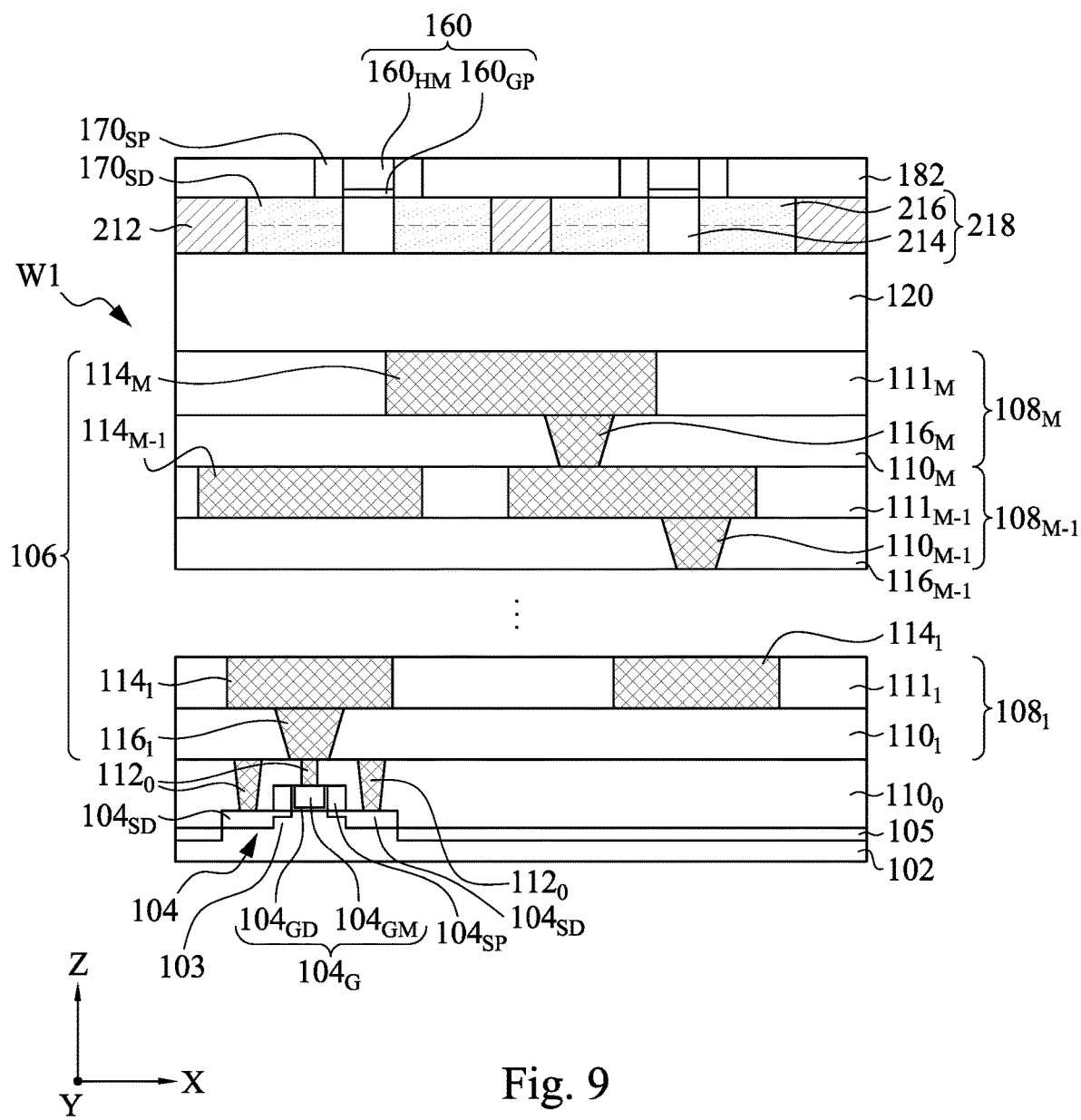

In FIG. 9, an additional ILD layer 182 formed on the wafer W1. Once the source/drain regions $170_{SD}$ are formed, the ILD layer 182 is deposited over the source/drain regions $170_{SD}$. A planarization process (e.g., CMP) may be performed to remove excess ILD material and the hard mask $160_{HM}$ from over the dummy gate material $160_{GP}$ to form a top surface wherein the top surface of the dummy gate material is exposed and may be substantially coplanar with the top surface of the ILD layer 182. In some embodiments, a contact etch stop layer (CESL) (not shown) of a suitable dielectric (e.g., silicon nitride, silicon carbide, or the like, or a combination thereof) may be deposited prior to depositing the ILD material.

Figure 10:
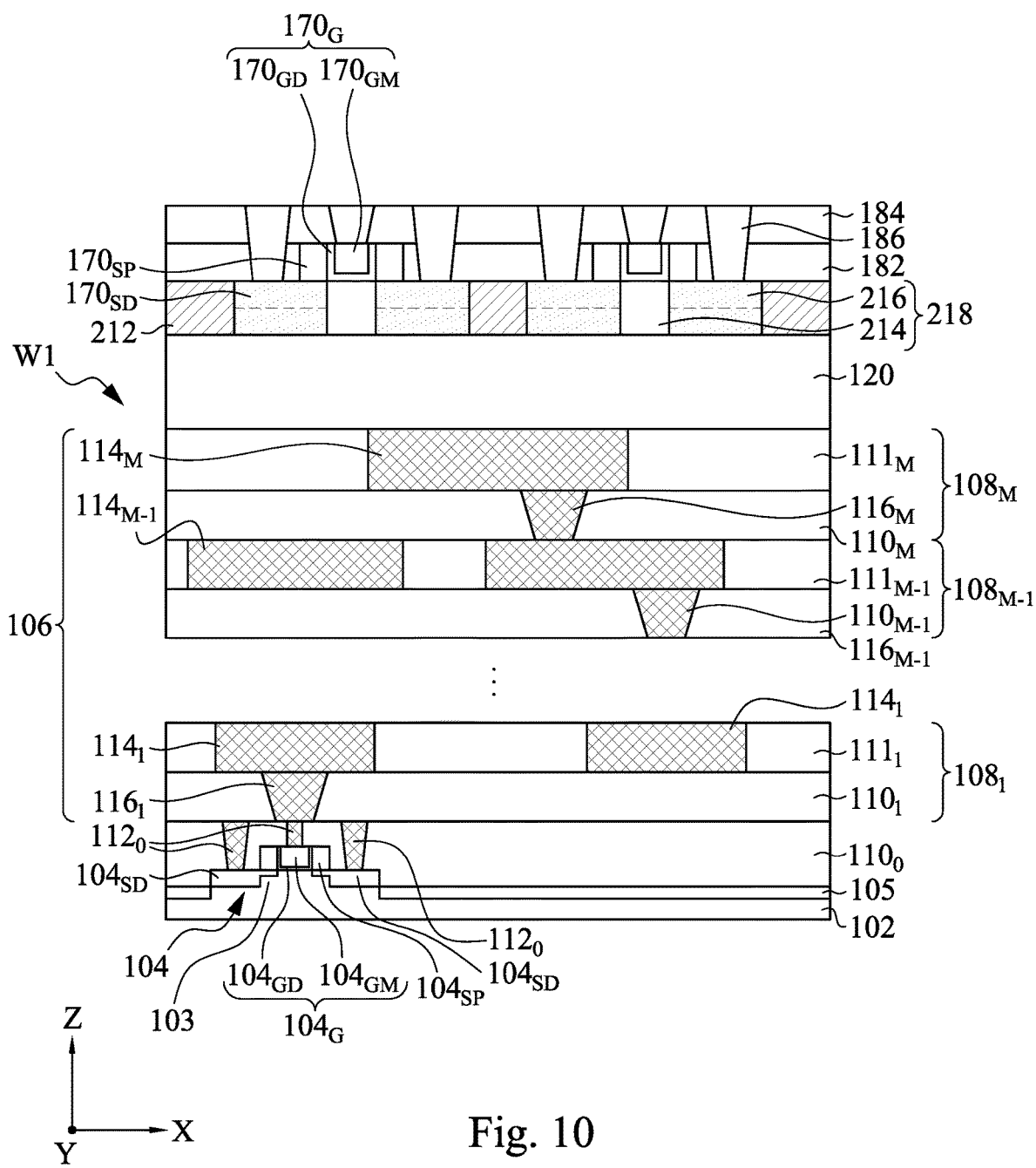

HKMG gate structures $170_G$, illustrated in FIG. 10, may then be formed by first removing the dummy gate structures 160 using one or more etching techniques, thereby creating recesses between respective spacers $170_{SP}$. Next, a replacement gate dielectric layer $170_{GD}$ comprising one more dielectrics, followed by a replacement gate metal layer $170_{GM}$ comprising one or more metals, are deposited to completely fill the recesses. Excess portions of the gate structure layers $170_{GD}$ and $170_{GM}$ may be removed from over the top surface of ILD layer 182 using, for example, a CMP process. The resulting HKMG gate structures $170_G$ may include remaining portions of the HKMG gate layers $170_{GD}$ and $170_{GM}$ inlaid between respective spacers $170_{SP}$.

The gate dielectric layer $170_{GD}$ includes similar materials as the gate dielectric layer $104_{GD}$ in the transistor 104 below the interconnect structure 106. For example, gate dielectric layer $170_{GD}$ includes a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate metal layer $170_{GM}$ includes similar materials as the gate metal layer $104_{GM}$ in the transistor 104 below the interconnect structure 106. For example the gate metal layer $104_{GM}$ may comprise a barrier layer, a work function layer, and a gate-fill layer formed successively on top of gate dielectric layer $170_{GD}$. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, ECP, electroless plating and/or the like.

After forming the HKMG structure $170_G$, another ILD layer 184 is deposited over the ILD layer 182. In some embodiments, materials of the ILD layers 182 and 184 may be similar as materials of one or more of the ILD layer $110_0$, and IMD layers $110_1$ to $110_M$ and $111_1$ to $111_M$ and thus are not repeated for the sake of brevity. The dielectric materials used to form the ILD layers 182 and 184 may be deposited using any suitable method, such as CVD, PVD, ALD, PEALD, PECVD, SACVD, FCVD, spin-on, and/or the like, or a combination thereof. Once the ILD layer 184 is formed, contacts 186 are formed in the ILD layers 182 and 184 to land on the gate structure $170_G$ over the 2D semiconductor islands 218 and the source/drain regions $170_{SD}$ in the 2D semiconductor islands 218. The contacts 186 are formed using photolithography, etching and deposition techniques as discussed previously with respect to the contacts $112_0$, and have materials similar as the contacts $112_0$, and thus manufacturing steps and materials of the contacts 186 are not repeated for the sake of brevity.

Figure 11:
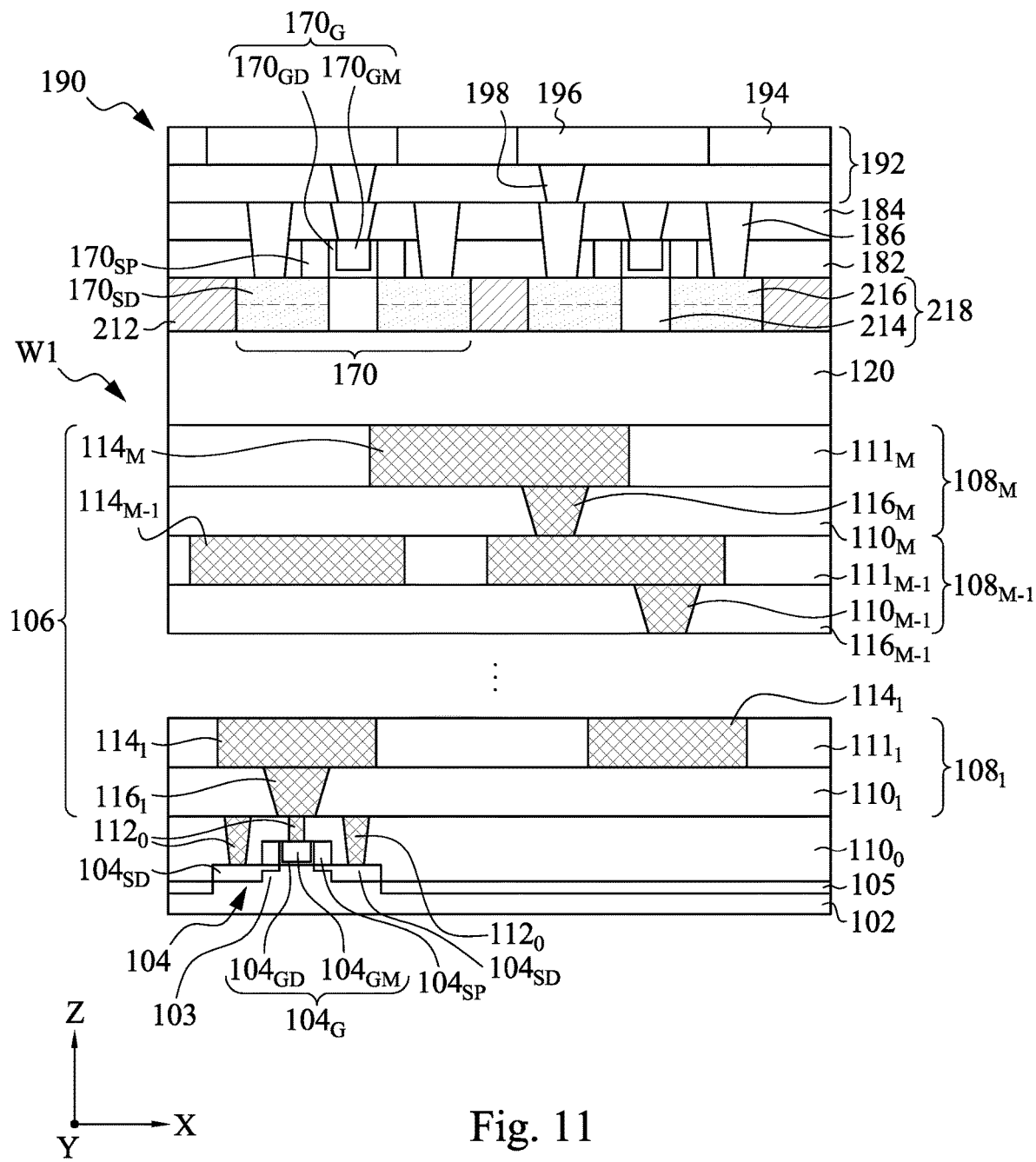

In FIG. 11, after forming the contacts 186, another interconnect structure 190 is formed over the ILD layer 184 using similar processes and materials as discussed previously with respect to the interconnect structure 106. For example, the interconnect structure 190 electrically interconnects one or more transistors 170 formed on the 2D semiconductor islands 218, and may further interconnects one or more transistors formed on the substrate 102 by using, e.g., one or more deep through vias extending from the upper interconnect structure 190 to the lower interconnect structure 106 through the dielectric grid 212 and/or the 2D semiconductor islands 218. The interconnect structure 190 may include one or more metallization layers 192 each include dielectric layers 194, horizontal interconnects 196 (such as metal lines), and vertical interconnects 198 (such as metal vias) respectively extending in the dielectric layers 194.

A HKMG structure $170_G$, source/drain regions $170_{SD}$ on opposite sides of the HKMG structure $170_G$, and an underlying portion of a 2D semiconductor island 218 together act as a transistor 170 formed on the 2D semiconductor island 218. The transistors 170 above the interconnect structure 106 and the transistors 104 below the interconnect structure 106 can form an integrated circuit (IC). Because the IC includes transistors at different levels (e.g., transistors 170 at a higher level than transistors 104), it can be referred to as a three-dimensional (3D) IC structure. Although in the depicted embodiments of FIG. 11 the transistors 170 are planar transistors formed on the 2D semiconductor islands 218, in some other embodiments the transistors 170 can be non-planar transistors such as FinFETs or GAA transistors formed on the 2D semiconductor islands 218.

FIGS. 12A-14 illustrate exemplary perspective views and cross sectional views of various stages for manufacturing a 3D IC structure according to some other embodiments of the present disclosure. It is understood that additional operations can be provided before, during, and after processes shown by FIGS. 12A-14, and some of the operations described below can be replaced or eliminated, for additional embodiments of the method. The order of the operations/processes may be interchangeable. The same or similar configurations, materials, processes and/or operation as described with FIGS. 1A-11 may be employed in the following embodiments, and the detailed explanation may be omitted.

Figure 12A:
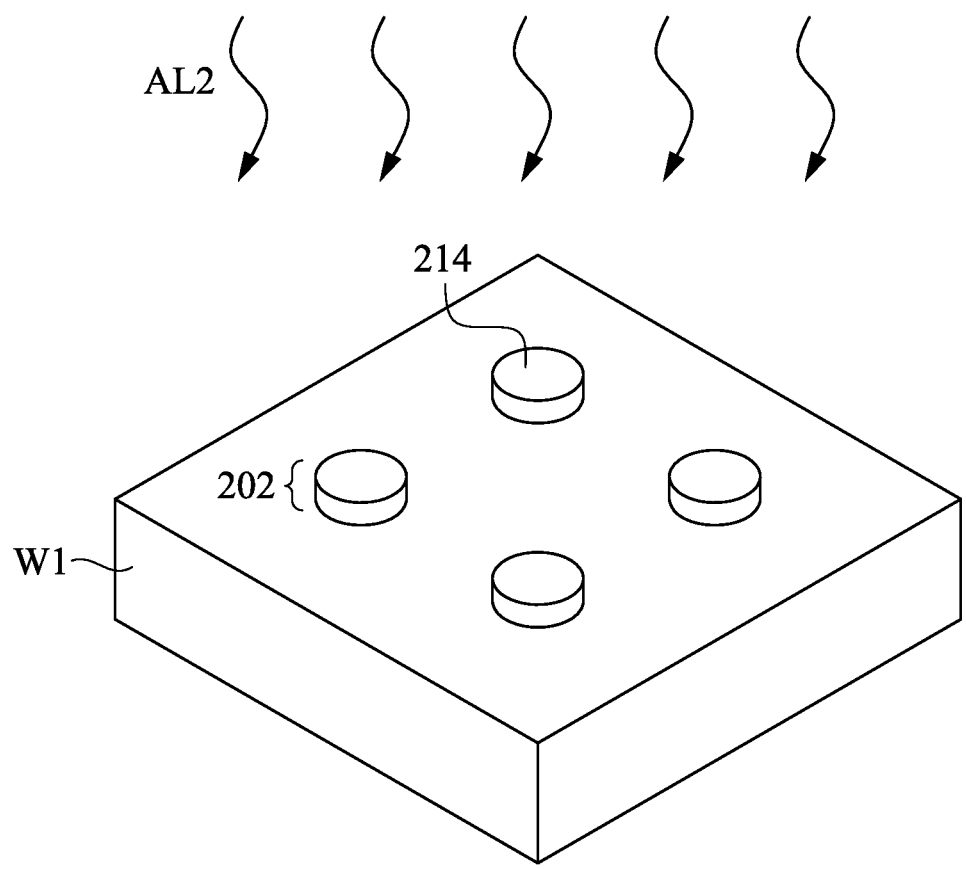
FIGS. 12A-14 illustrate exemplary perspective views and cross sectional views of various stages for manufacturing a 3D IC structure according to some embodiments of the present disclosure.
Figure 12B:
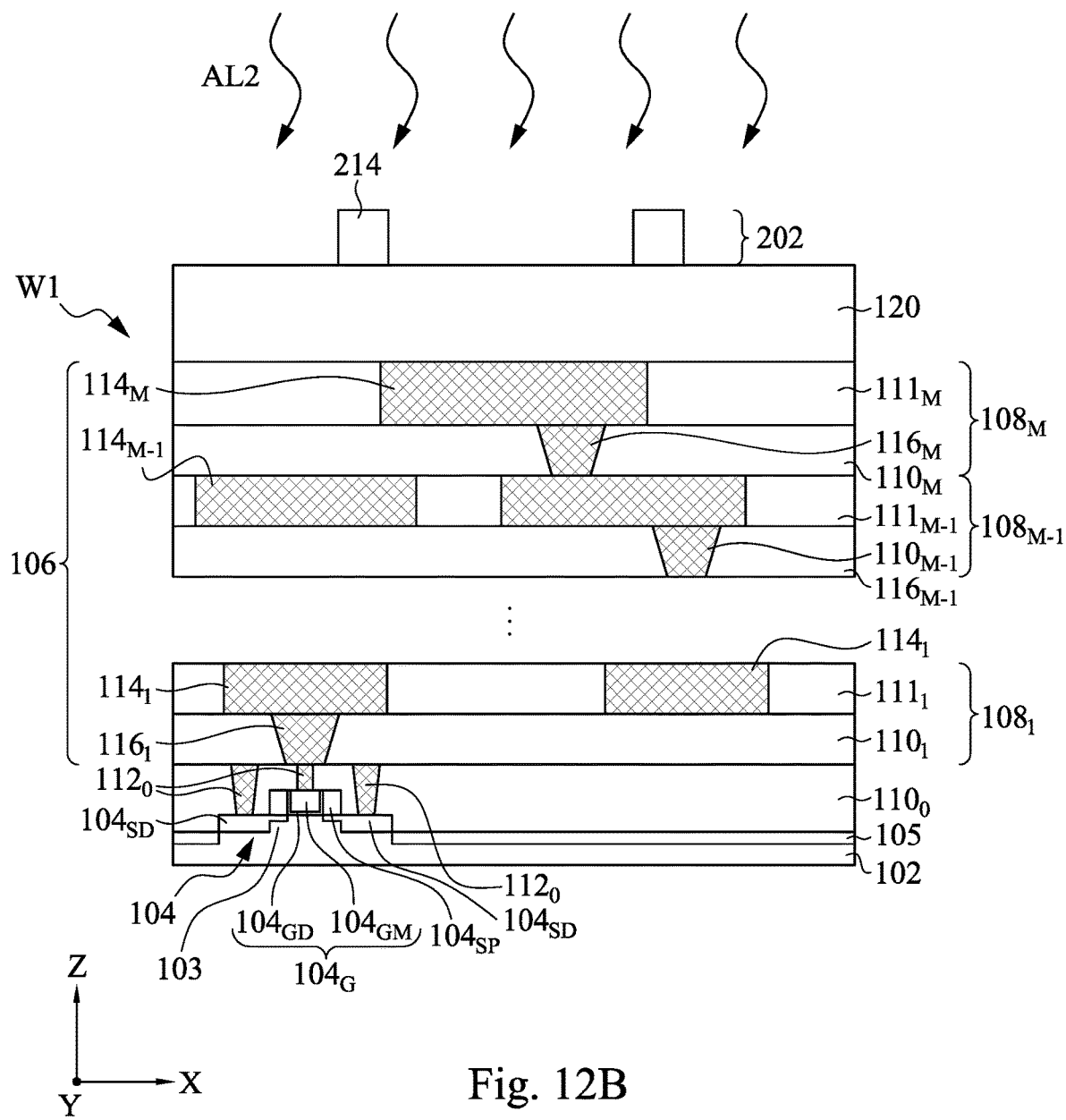

In FIGS. 12A-12B, after the patterning process of forming defective 2D semiconductor seeds 210 (the step as shown in FIGS. 4A-4B) is complete, an annealing process AL2 is performed to convert defective 2D semiconductor seeds into defect-less 2D semiconductor seeds 214 without forming the dielectric grid on the ILD layer 120. Stated differently, the step of dielectric grid formation is skipped. The annealing process AL2 is similar to the annealing process AL1 described previously with respect to FIGS. 6A-6B, and thus is not repeated for the sake of brevity.

Figure 13A:
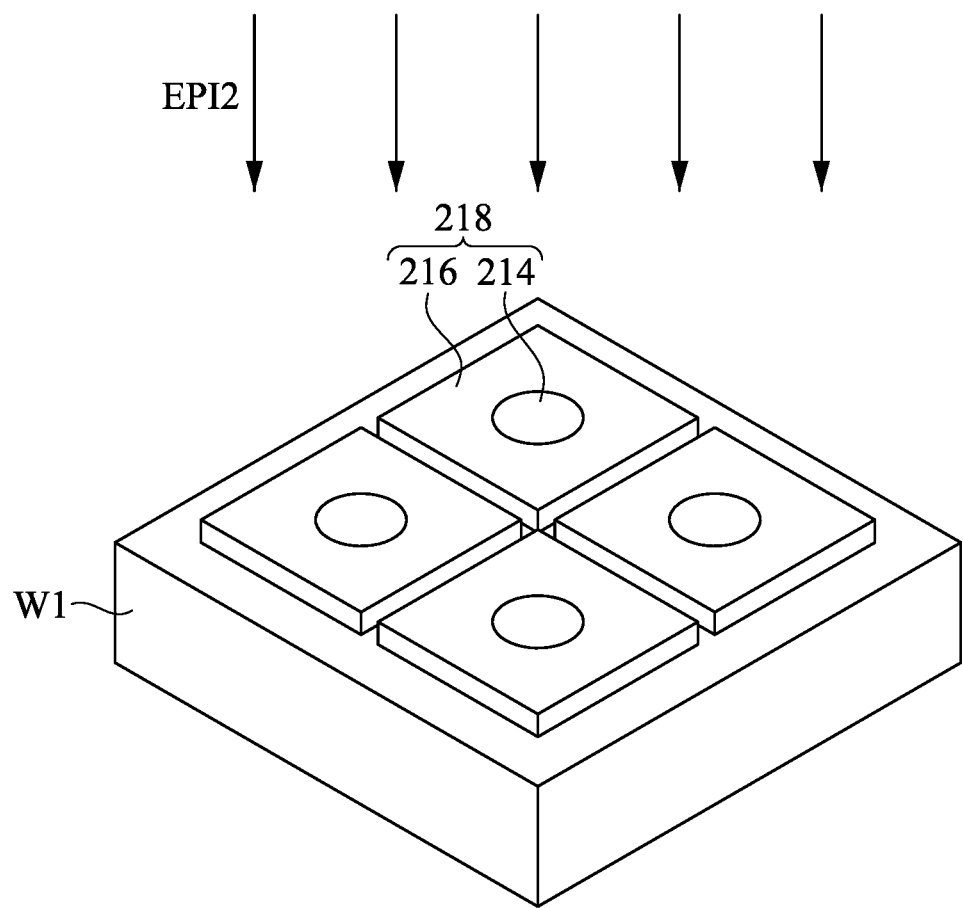
Figure 13B:
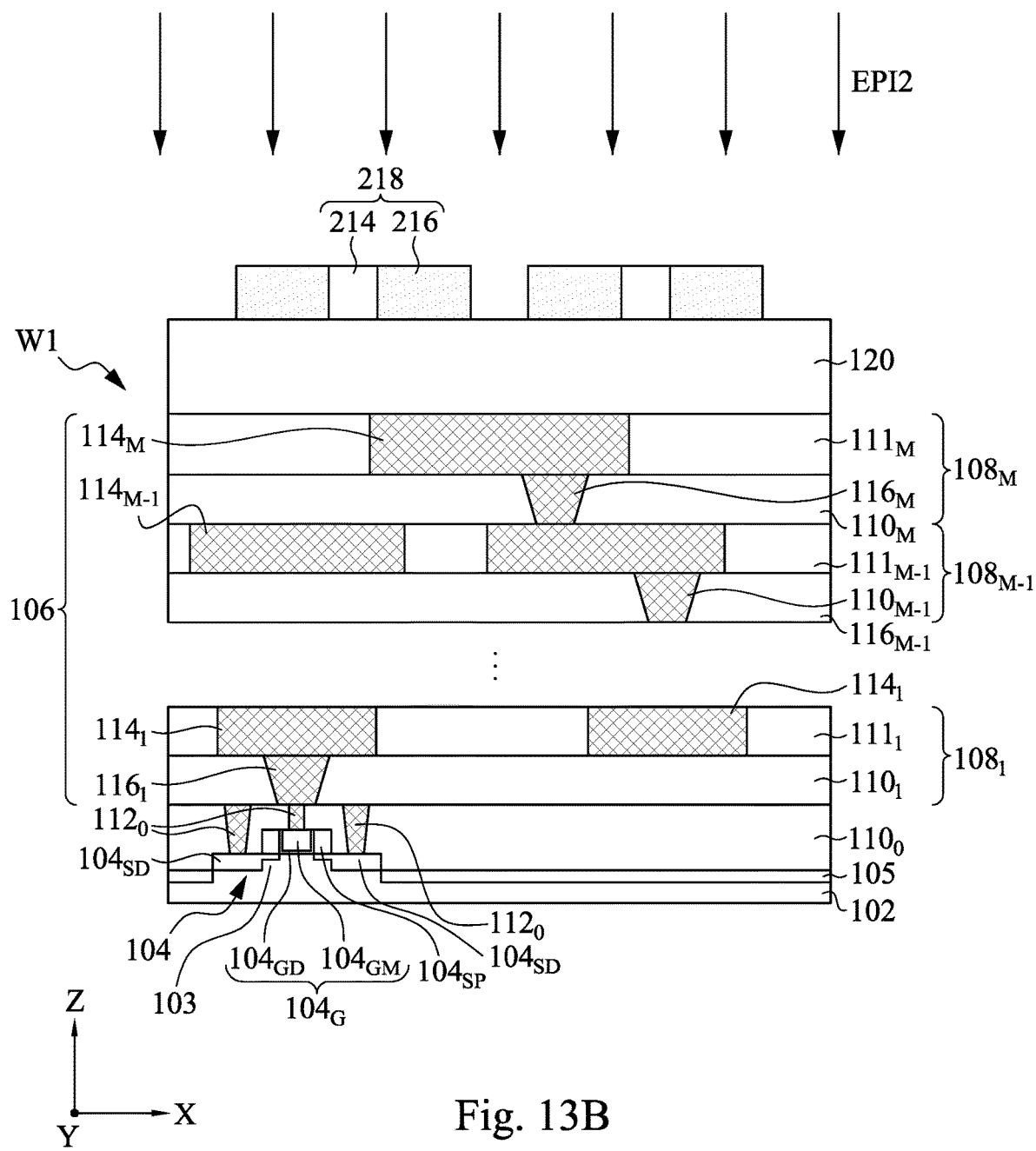

In FIGS. 13A-13B, an epitaxial growth process EPI2 is performed to laterally grow 2D semiconductor films 216 by using the defect-less 2D semiconductor seeds 214 as seeds. A defect-less 2D semiconductor seed 214 and a corresponding 2D semiconductor film 216 laterally grown from the defect-less 2D semiconductor seed 214 can be collectively referred to as a 2D semiconductor island 218. The epitaxial conditions of the epitaxial growth process EPI2 (e.g., duration time, temperature and so on) are chosen such that the 2D semiconductor islands 218 are spaced apart from each other after the epitaxial growth process EPI2 is complete. For example, the epitaxial duration time is controlled such that the lateral growth of the 2D semiconductor films 216 stops before the 2D semiconductor films 216 meet to form grain boundaries. Materials of the 2D semiconductor films 216 are similar to the descriptions with respect to FIGS. 7A-7B, and thus are not repeated for the sake of brevity.

Figure 14:
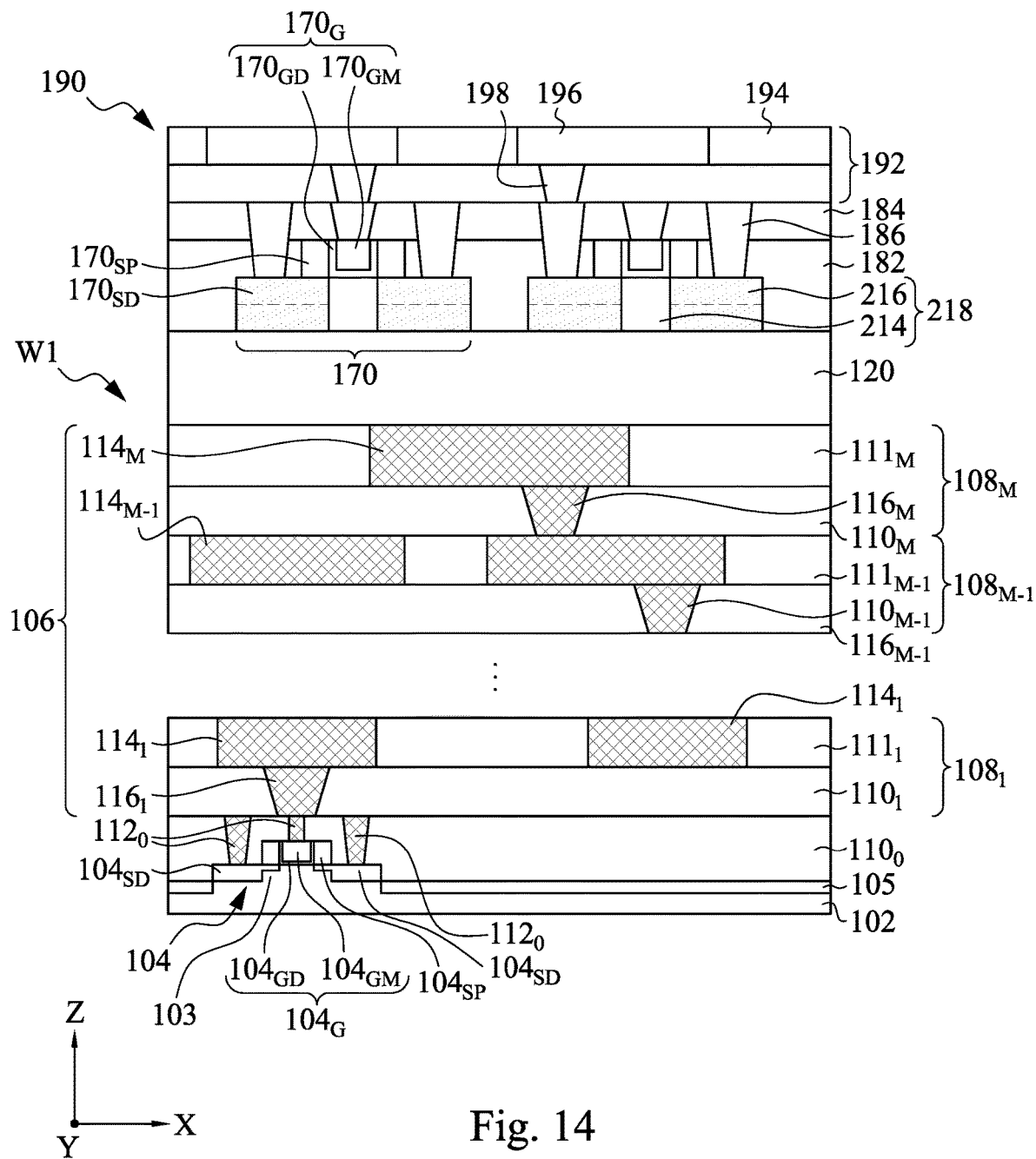

Afterwards, in FIG. 14, transistors 170 each including gate structure $170_G$ and source/drain regions $170_{SD}$ on opposite sides of the gate structure $170_G$ are formed on the 2D semiconductor islands 218. Contacts 186 are then formed on the gate structure $170_G$ and source/drain regions $170_{SD}$. Upper interconnect structure 190 is then formed over the contacts 186. The resulting structure is illustrated in FIG. 14. Formation of the transistors 170, contacts 186, and the interconnect structure 190 is similar to the descriptions with respect to FIGS. 8-11, and thus is not repeated for the sake of brevity.

FIGS. 15A-17 illustrate exemplary perspective views and cross sectional views of various stages for manufacturing a 3D IC structure according to some other embodiments of the present disclosure. It is understood that additional operations can be provided before, during, and after processes shown by FIGS. 15A-17, and some of the operations described below can be replaced or eliminated, for additional embodiments of the method. The order of the operations/processes may be interchangeable. The same or similar configurations, materials, processes and/or operation as described with FIGS. 1A-11 may be employed in the following embodiments, and the detailed explanation may be omitted.

Figure 15A:
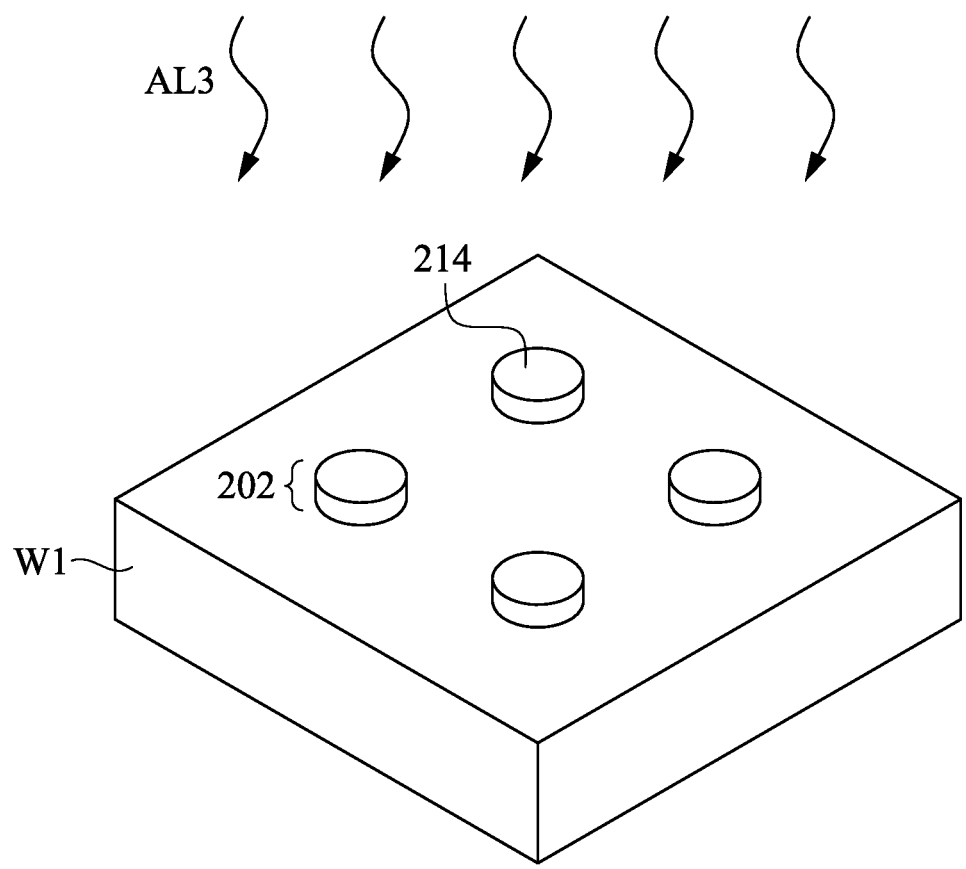
FIGS. 15A-17 illustrate exemplary perspective views and cross sectional views of various stages for manufacturing a 3D IC structure according to some embodiments of the present disclosure.
Figure 15B:
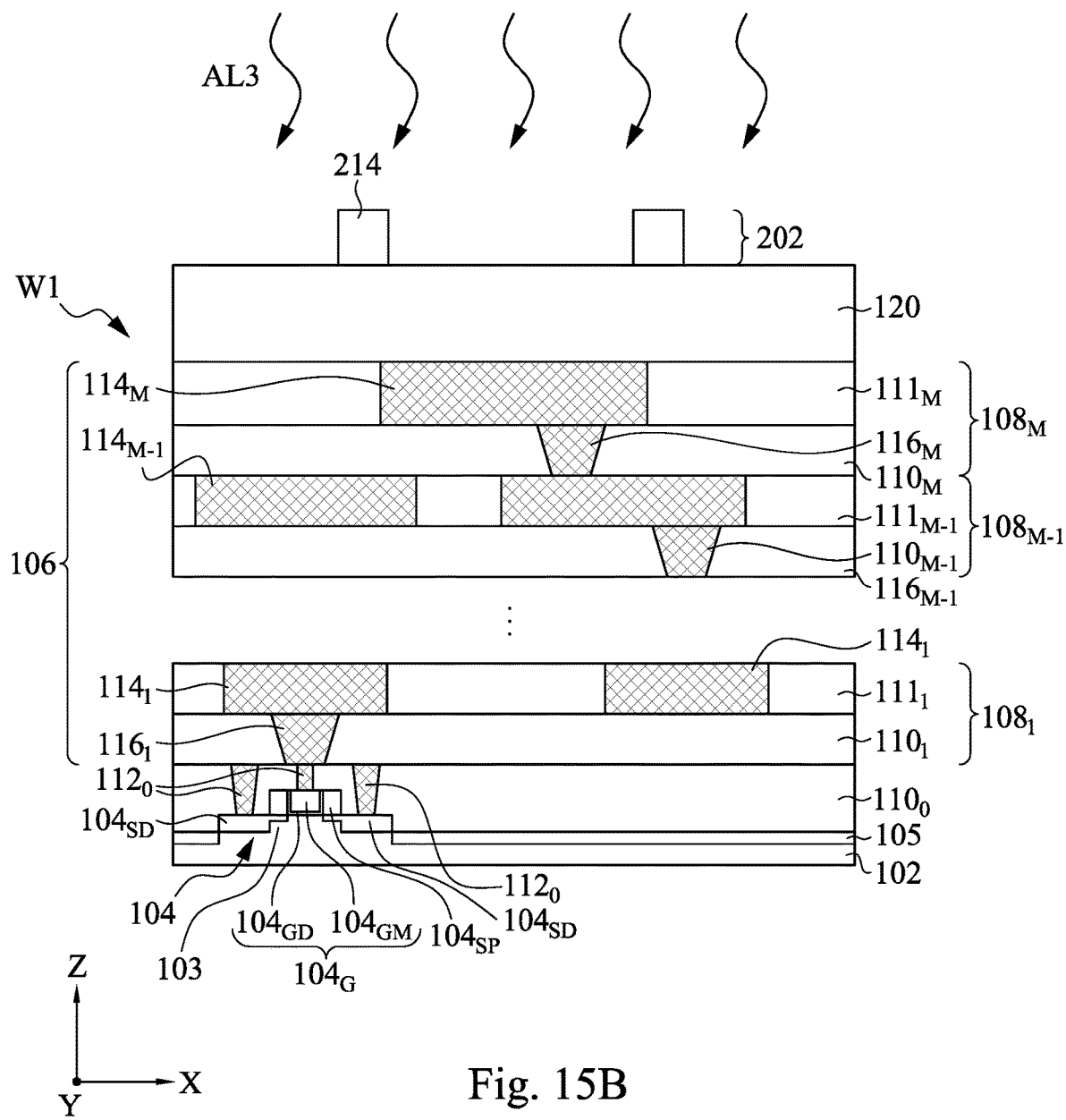

In FIGS. 15A-15B, after the patterning process of forming defective 2D semiconductor seeds 210 (the step as shown in FIGS. 4A-4B) is complete, an annealing process AL3 is performed to convert defective 2D semiconductor seeds into defect-less 2D semiconductor seeds 214 without forming the dielectric grid on the ILD layer 120. The annealing process AL3 is similar to the annealing process AL1 described previously with respect to FIGS. 6A-6B, and thus is not repeated for the sake of brevity.

Figure 16A:
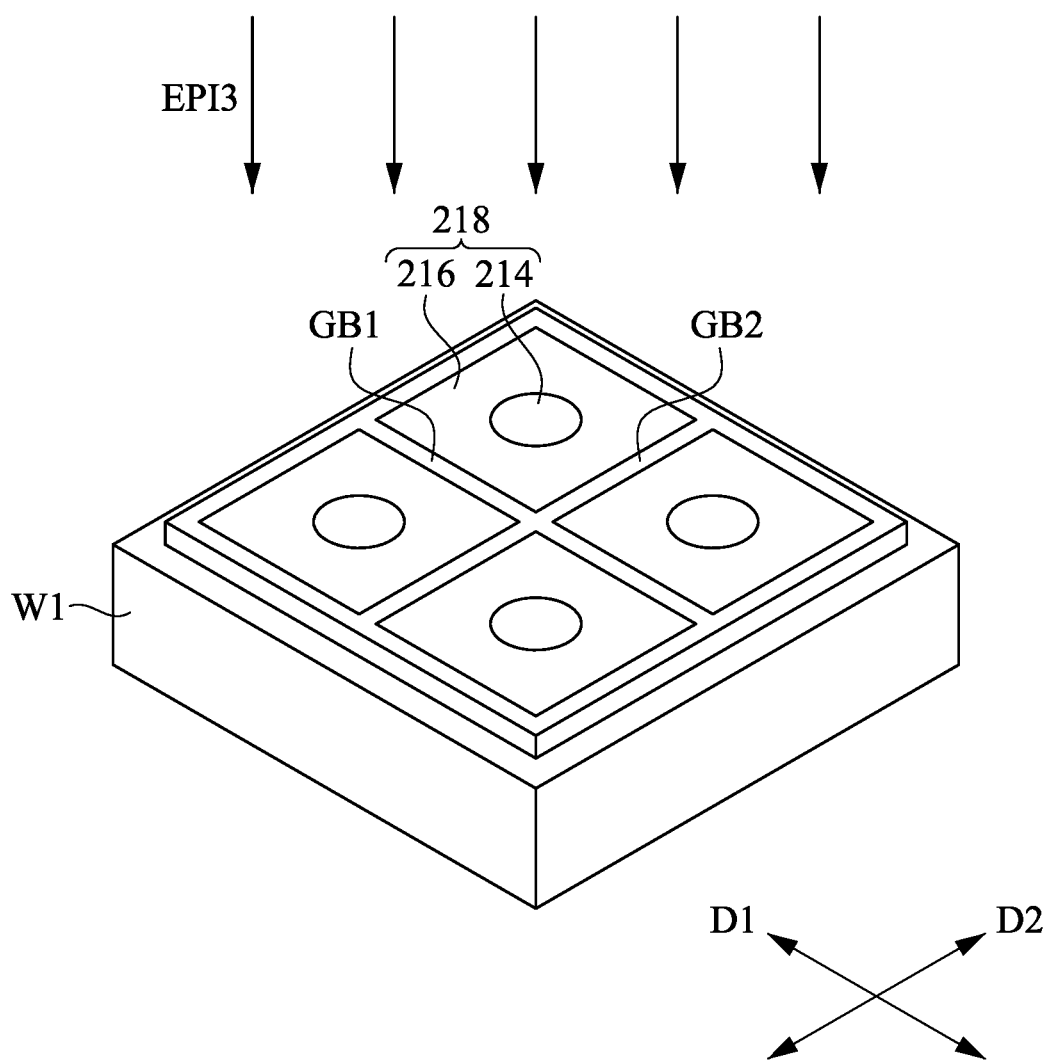
Figure 16B:
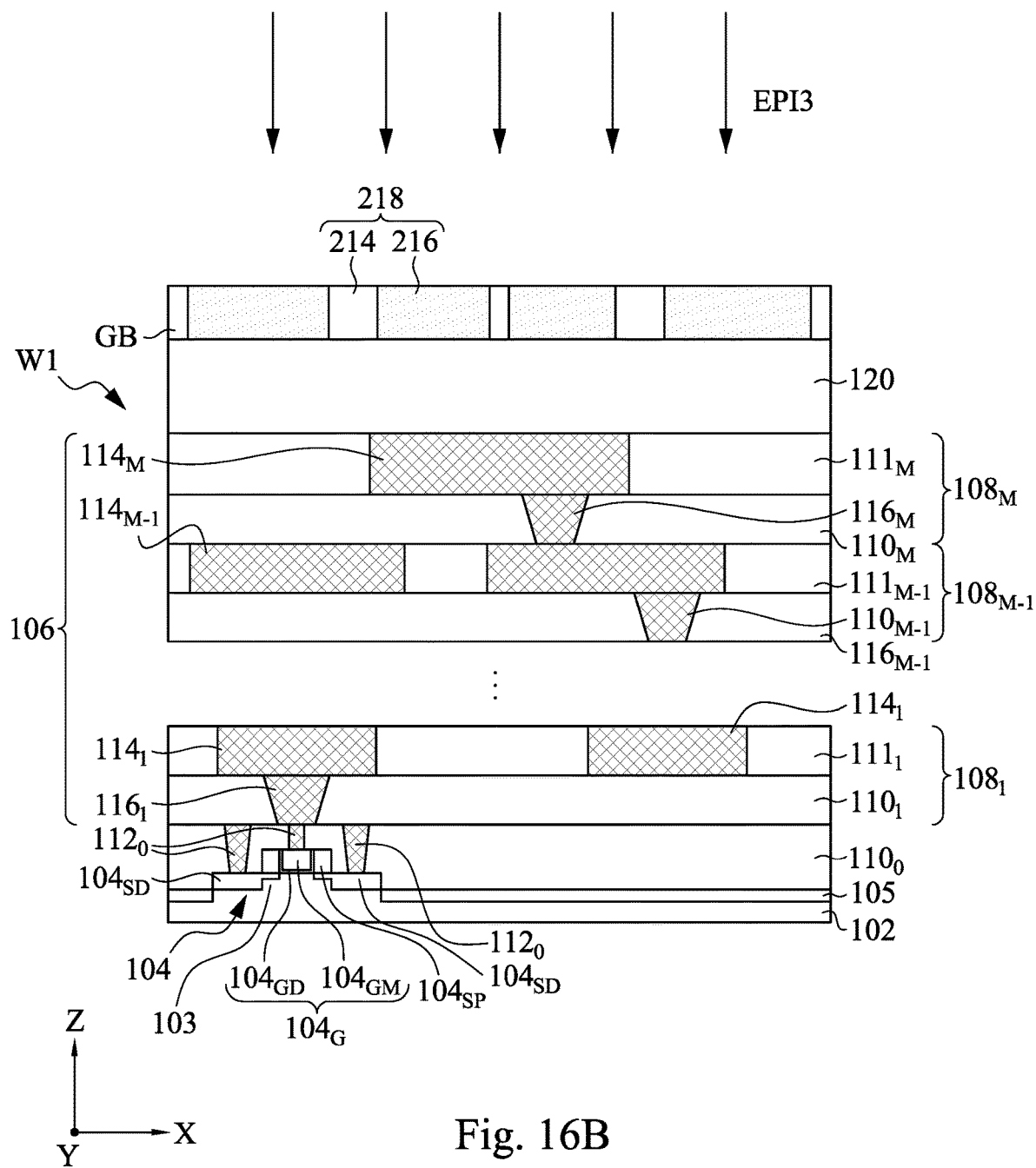

In FIGS. 16A-16B, an epitaxial growth process EPI3 is performed to laterally grow 2D semiconductor films 216 by using the defect-less 2D semiconductor seeds 214 as seeds. A defect-less 2D semiconductor seed 214 and a corresponding 2D semiconductor film 216 laterally grown from the defect-less 2D semiconductor seed 214 can be collectively referred to as a 2D semiconductor island 218. The epitaxial conditions of the epitaxial growth process EPI3 (e.g., duration time, temperature and so on) are chosen such that the 2D semiconductor islands 218 meet to form grain boundaries GB1 and GB2 (collectively referred to as grain boundaries GB). Because the 2D semiconductor films 216 are laterally grown from the pre-determined positions of the 2D semiconductor seeds 214, positions of the grain boundaries GB1 and GB2 are predictable and controllable. In this way, the grain boundaries GB1 and GB2 can be formed on expected positions by designing the pattern of 2D semiconductor seeds 214. For example, the 2D semiconductor seeds 214 arranged in rows and columns allow the grain boundaries GB1 and GB2 collectively forming a grid pattern, wherein the grain boundaries GB1 extend in the first direction D1, and the grain boundaries GB2 extend in the second direction D2 perpendicular to the first direction D1 and intersect the grain boundaries GB1. Because the pattern of grain boundaries GB1 and GB2 is predictable and controllable by using the pattern of 2D semiconductor seeds 214, transistor layout and interconnect layout can be co-designed and coordinated with the pattern of 2D semiconductor seeds 214, so as to prevent from forming transistors on the grain boundaries GB1 and GB2. In that case, no transistor or metal interconnect will be formed on the grain boundaries GB1 and GB2. Materials of the 2D semiconductor films 216 are similar to the descriptions with respect to FIGS. 7A-7B, and thus are not repeated for the sake of brevity.

Figure 17:
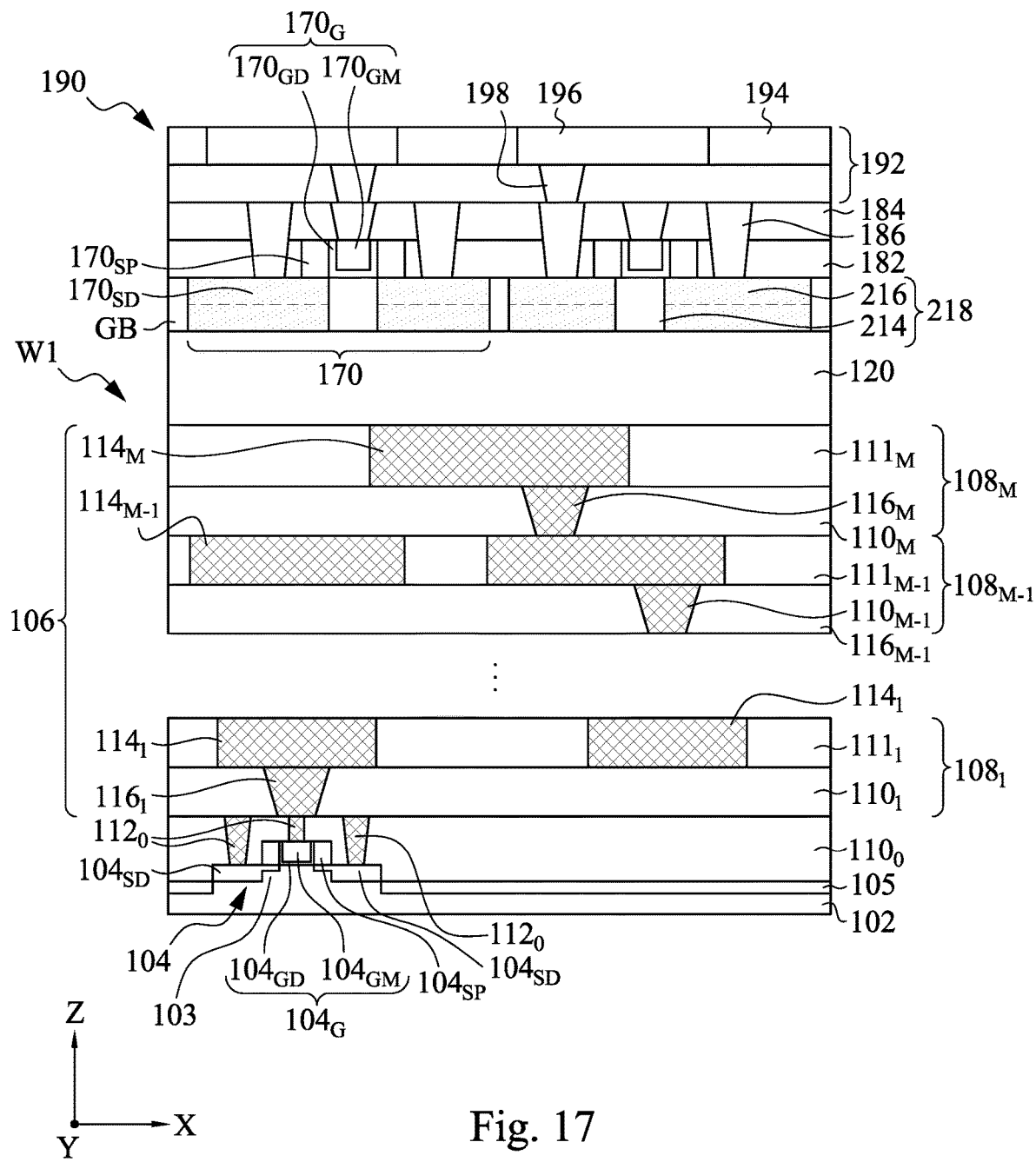

Afterwards, in FIG. 17, transistors 170 each including gate structure $170_G$ and source/drain regions $170_{SD}$ on opposite sides of the gate structure $170_G$ are formed on the 2D semiconductor islands 218. Contacts 186 are then formed on the gate structure $170_G$ and source/drain regions $170_{SD}$. Upper interconnect structure 190 is then formed over the contacts 186. The resulting structure is illustrated in FIG. 17. Formation of the transistors 170, contacts 186, and the interconnect structure 190 is similar to the descriptions with respect to FIGS. 8-11, and thus is not repeated for the sake of brevity.

FIGS. 18-22 illustrate exemplary perspective views and cross sectional views of various stages for manufacturing a 3D IC structure according to some other embodiments of the present disclosure. It is understood that additional operations can be provided before, during, and after processes shown by FIGS. 18-22, and some of the operations described below can be replaced or eliminated, for additional embodiments of the method. The order of the operations/processes may be interchangeable. The same or similar configurations, materials, processes and/or operation as described with FIGS. 1A-11 may be employed in the following embodiments, and the detailed explanation may be omitted.

Figure 18:
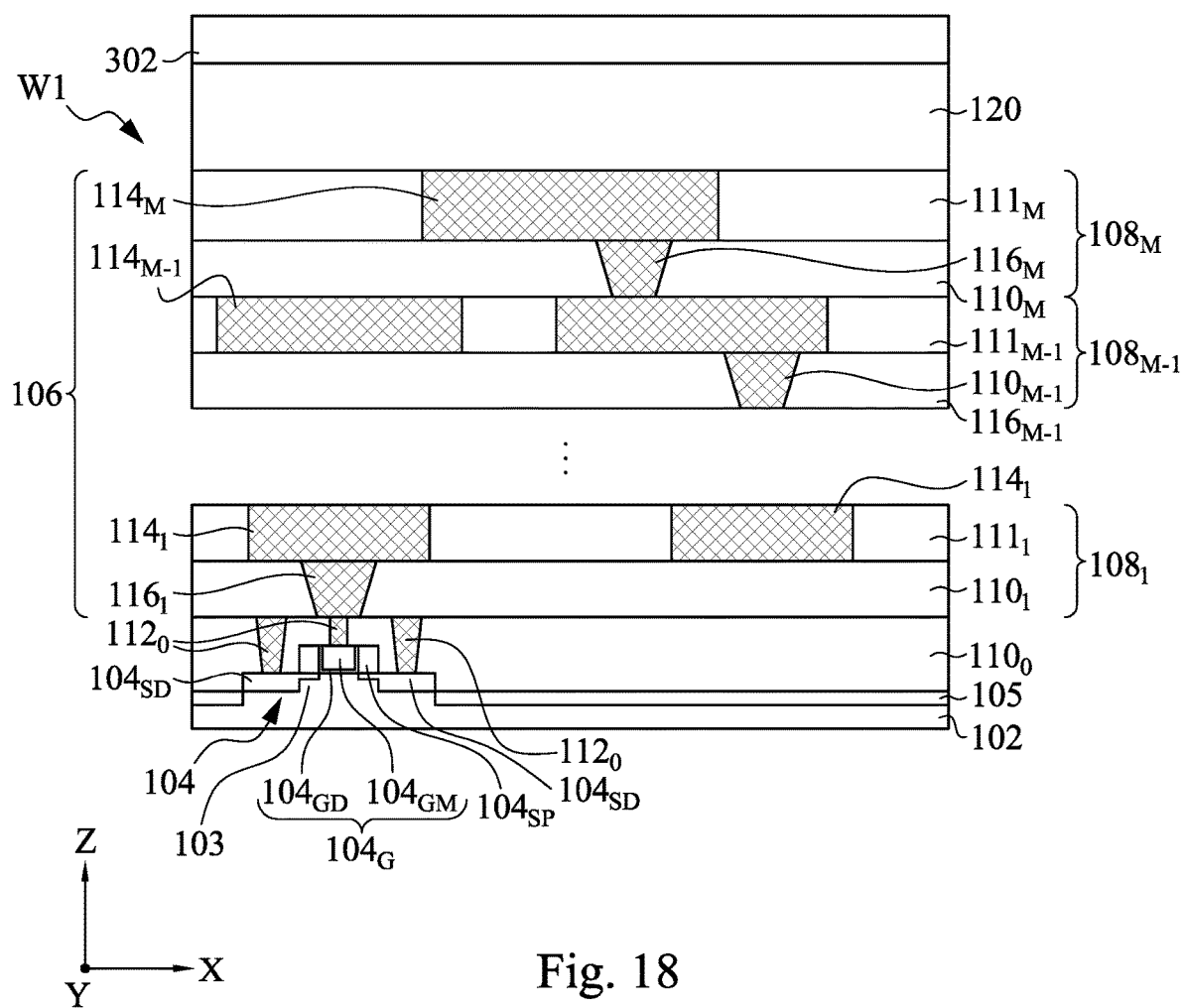
FIGS. 18-22 illustrate exemplary perspective views and cross sectional views of various stages for manufacturing a 3D IC structure according to some embodiments of the present disclosure.

In FIG. 18, after formation of the ILD layer 120 (the step as shown in FIGS. 1A-1B), a transition metal-containing layer 302 is deposited on the ILD layer 120 by using CVD, ALD, PVD or other suitable deposition techniques. In some embodiments, the transition metal-containing layer 302 is formed of transition metal oxide including, for example, $MoO_x$, $WO_x$, or other suitable transition metal oxide materials that can be used to form TMD. In some other embodiments, the transition metal-containing layer 302 is formed of transition metal including, for example, Mo, W, Pt, or other suitable transition metals that can be used to form TMD.

Figure 19A:
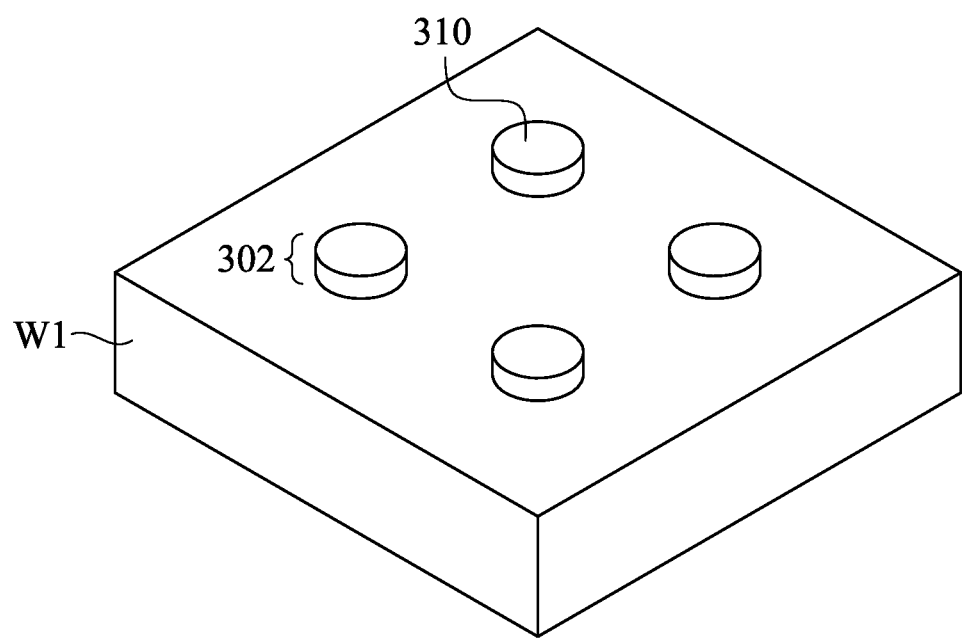
Figure 19B:
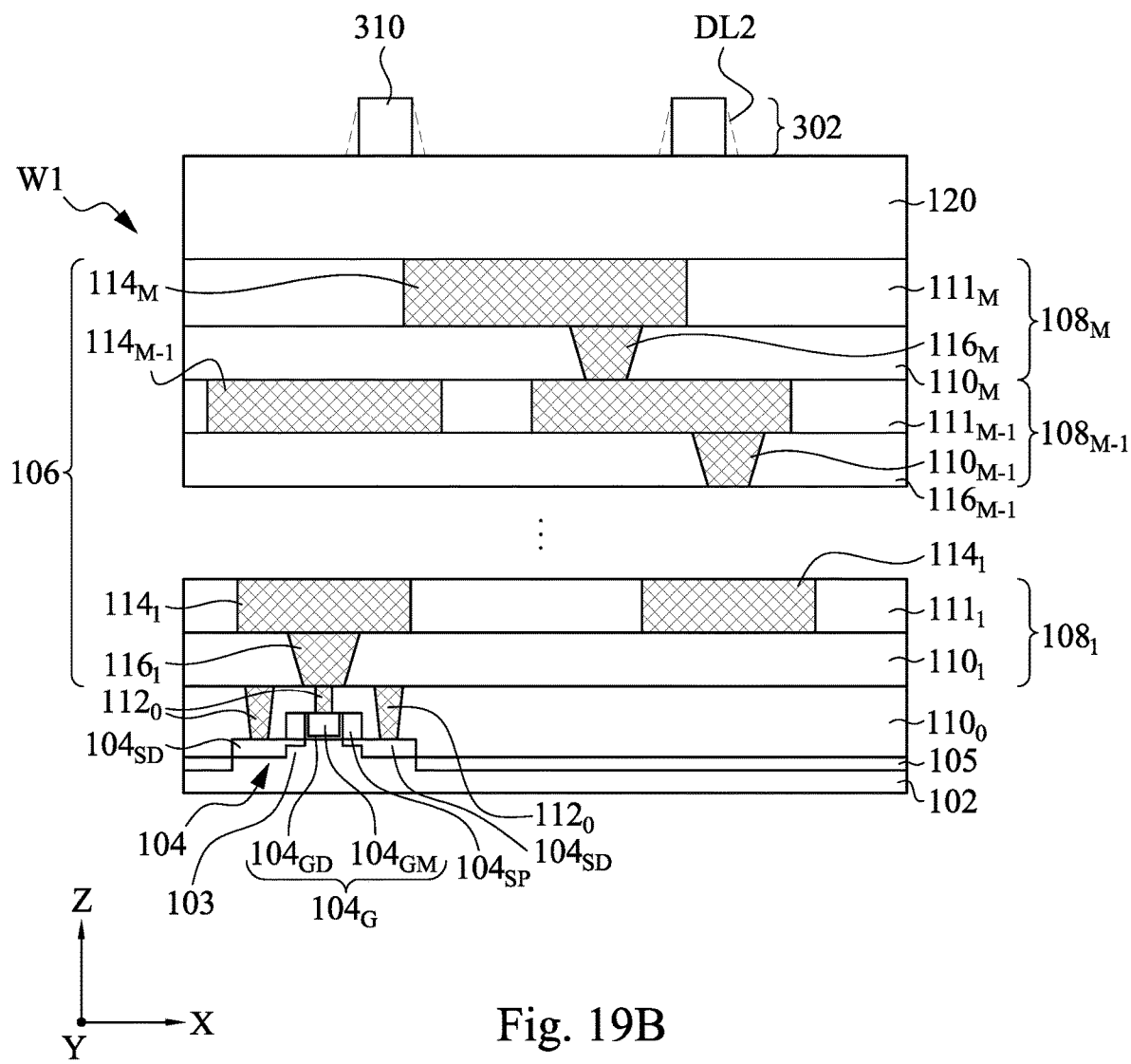

In FIGS. 19A and 19B, the transition metal-containing layer 302 is patterned into a plurality of transition metal-containing pieces 310 by using suitable photolithography and etching techniques. In some embodiments, the transition metal-containing pieces 310 each have a small volume less than about 0.05 $\mu m^3$ (e.g., 10 $\mu m^2 \times 0.005$ $\mu m$). For example, a mask layer is first formed over the transition metal-containing layer 302 and then patterned to form a pattern of the transition metal-containing pieces, and then an etching process is performed on the transition metal-containing layer 302 by using the patterned mask layer as an etch mask, thus patterning the transition metal-containing layer 302 into the transition metal-containing pieces 310.

In some embodiments, the patterned mask layer used for forming the transition metal-containing layer 302 may comprise an organic material, such as a photoresist material, and may be formed using a spin-on coating process, followed by patterning the photoresist material to the pattern of the pieces 310 using suitable lithography techniques. For example, photoresist material is irradiated (exposed) and developed to remove portions of the photoresist material. In greater detail, a photomask (not shown) may be placed over the photoresist material, which may then be exposed to a radiation beam provided by a radiation source such as ultraviolet (UV) source, deep UV (DUV) source, extreme UV (EUV) source, and X-ray source. For example, the radiation source may be a mercury lamp having a wavelength of about 436 nm (G-line) or about 365 nm (I-line); a Krypton Fluoride (KrF) excimer laser with wavelength of about 248 nm; an Argon Fluoride (ArF) excimer laser with a wavelength of about 193 nm; a Fluoride ($F_2$) excimer laser with a wavelength of about 157 nm; or other light sources having an appropriate wavelength (e.g., below approximately 100 nm). In another example, the light source is an EUV source having a wavelength of about 13.5 nm or less.

Once the patterned mask has been formed over the transition metal-containing layer 302, the transition metal-containing layer 302 is patterned into the transition metal-containing pieces 310 by using the patterned mask as an etch mask. The patterning process may be any acceptable etch process, such as a reactive ion etch (RIE), neutral beam etch (NBE), the like, or a combination thereof. The etching may be anisotropic, thus allowing the transition metal-containing pieces 310 having substantially straight sidewalls. Although the transition metal-containing pieces 310 illustrated in FIG. 19B have vertical sidewalls, the etching process may lead to tapered sidewalls, as indicated by dash line DL2, in accordance with some other embodiments.

Figure 20A:
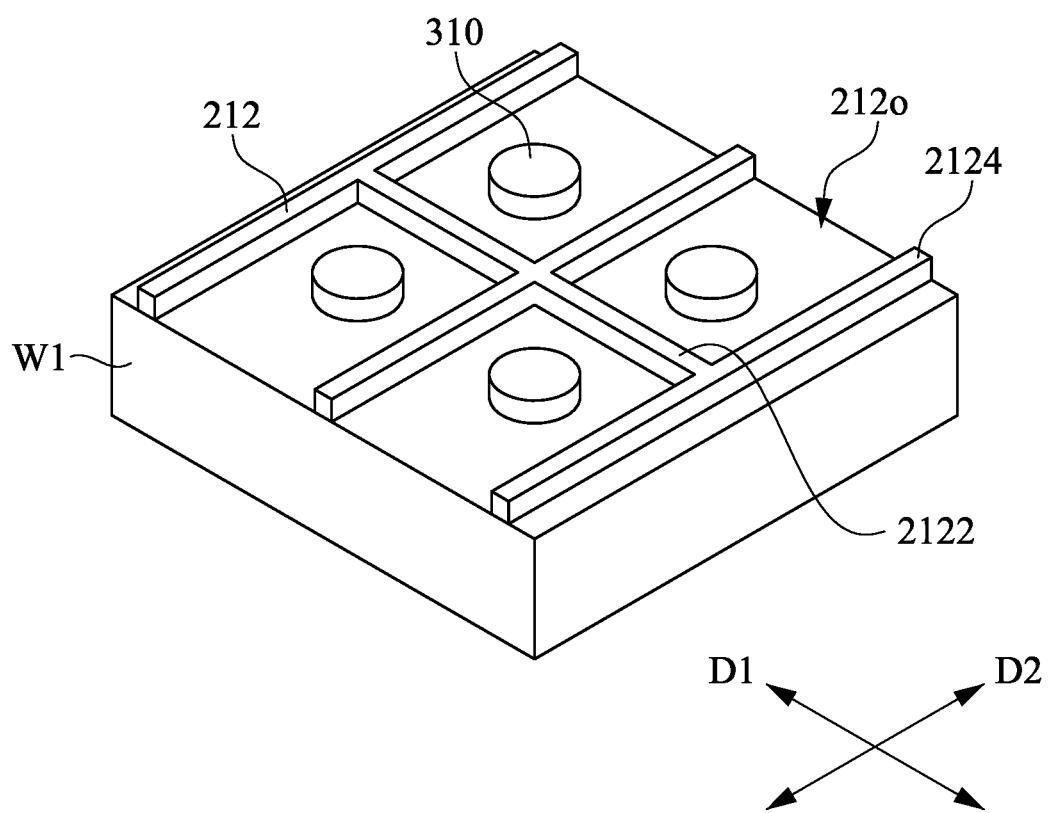
Figure 20B:
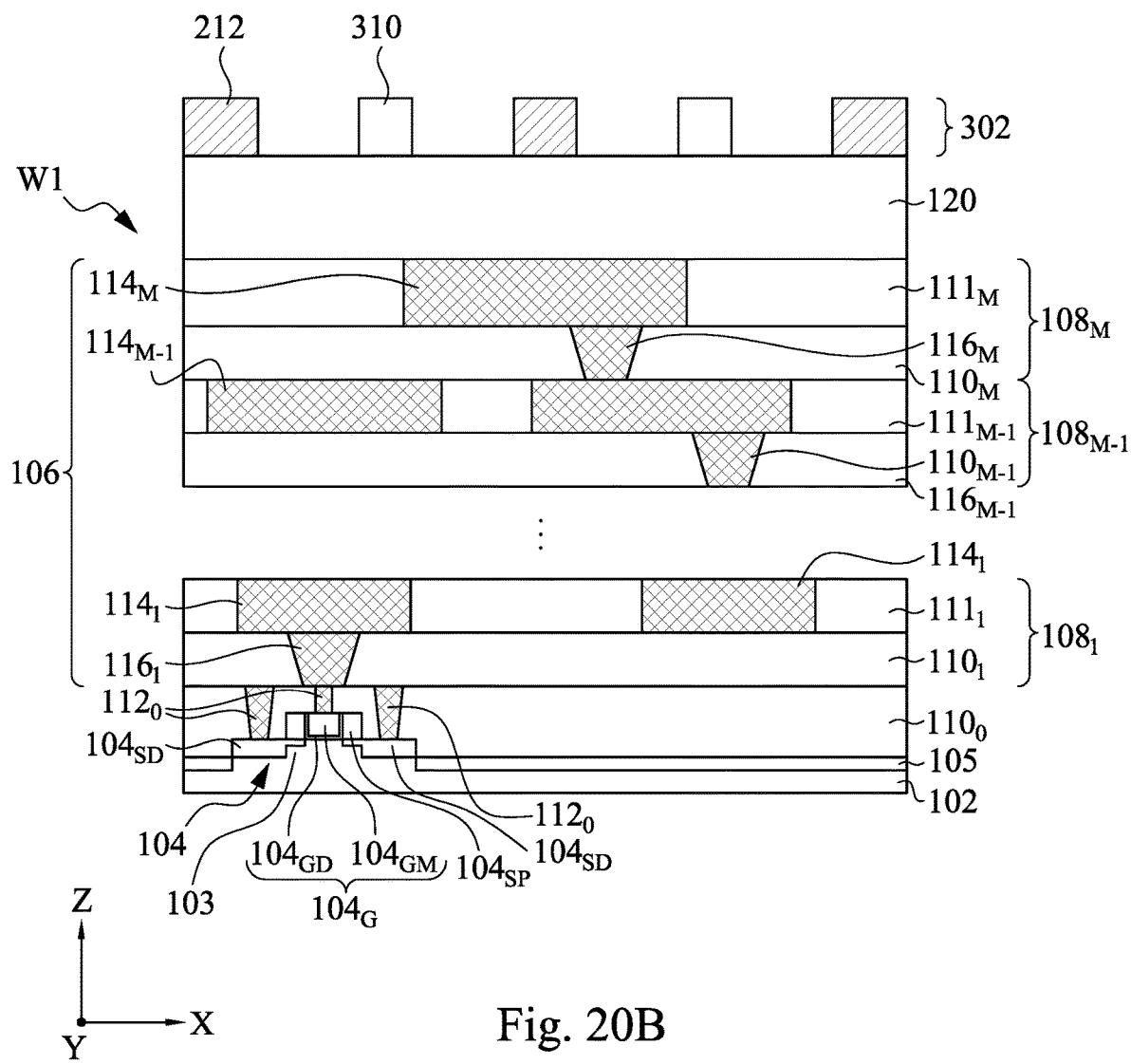

In FIGS. 20A-20B, a dielectric grid 212 is formed over the ILD layer 120 of the wafer W1 before following lateral epitaxial growth from 2D semiconductor seeds formed from the transition metal-containing pieces 310. The dielectric grid 212 is localized to expected crystal grain boundaries that are supposed to form in the following lateral epitaxial growth process, which in turn prevents crystal grain boundaries formed in the subsequent lateral epitaxial growth. Stated differently, the pattern of the dielectric grid 212 and the pattern of the transition metal-containing pieces 310 are co-designed and coordinated. The dielectric grid 212 has grid cells 212o corresponding to the transition metal-containing pieces 310 in a one-to-one manner. In some embodiments, the transition metal-containing pieces 310 have centers substantially aligned with centers of the grid cells 212o. In some embodiments, the dielectric grid 212 includes a plurality of first grid lines 2122 extending in a first direction D1 and a plurality of second grid lines 2124 extending in a second direction D2 perpendicular to the first direction D1 and intersecting the plurality of first grid lines 2122. Each grid cell 210o is defined by corresponding two of the first grid lines 2122 and corresponding two of the second grid lines 2124, and thus has a rectangular or square top-view profile. In some embodiments, the transition metal-containing pieces 310 have a circular or elliptical top-view profile and thus have a different top-view profile than the grid cells 210o. Materials and forming processes about the dielectric grid 212 is similar to the descriptions with respect to FIGS. 5A-5B, and thus are not repeated for the sake of brevity.

Figure 21A:
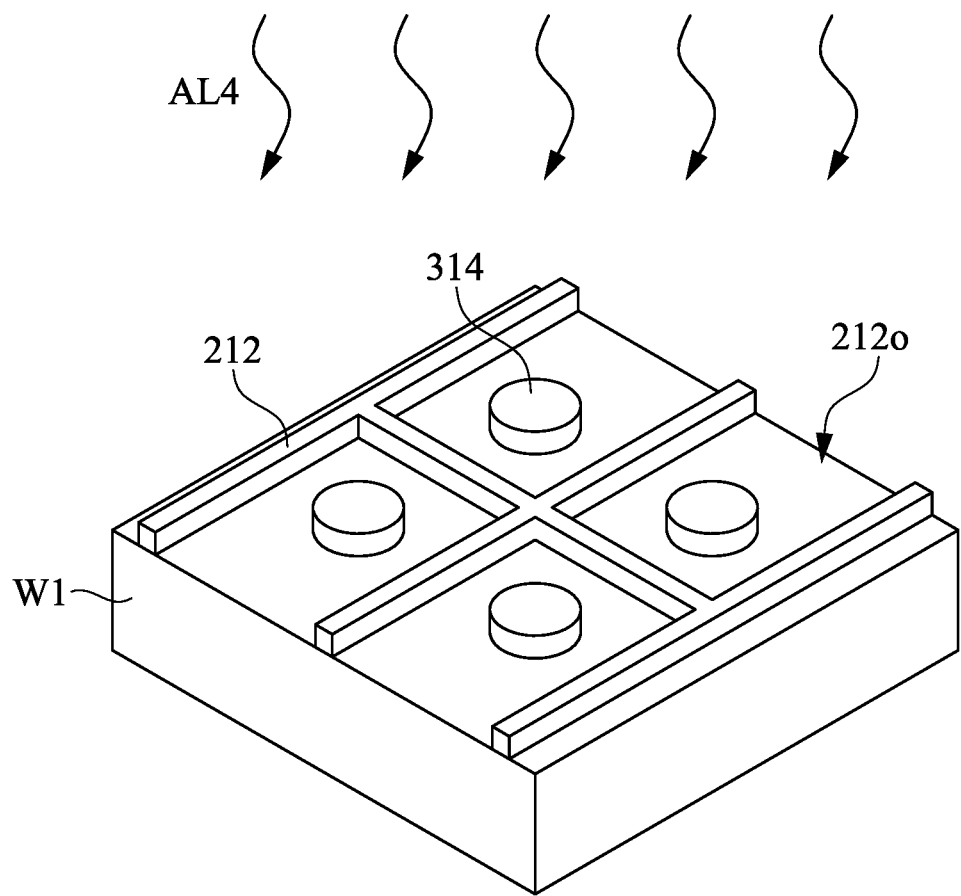
Figure 21B:
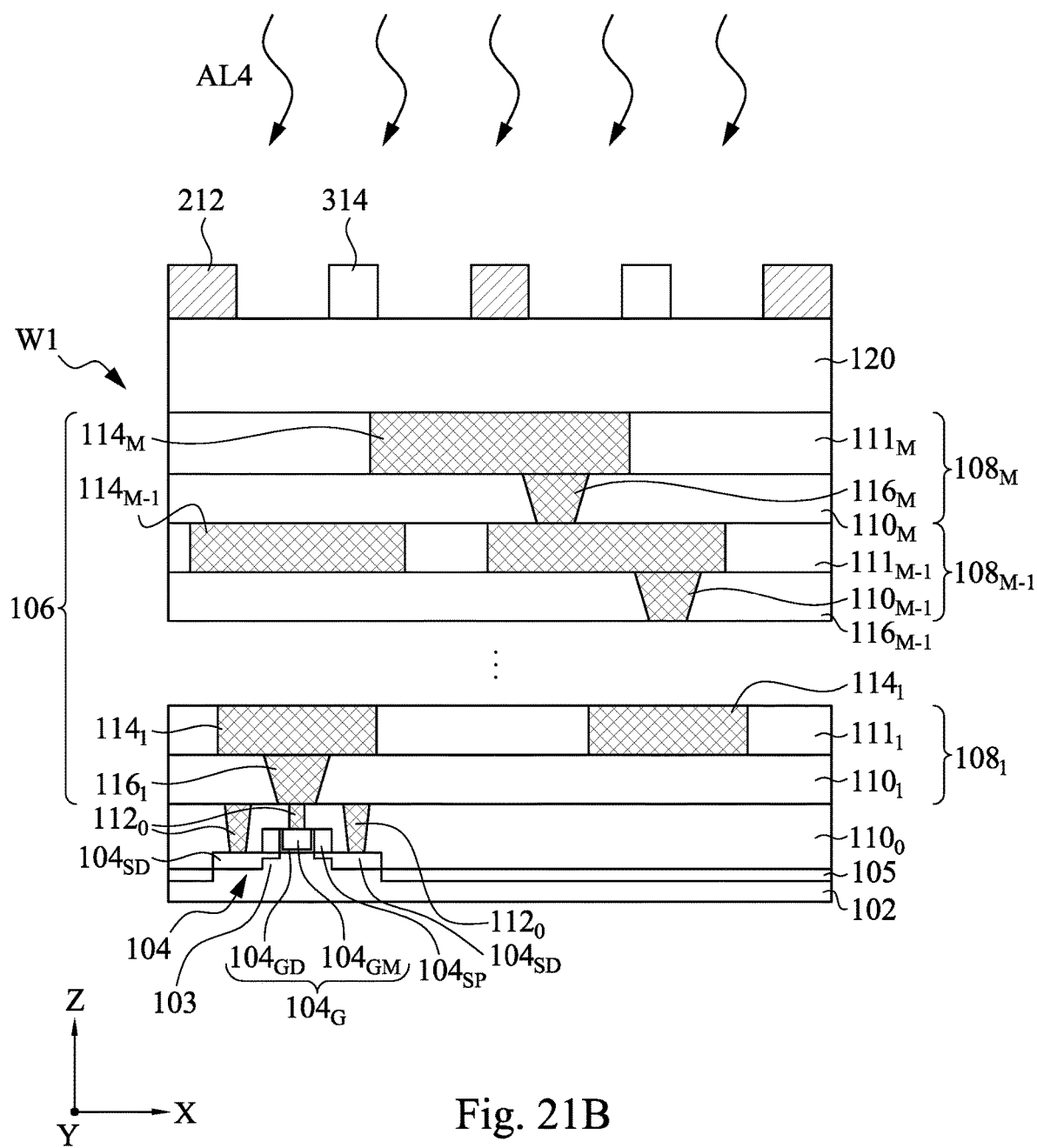

In FIGS. 21A-21B, an annealing process AL4 is performed to convert the transition metal-containing pieces 310 into defect-less 2D semiconductor seeds (i.e., TMD seeds) 314. For example, the annealing process AL4 is performed using a sulfur-containing gas (e.g., $H_2S$) or a selenium-containing gas ($H_2Se$) as an ambient gas, thus sulfurizing or selenizing the transition metal-containing pieces 310 into transition metal dichalcogenide (TMD) seeds 314. For example, in some embodiments where the transition metal-containing pieces 310 are $WO_x$, the annealing process AL4 performed using $H_2S$ results in a sulfurization reaction with $WO_x$, thus forming $WS_2$ to serve as TMD seeds 314. In some embodiments where the transition metal-containing pieces 310 are $WO_x$, the annealing process AL4 performed using $H_2Se$ results in a selenization reaction with $WO_x$, thus forming $WSe_2$ to serve as TMD seeds 314. Moreover, the annealing process AL4 is performed such that the crystalline defects (e.g., vacancies and/or interstitials) in each TMD seed diffuse to an edge of the TMD seed and become annihilated, thus decreasing a number of the crystalline defects in each TMD seed to lower than a threshold that qualifies as transistor channel, source, and/or drain.

In some embodiments, the annealing process AL4 is performed at a temperature from about 400 degrees Centigrade to about 1000 degrees Centigrade, depending on the annealing ambient gas. In some embodiments, because the annealing process AL4 is performed on the small transition metal-containing pieces, the annealing process AL4 can performed at a temperature from about 300 degrees Centigrade to about 600 degrees Centigrade to prevent seed size shrinkage. If the annealing temperature is excessively high (e.g., higher than about 1000 degrees Centigrade), the excessively high temperature may melt or vaporize the transition metal-containing pieces. If the annealing temperature is excessively low (e.g., lower than about 300 degrees Centigrade), the excessive low temperature may provide insufficient activation energy for crystallization, or may result in unnecessary deposition phenomenon. In some detailed embodiments, the annealing process AL4 for forming defect-less TMD seeds 314 is performed at a temperature of about 500 degrees Centigrade to about 600 degrees Centigrade, for a duration time about 1 minute to about 90 minutes, and using $H_2S$ or $H_2Se$ as an ambient gas.

Figure 22:
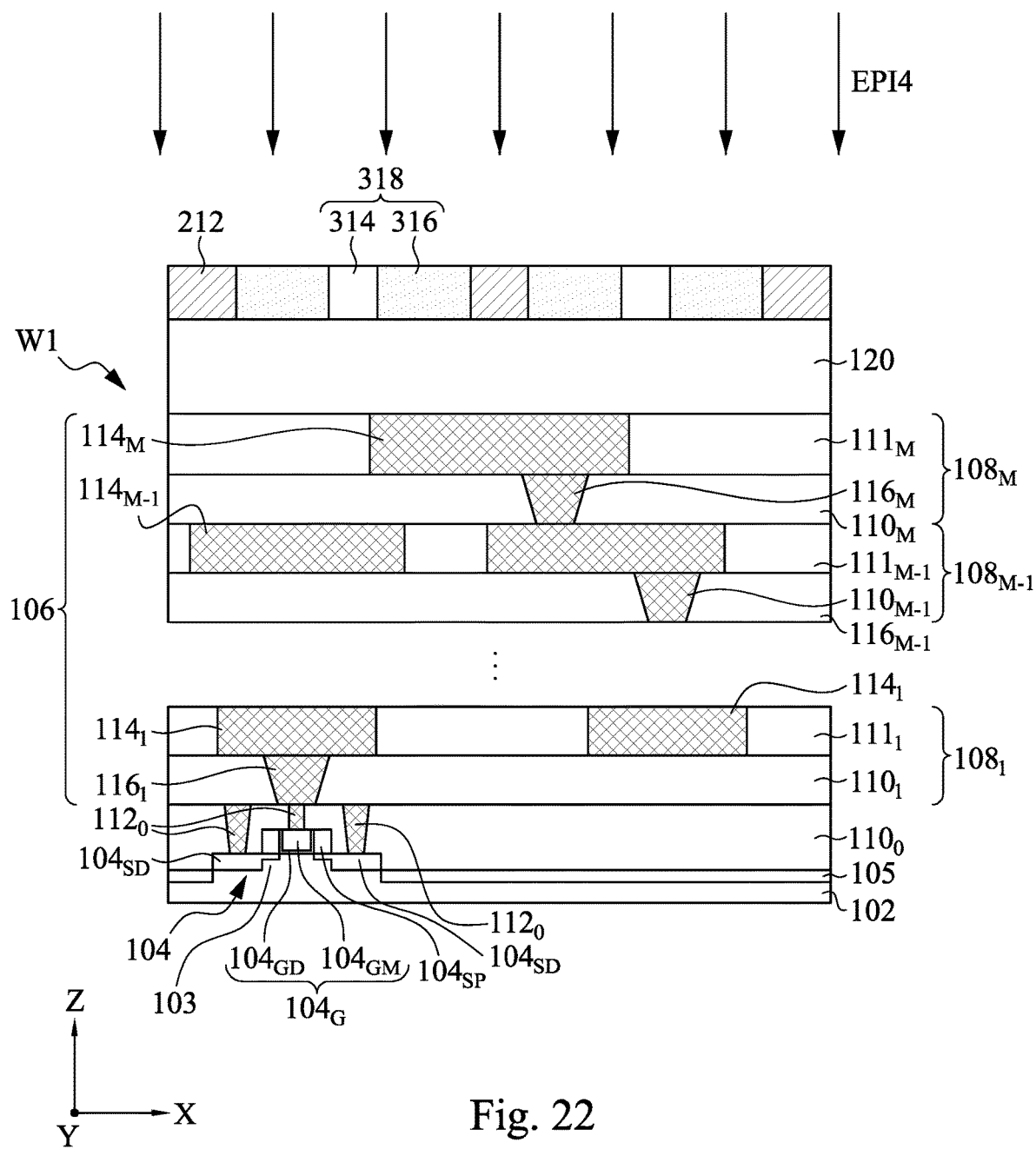

In FIG. 22, an epitaxial growth process EPI4 is performed to laterally grow 2D semiconductor films 316 by using the defect-less TMD seeds 314 as seeds. A defect-less 2D semiconductor seed 314 and a corresponding 2D semiconductor film 316 laterally grown from the defect-less TMD seed 314 can be collectively referred to as a 2D semiconductor island 318 confined within a grid cell in the dielectric grid 212. In some embodiments, the 2D semiconductor films 316 have a same TMD material as the defect-less TMD seeds 314 or other TMD materials having a similar lattice constant with that of the seeds 314. For example, when the defect-less TMD seeds 314 are formed of $WS_2$, the 2D semiconductor films 316 can be formed of $WS_2$ by using CVD or ALD with $WF_6$ and $H_2S$ as precursors. In that case, $WS_2$ films 316 can be laterally grown from edges of $WS_2$ seeds 314. When the defect-less TMD seeds 314 are formed of $WSe_2$, the 2D semiconductor films 316 can be formed of $MoS_2$ by using CVD with $MoO_3$ and sulfur vapor as precursors. In that case, $MoS_2$ films 316 can be laterally grown from edges of $WSe_2$ seeds 314.

After the 2D semiconductor islands 318 are formed, transistors can be formed on the 2D semiconductor islands 318, and an interconnect structure can be formed over the transistors, resulting in a 3D IC structure as illustrated in FIG. 11. Details about forming transistors and an interconnect structure over the 2D semiconductor islands is similar to the descriptions with respect to FIGS. 8-11, and thus are not repeated for the sake of brevity.

FIGS. 23-25A, 26A-27A, and 28 illustrate exemplary perspective views and cross sectional views of various stages for manufacturing a 3D IC structure according to some other embodiments of the present disclosure. It is understood that additional operations can be provided before, during, and after processes shown by FIGS. 23-28, and some of the operations described below can be replaced or eliminated, for additional embodiments of the method. The order of the operations/processes may be interchangeable. The same or similar configurations, materials, processes and/or operation as described with FIGS. 1A-11 may be employed in the following embodiments, and the detailed explanation may be omitted.

Figure 23:
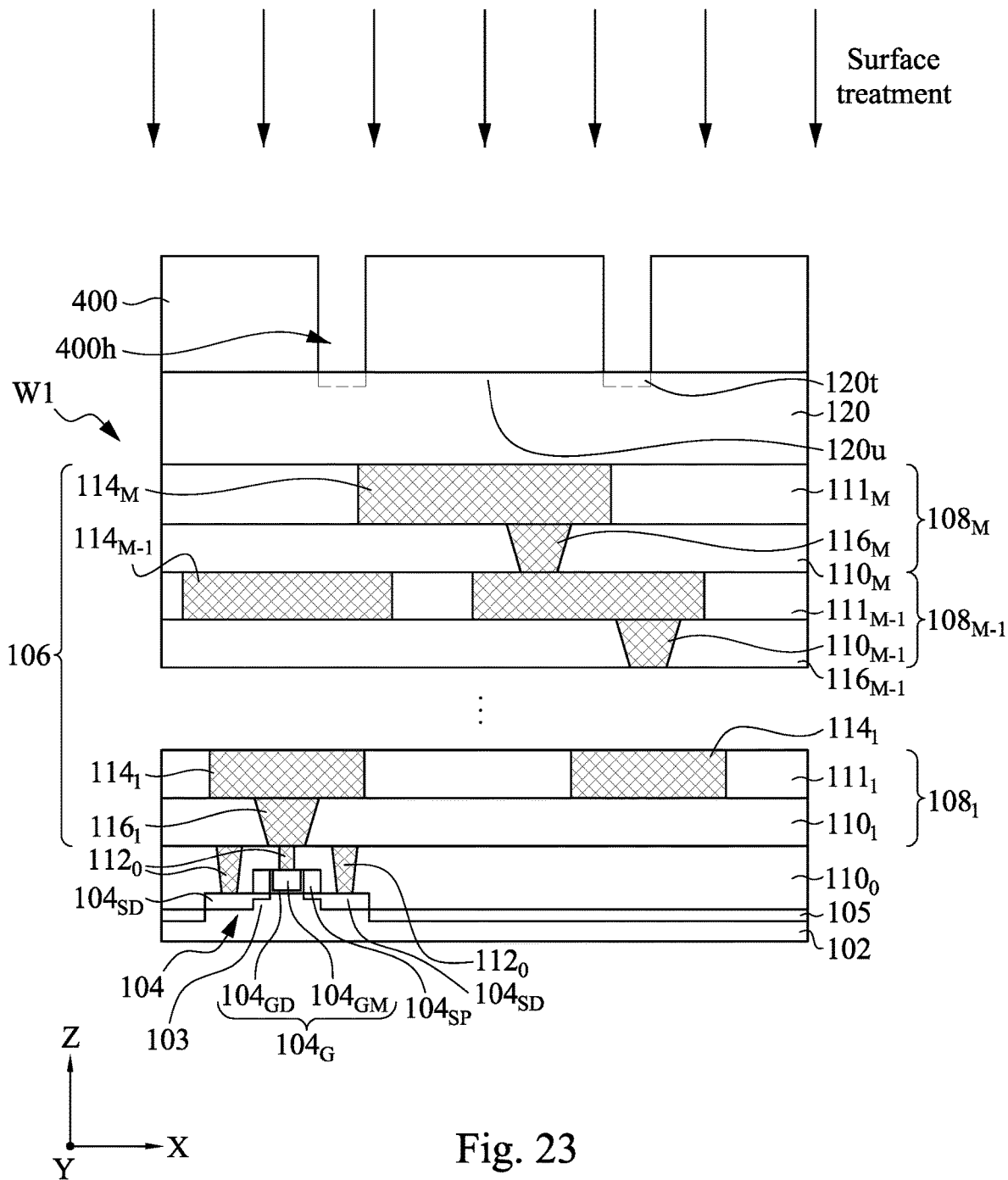

In FIG. 23, a mask layer 400 is formed over the ILD layer 120 and patterned to form openings 400h extending through the mask layer 400 to expose portions the ILD layer 120. In some embodiments, the patterned mask layer 400 may be a photoresist material formed using a spin-on coating process, followed by patterning the photoresist material using suitable lithography techniques. For example, photoresist material 400 is irradiated (exposed) and developed to remove portions of the photoresist material. In greater detail, a photomask (not shown) may be placed over the photoresist material, which may then be exposed to a radiation beam provided by a radiation source such as ultraviolet (UV) source, deep UV (DUV) source, extreme UV (EUV) source, and X-ray source. For example, the radiation source may be a mercury lamp having a wavelength of about 436 nm (G-line) or about 365 nm (I-line); a Krypton Fluoride (KrF) excimer laser with wavelength of about 248 nm; an Argon Fluoride (ArF) excimer laser with a wavelength of about 193 nm; a Fluoride ($F_2$) excimer laser with a wavelength of about 157 nm; or other light sources having an appropriate wavelength (e.g., below approximately 100 nm). In another example, the light source is an EUV source having a wavelength of about 13.5 nm or less.

After the patterned mask layer 400 is formed, a surface treatment is performed on the exposed portions of the ILD layer 120 exposed in the openings 400h of the patterned mask layer 400, to form treated regions 120t in the ILD layer 120. The surface treatment breaks bonds along, e.g., exposed ILD surfaces in the mask openings 400h to enhance the ability for adsorption of material in a subsequent deposition process. In some embodiments, the surface treatment includes a plasma treatment using an oxygen plasma or fluorine plasma, or a wet surface modification process, the like, or combinations thereof. The extent to which the surface treatment is performed (e.g., the extent to which bonds are broken along surfaces) can affect a number of nucleation sites and, therefore, at least an initial deposition rate for a later deposited 2D semiconductor material, as will be described subsequently. Generally, the more bonds that are broken and the more dangling bonds that are created, the more nucleation sites may be available for adsorption and nucleation of the 2D semiconductor material for an increased deposition rate, at least initially in the deposition. As a result, the treated regions 120t of the ILD layer 120 has more nucleation sites for the 2D semiconductor material than an untreated region 120u of the ILD layer 120, which in turn allows selective growth in the following 2D semiconductor material deposition process.

Figure 24:
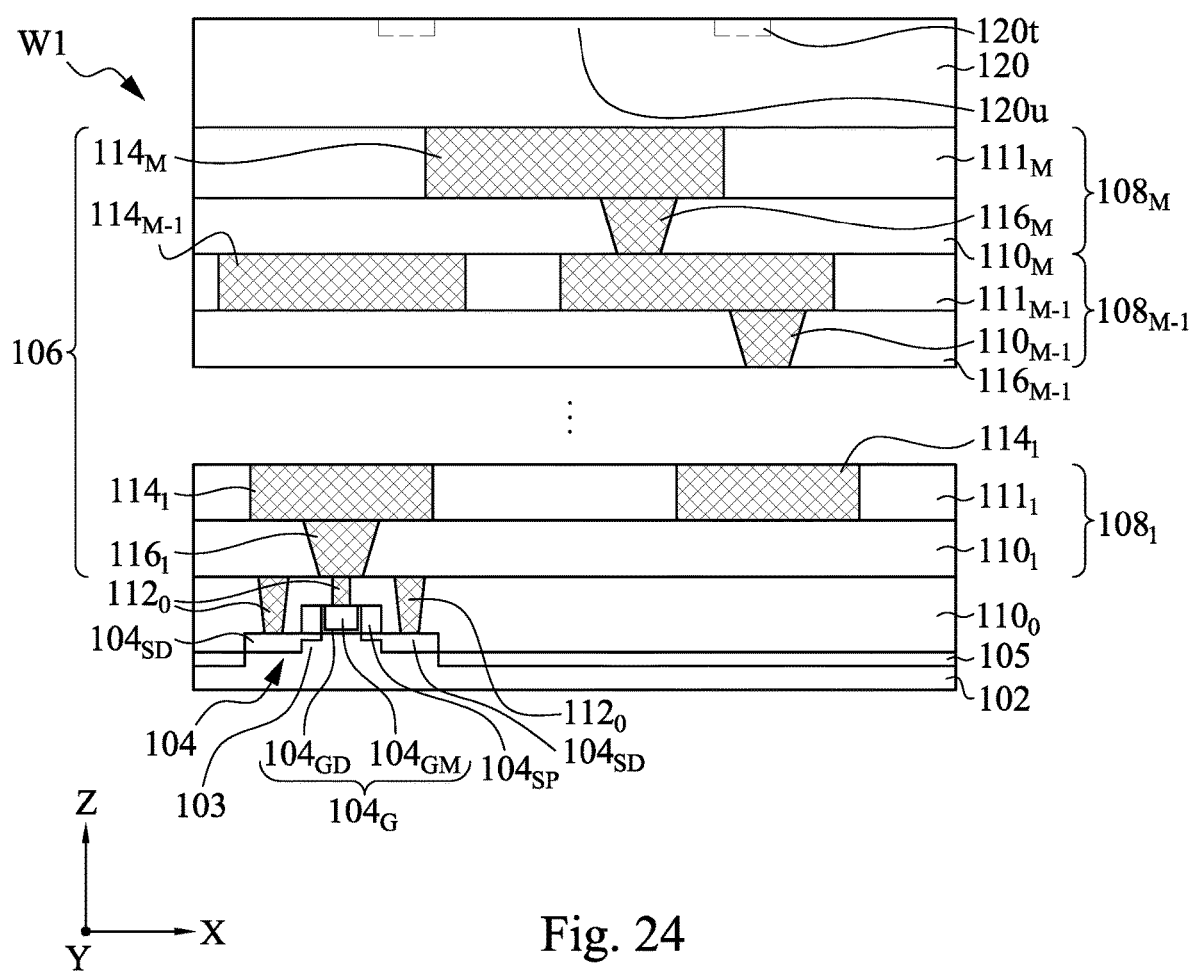

In FIG. 24, the patterned mask layer 400 is removed from the ILD layer 120, for example, using a plasma ash process. In some embodiments, a plasma ash process is performed such that the temperature of the photoresist mask 400 is increased until the photoresist mask 400 experiences a thermal decomposition and may be removed. However, any other suitable process, such as a wet strip, may be utilized. Removal of the patterned mask layer 400 has no or negligible impacts on the dangling bonds and/or broken bonds in the treated regions 120t, which in turn has no or negligible impacts on the deposition selectivity between the treated regions 120t and the untreated region 120u in the ILD layer 120.

Figure 25A:
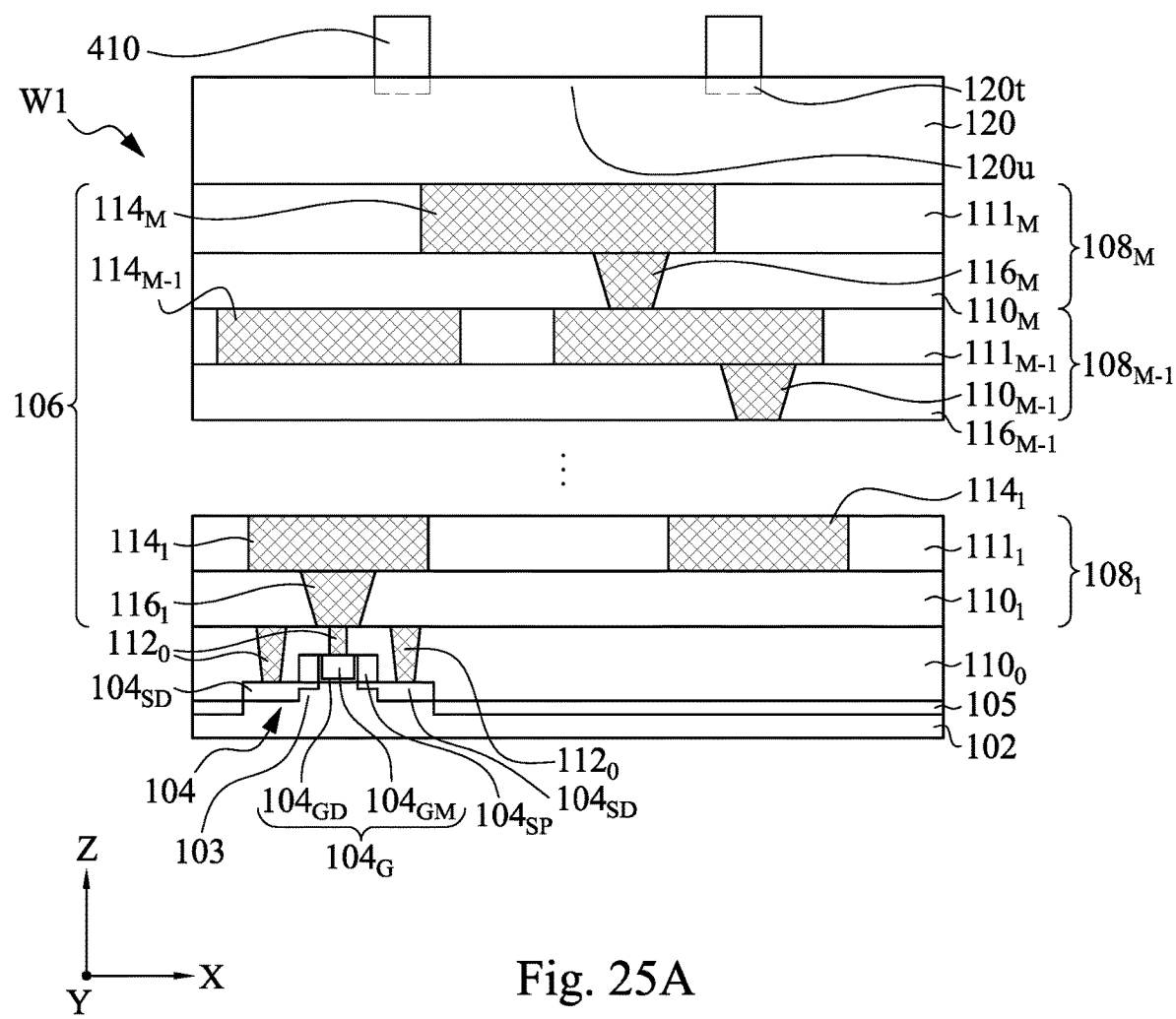

In FIG. 25A, a selective deposition process is performed to selectively form a plurality of defective 2D semiconductor seeds 410 over the treated regions 120t of the ILD layer 120. The surface treatment described with respect to FIG. 24 can increase nucleation cites on the treated regions 120t of the ILD layer 120, and thus the 2D semiconductor material is deposited at a faster deposition rate on the treated regions 120t of the ILD layer 120 than on the untreated region 120u of the ILD layer 120. In some embodiments, the deposition duration time is controlled before 2D semiconductor nucleation on the untreated regions 120u begins. In this way, the untreated region 120u is free of the 2D semiconductor material.

Figure 25B:
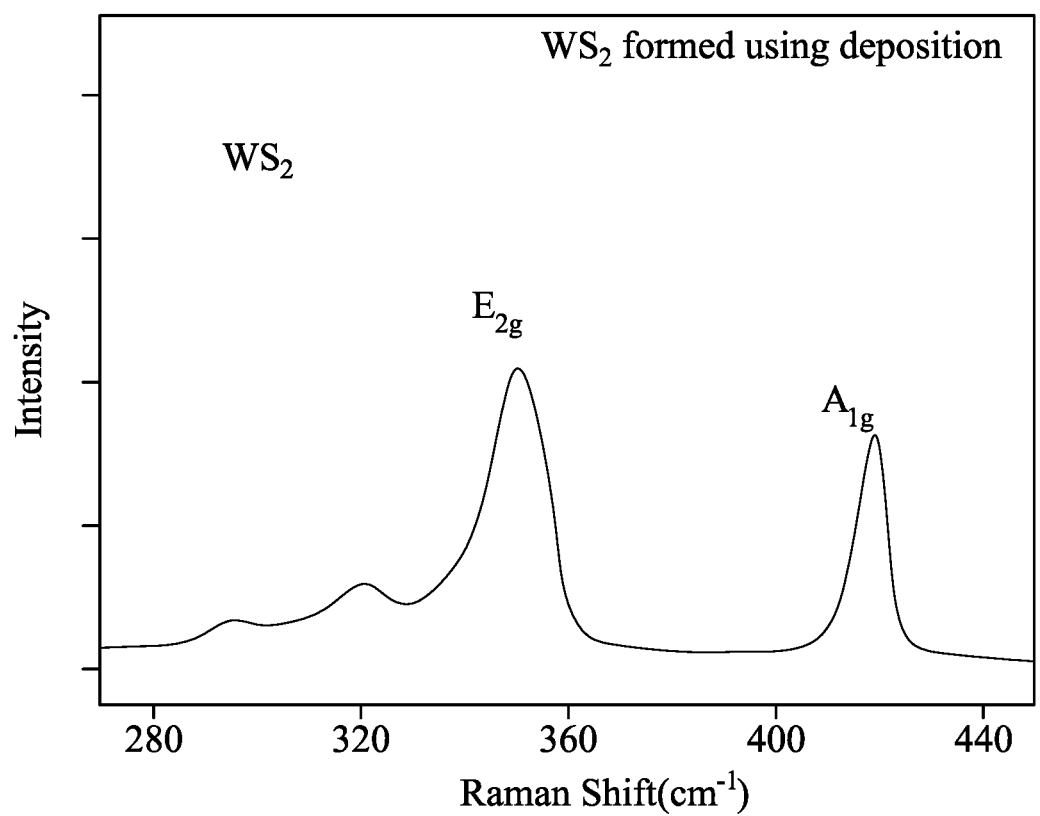
FIG. 25B shows a Raman spectrum of $WS_2$ seeds formed using the steps of FIGS. 23-25A, in accordance with some embodiments of the present disclosure.

In some embodiments, defective 2D semiconductor seeds 410 are TMD, graphene, layered III-VI chalcogenide, graphene, hexagonal Boron Nitride (h-BN), black phosphorus or the like. In some detailed embodiments, the defective 2D seeds 410 are $WS_2$ seeds having a diameter of about 150 nm to about 250 nm (e.g., about 200 nm), deposited using a sulfur-containing gas (e.g., $H_2S$ gas) and a plasma generated from a tungsten-containing gas (e.g., $WF_6$). FIG. 25B shows a Raman spectrum of the $WS_2$ seeds formed using the steps of FIGS. 23-25A. The Raman spectrum shown in FIG. 25B may, as an example, be obtained by performing Raman spectroscopy on the $WS_2$ seeds after the selective deposition process is complete. As shown in FIG. 25B, the existence of $WS_2$ in the seeds is confirmed by a first characteristic peak $E_{2g}$ and a second characteristic peak $A_{1g}$ for $WS_2$, wherein the prominent peaks at $E_{2g}$ and $A_{1g}$ correspond to in-plane and out-of-plane vibrations of atoms. In the Raman spectrum shown in FIG. 25B, the first characteristic peak $E_{2g}$ is located in a range from about 340 $cm^{-1}$ to about 360 $cm^{-1}$, and the second characteristic peak $A_{1g}$ is located in a range from about 410 $cm^{-1}$ to about 430 $cm^{-1}$. It is noted that the positions of the first characteristic peak $E_{2g}$ and the second characteristic peak $A_{1g}$ for $WS_2$ can vary slightly within the above-mentioned ranges depending on the process parameters of the selective deposition process, such as flow rates of the sulfur-containing gas and the tungsten-containing gas, the temperature at which the selective deposition process is performed at, and the duration time of the selective deposition process.

Figure 26A:
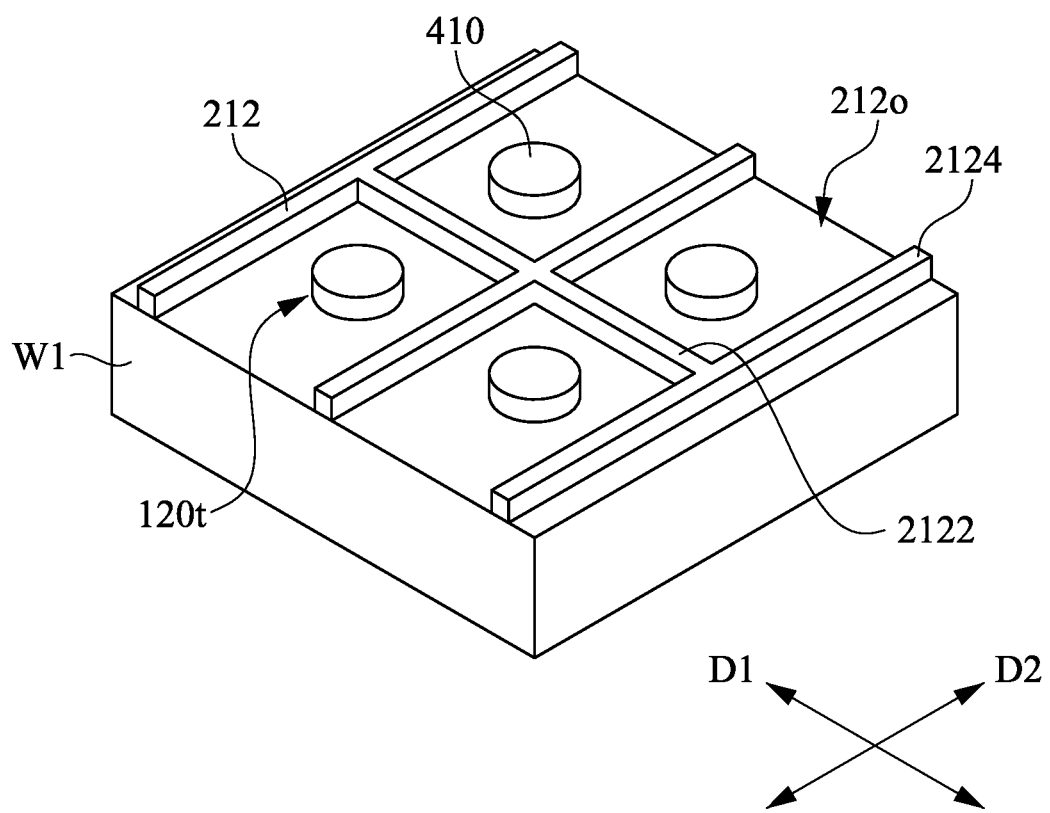
Figure 26B:
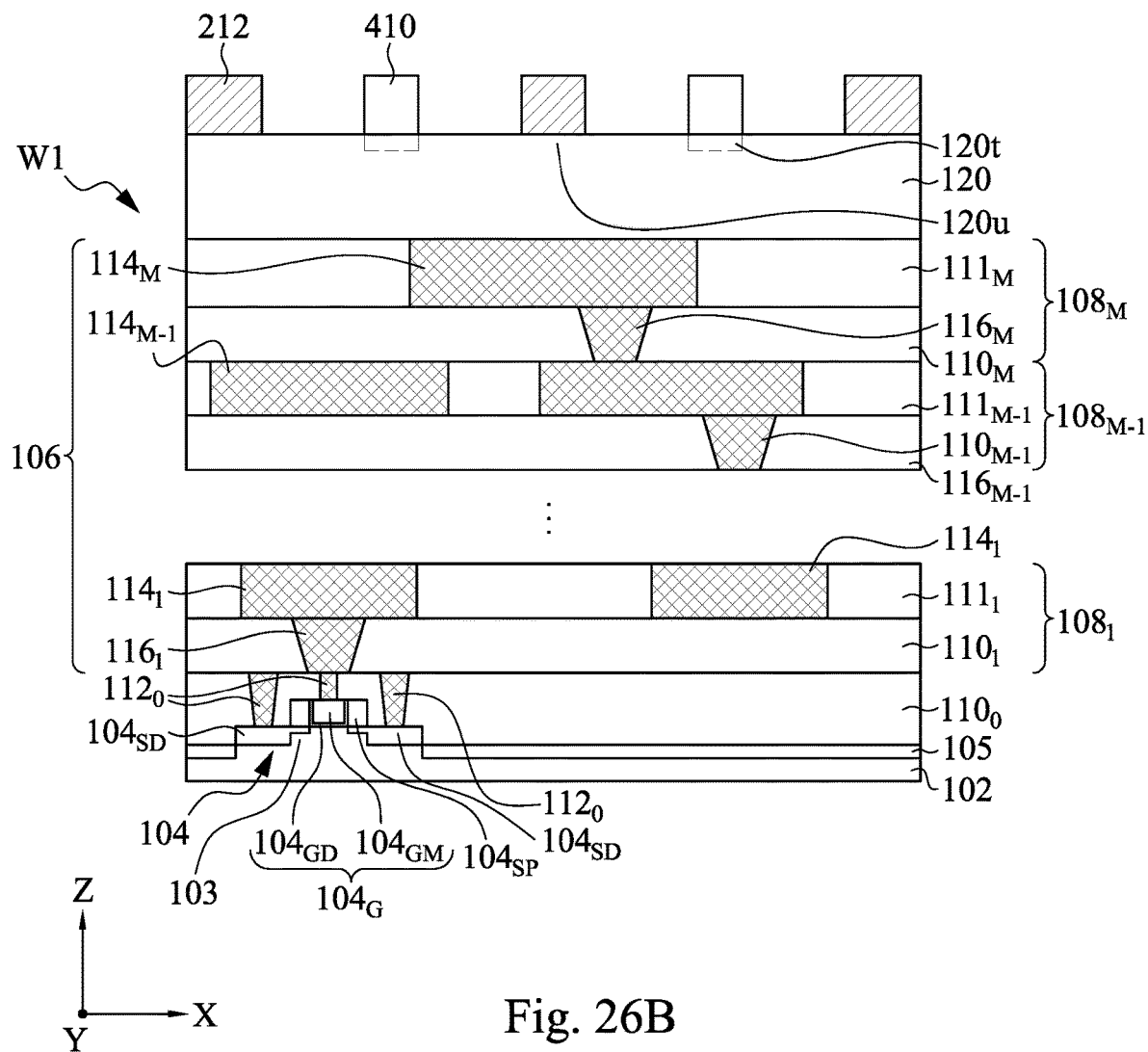

In FIGS. 26A-26B, a dielectric grid 212 is formed over the ILD layer 120 of the wafer W1 before following lateral epitaxial growth from 2D semiconductor seeds 410. The dielectric grid 212 is localized to expected crystal grain boundaries that are supposed to form in the following lateral epitaxial growth process, which in turn prevents crystal grain boundaries formed in the subsequent lateral epitaxial growth. Stated differently, the pattern of the dielectric grid 212 and the pattern of the 2D semiconductor seeds 410 are co-designed and coordinated. Moreover, because the 2D semiconductor seeds 410 are selectively grown from the treated regions 120t of the ILD layer 120, and the treated regions 120t are formed using the patterned mask layer 400 (FIG. 23) as a mask, the pattern of the dielectric grid 212 can be co-designed and coordinated with the pattern of the patterned mask layer 400.

The dielectric grid 212 has grid cells 212o corresponding to the treated regions 120t in a one-to-one manner. In some embodiments, the treated regions 120t have centers substantially aligned with centers of the grid cells 212o. Each grid cell 210o is defined by corresponding two of the first grid lines 2122 and corresponding two of the second grid lines 2124, and thus has a rectangular or square top-view profile. In some embodiments, the treated regions 120t and the overlying defective 2D semiconductor seeds 410 have a circular or elliptical top-view profile and thus have a different top-view profile than the grid cells 210o. Materials and forming processes about the dielectric grid 212 is similar to the descriptions with respect to FIGS. 5A-5B, and thus are not repeated for the sake of brevity.

Figure 27A:
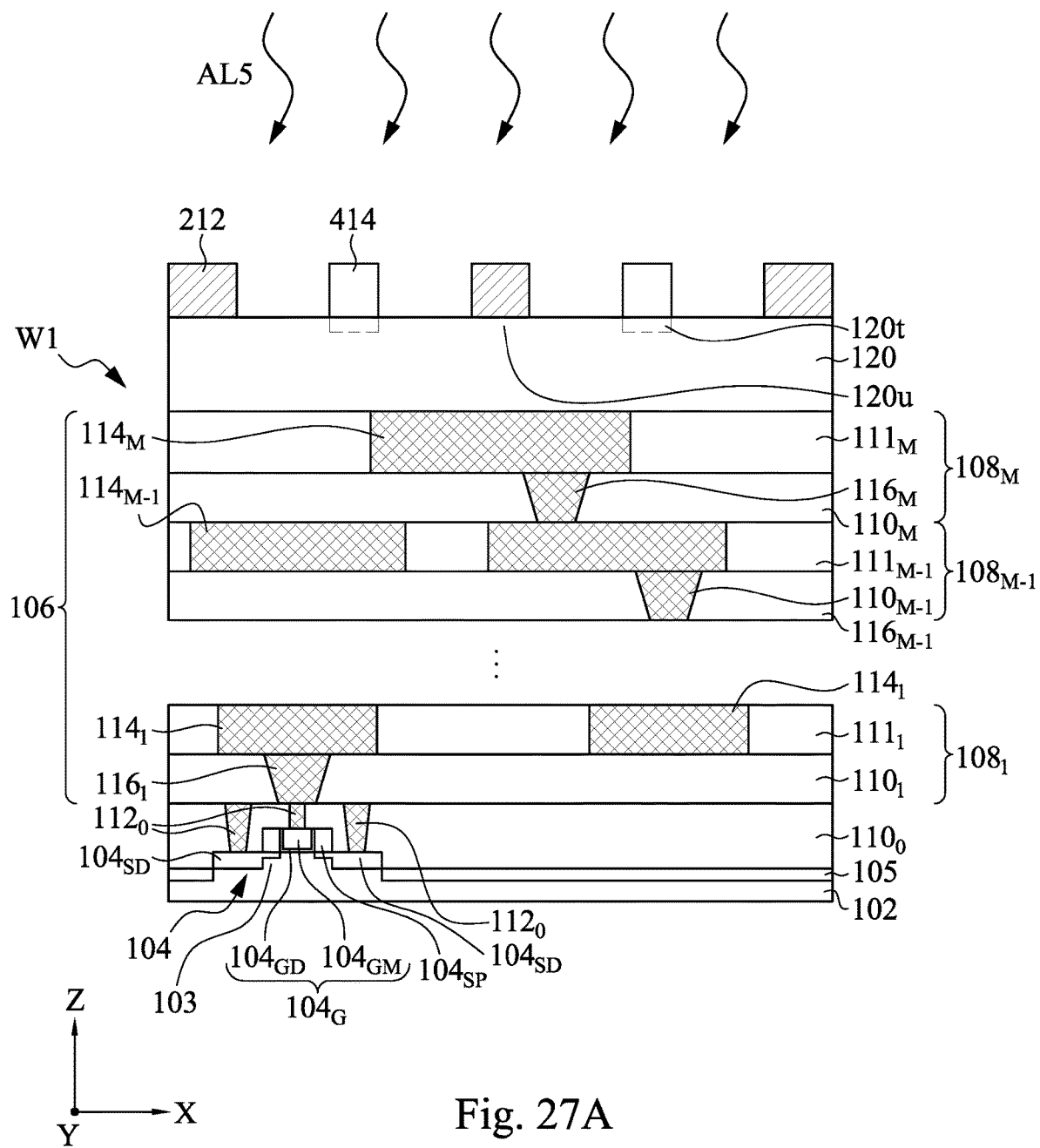
Figure 27B:
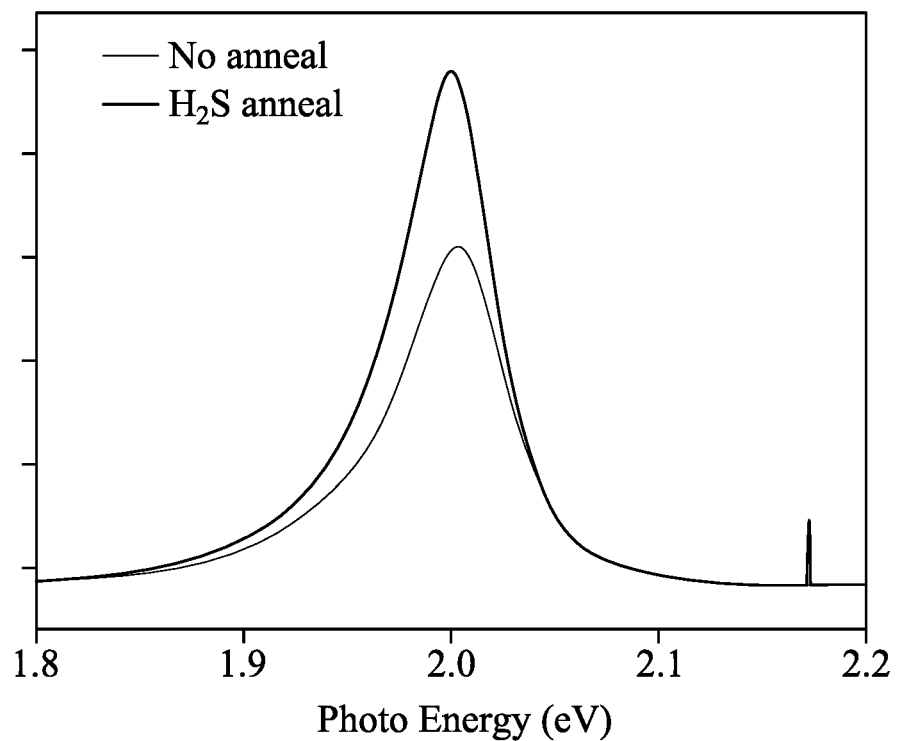
FIG. 27B shows photoluminescence (PL) spectra of 2D semiconductor seeds, in accordance with some embodiments of the present disclosure.

In FIG. 27A, an annealing process AL5 is performed to convert defective 2D semiconductor seeds 410 into defect-less 2D semiconductor seeds 414. The annealing process AL5 is similar to the annealing process AL1 described previously with respect to FIGS. 6A-6B, and thus is not repeated for the sake of brevity. FIG. 27B shows photoluminescence (PL) spectra of 2D semiconductor seeds (e.g., $WS_2$ seeds) measured before $H_2S$ annealing and after $H_2S$ annealing. As illustrated in FIG. 27B, 2D semiconductor seeds subjected to $H_2S$ annealing have a higher and sharper peak than the 2D semiconductor seeds without annealing, which shows the $H_2S$ annealing results in an increased optical property and reduced defects in the 2D semiconductor seeds.

Figure 28:
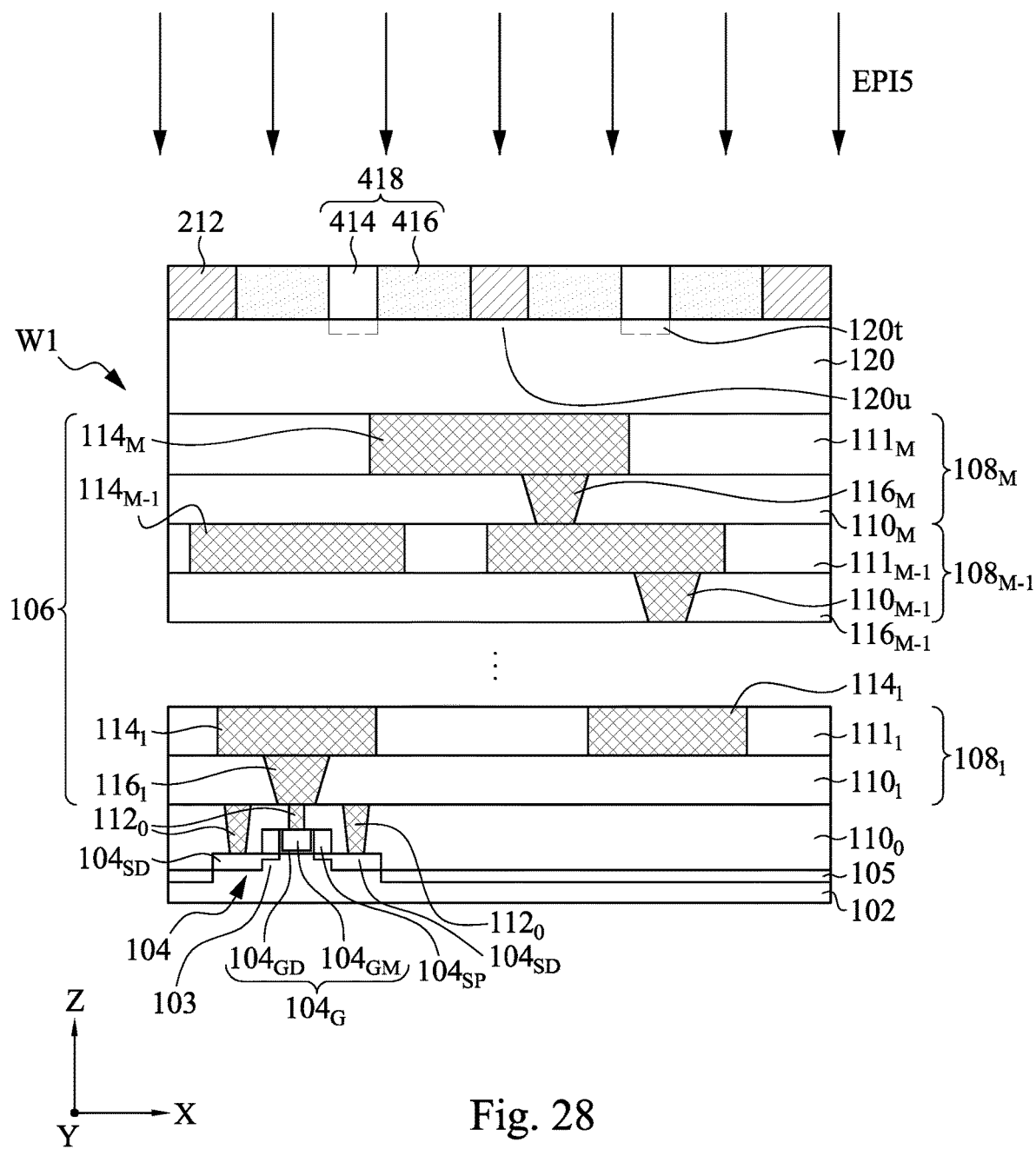

In FIG. 28, an epitaxial growth process EPI5 is performed to laterally grow 2D semiconductor films 416 by using the defect-less TMD seeds 414 as seeds. A defect-less 2D semiconductor seed 414 and a corresponding 2D semiconductor film 416 laterally grown from the defect-less TMD seed 414 can be collectively referred to as a 2D semiconductor island 418 confined within a grid cell in the dielectric grid 212. In some embodiments, the 2D semiconductor films 416 have a same TMD material as the defect-less TMD seeds 414 or other TMD materials having a similar lattice constant with that of the seeds 414. For example, when the defect-less TMD seeds 414 are formed of $WS_2$, the 2D semiconductor films 416 can be formed of $WS_2$ by using CVD or ALD with $WF_6$ and $H_2S$ as precursors. In that case, $WS_2$ films 416 can be laterally grown from edges of $WS_2$ seeds 414 in a homogenous lateral growth. When the defect-less TMD seeds 414 are formed of $WSe_2$, the 2D semiconductor films 416 can be formed of $MoS_2$ by using CVD with $MoO_3$ and sulfur vapor as precursors. In that case, $MoS_2$ films 416 can be laterally grown from edges of $WSe_2$ seeds 414 in a heterogeneous lateral growth.

FIGS. 29-31A and 32-34 illustrate exemplary cross sectional views of various stages for manufacturing a 3D IC structure according to some other embodiments of the present disclosure. It is understood that additional operations can be provided before, during, and after processes shown by FIGS. 29-34, and some of the operations described below can be replaced or eliminated, for additional embodiments of the method. The order of the operations/processes may be interchangeable. The same or similar configurations, materials, processes and/or operation as described with FIGS. 1A-11 may be employed in the following embodiments, and the detailed explanation may be omitted.

Figure 29:
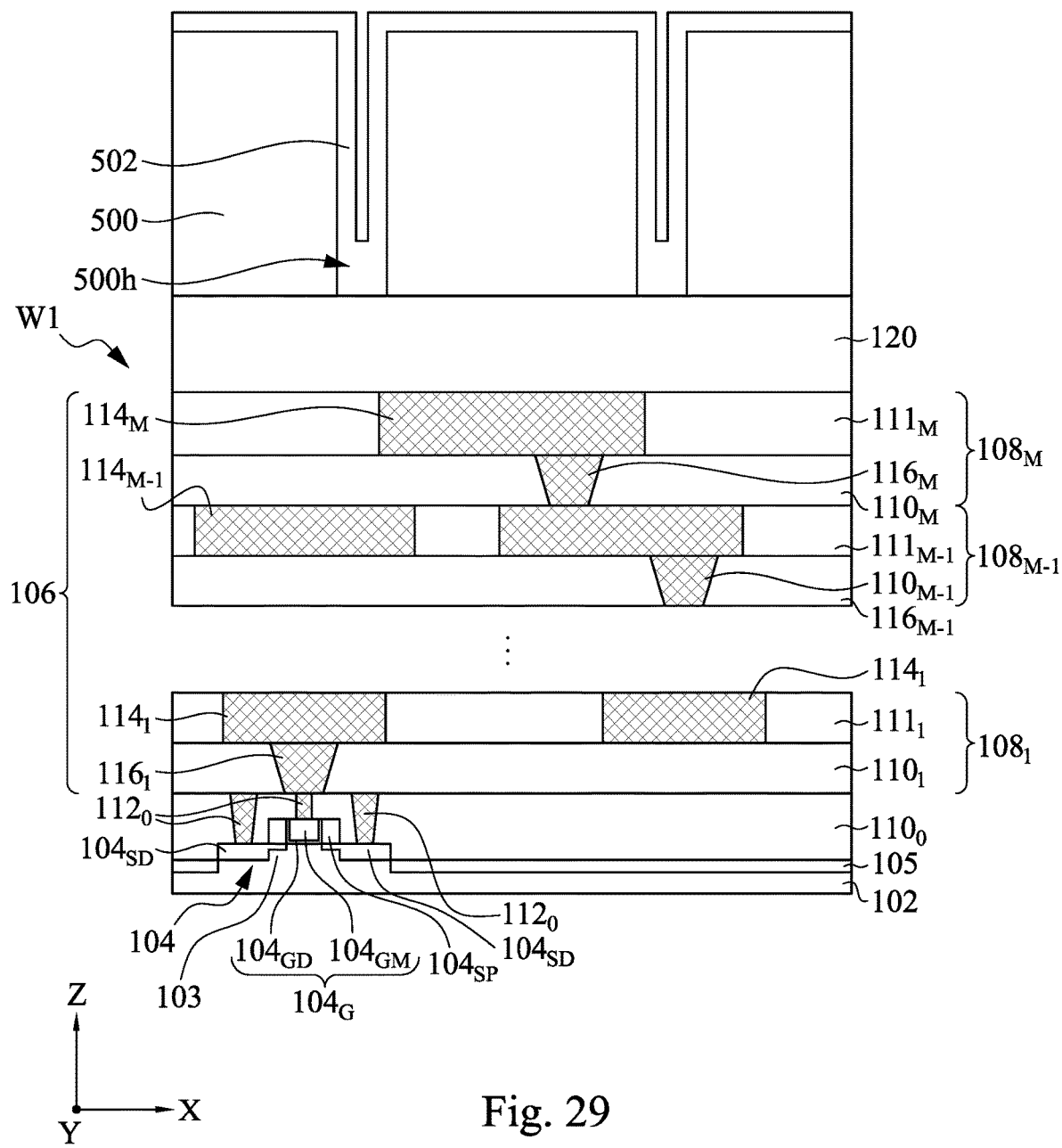

In FIG. 29, a mask layer 500 is formed over the ILD layer 120 and patterned to form openings 500h extending through the mask layer 500 to expose portions the ILD layer 120. In some embodiments, the patterned mask layer 500 may be a photoresist material formed using a spin-on coating process, followed by patterning the photoresist material using suitable lithography techniques. For example, photoresist material 500 is irradiated (exposed) and developed to remove portions of the photoresist material. In greater detail, a photomask (not shown) may be placed over the photoresist material, which may then be exposed to a radiation beam provided by a radiation source such as ultraviolet (UV) source, deep UV (DUV) source, extreme UV (EUV) source, and X-ray source. For example, the radiation source may be a mercury lamp having a wavelength of about 436 nm (G-line) or about 365 nm (I-line); a Krypton Fluoride (KrF) excimer laser with wavelength of about 248 nm; an Argon Fluoride (ArF) excimer laser with a wavelength of about 193 nm; a Fluoride ($F_2$) excimer laser with a wavelength of about 157 nm; or other light sources having an appropriate wavelength (e.g., below approximately 100 nm). In another example, the light source is an EUV source having a wavelength of about 13.5 nm or less.

After the patterned mask layer 500 is formed, a transition metal oxide layer 502 is blanket deposited over the patterned mask layer 500 by using CVD, ALD, PVD or other suitable deposition techniques, and thus portions of the transition metal oxide layer 502 are formed lining bottom surfaces and sidewalls of mask openings 500h. In some embodiments, the transition metal oxide layer 502 includes $MoO_x$, $WO_x$, or other suitable transition metal oxide materials that can be used to form TMD.

Figure 30:
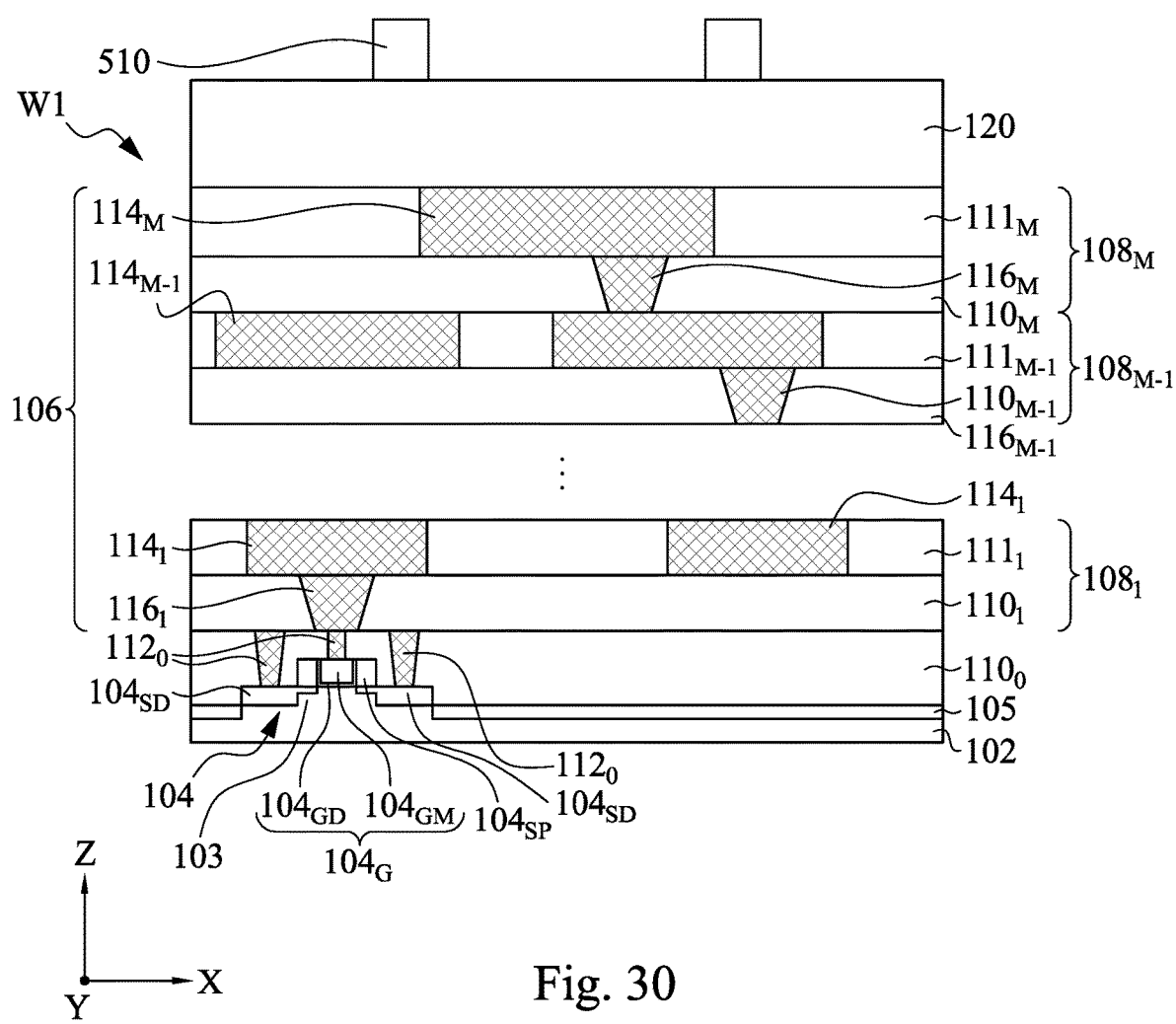

In FIG. 30, the patterned mask layer 500 is removed by using, for example, a lift-off process. Lifting off the patterned mask layer 500 also removes any overlying portions of the transition metal oxide layer 502, thus leaving portions of the transition metal oxide layer 502 localized to partial regions of the ILD layer 120. The remaining portions of the transition metal oxide layer 502 can be referred to as transition metal oxide pieces 510 in some embodiments of the present disclosure. In some embodiments, the transition metal-containing pieces 510 each have a diameter of about 450 nm to about 550 nm (e.g., about 500 nm).

Figure 31A:
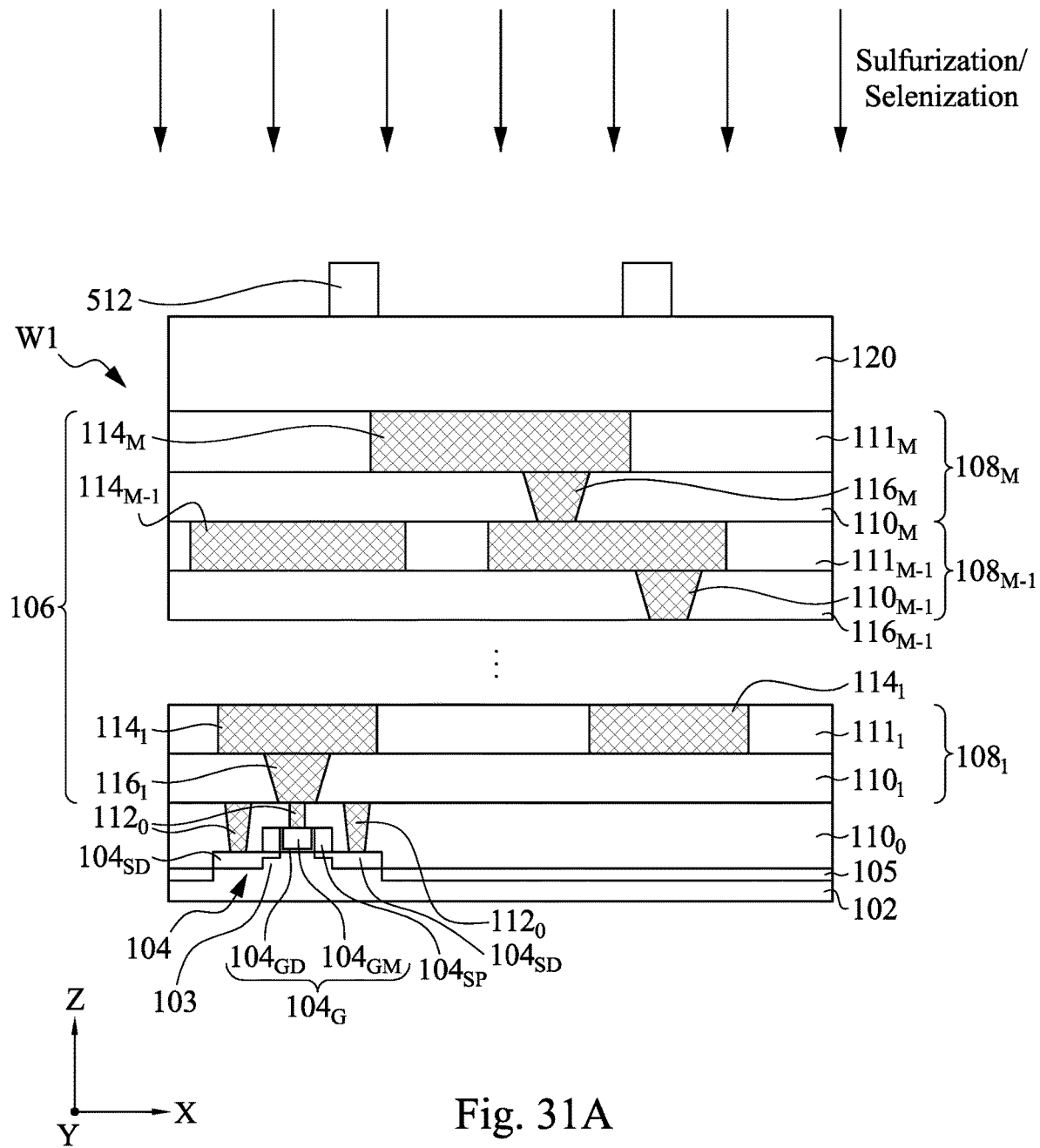
Figure 31B:
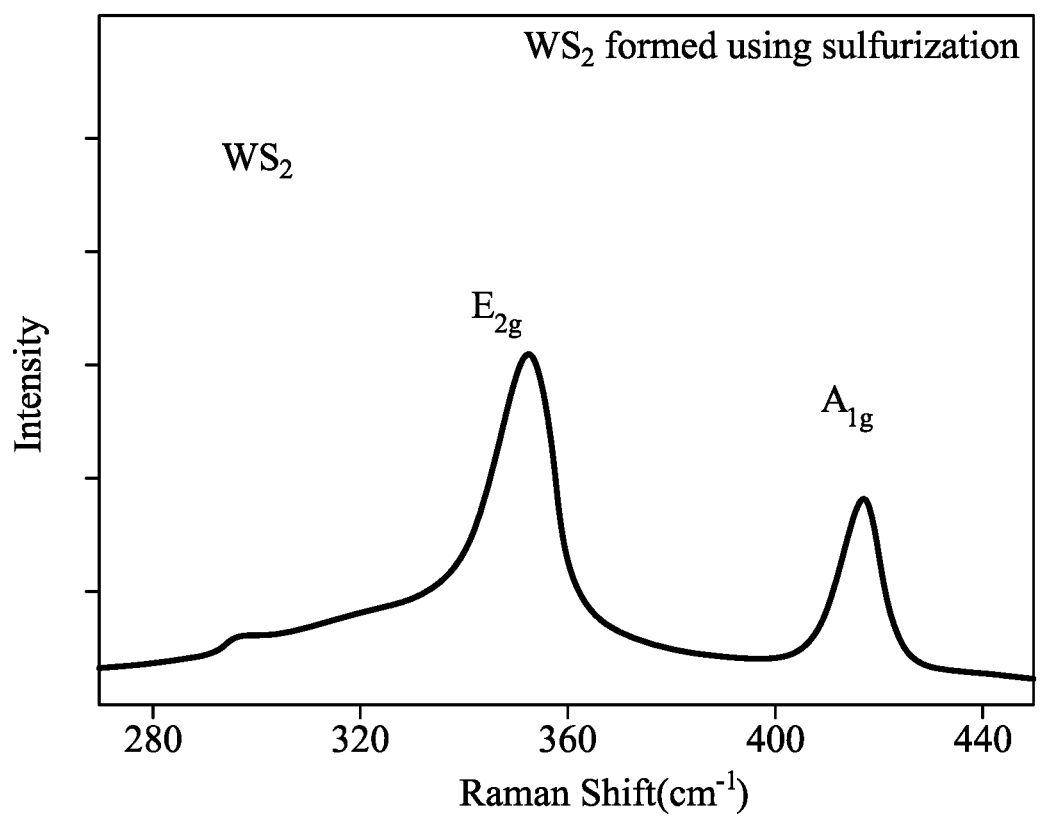
FIG. 31B shows a Raman spectrum of $WS_2$ seeds formed using the steps of FIGS. 29-31A, in accordance with some embodiments of the present disclosure.

In FIG. 31A, a sulfurization or selenization process is performed to sulfurize or selenize the transition metal oxide pieces 510 into transition metal dichalcogenide (TMD) seeds 512. For example, in some embodiments where the transition metal-containing pieces 510 are $WO_x$, the transition metal-containing pieces 510 can be sulfurized by using a $H_2S$ gas, thus forming $WS_2$ to serve as TMD seeds 512; or the transition metal-containing pieces 510 can be selenized by using a $H_2Se$ gas, thus forming $WSe_2$ to serve as TMD seeds 512. FIG. 31B shows a Raman spectrum of $WS_2$ seeds formed using the steps of FIGS. 29-31A. The Raman spectrum shown in FIG. 31B may, as an example, be obtained by performing Raman spectroscopy on the $WS_2$ seeds after the sulfurization process is complete. As shown in FIG. 31B, the existence of $WS_2$ in the seeds is confirmed by a first characteristic peak $E_{2g}$ and a second characteristic peak $A_{1g}$ for $WS_2$, wherein the prominent peaks at $E_{2g}$ and $A_{1g}$ correspond to in-plane and out-of-plane vibrations of atoms. In the Raman spectrum shown in FIG. 31B, the first characteristic peak $E_{2g}$ is located in a range from about 340 $cm^{-1}$ to about 360 $cm^{-1}$, and the second characteristic peak $A_{1g}$ is located in a range from about 410 $cm^{-1}$ to about 430 $cm^{-1}$. It is noted that the positions of the first characteristic peak $E_{2g}$ and the second characteristic peak $A_{1g}$ for $WS_2$ can vary slightly within the above-mentioned ranges depending on the process parameters of the sulfurization process, such as the flow rate of the sulfur-containing gas, the temperature at which the sulfurization is performed at, and the duration time of the sulfurization.

Figure 32:
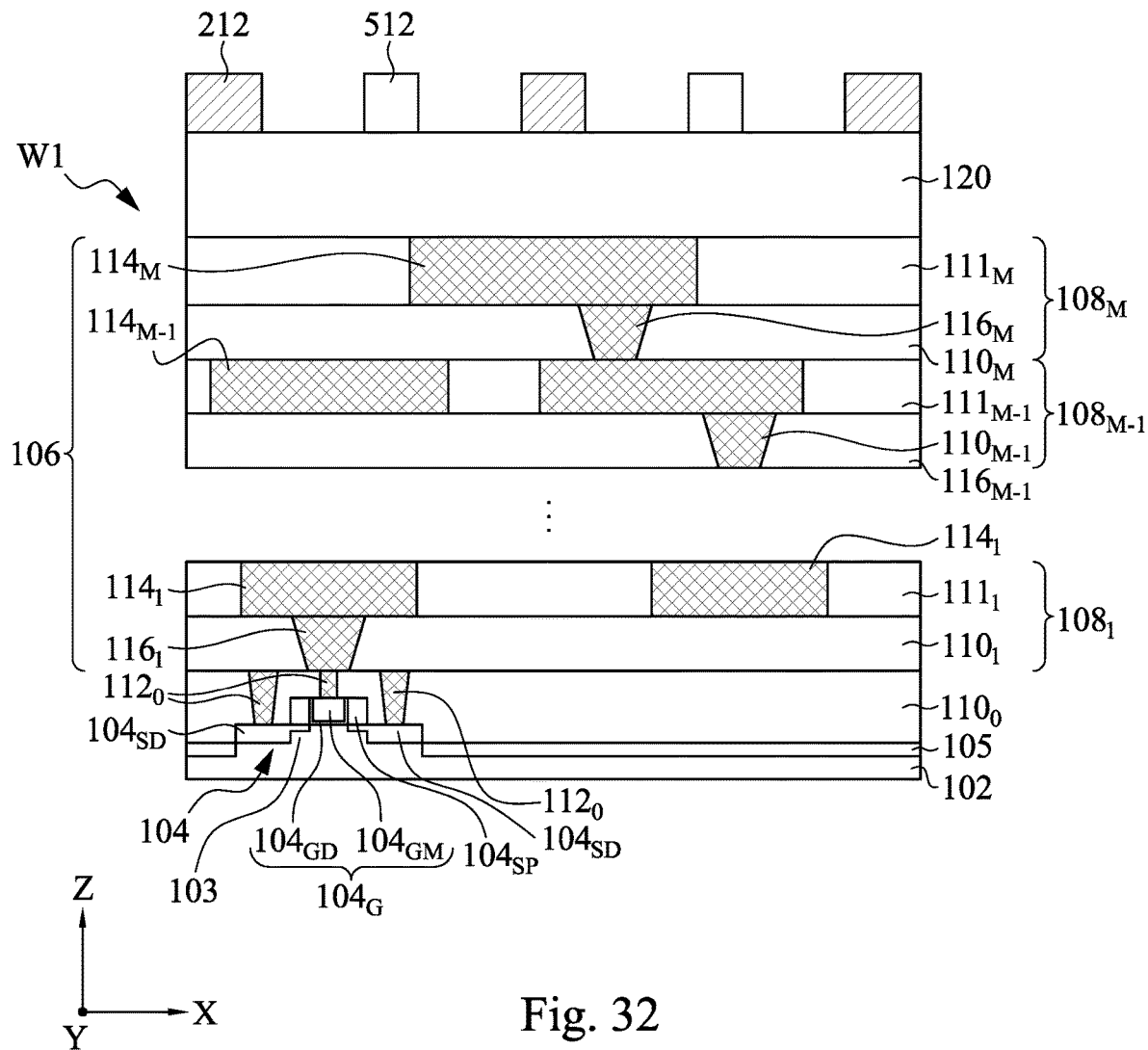

In FIG. 32, a dielectric grid 212 is formed over the ILD layer 120 before lateral epitaxial growth from the TMD seeds 512. Details about the dielectric grid 212 are similar to the descriptions with respect to FIGS. 5A-5B, and thus are not repeated for the sake of brevity.

Figure 33:
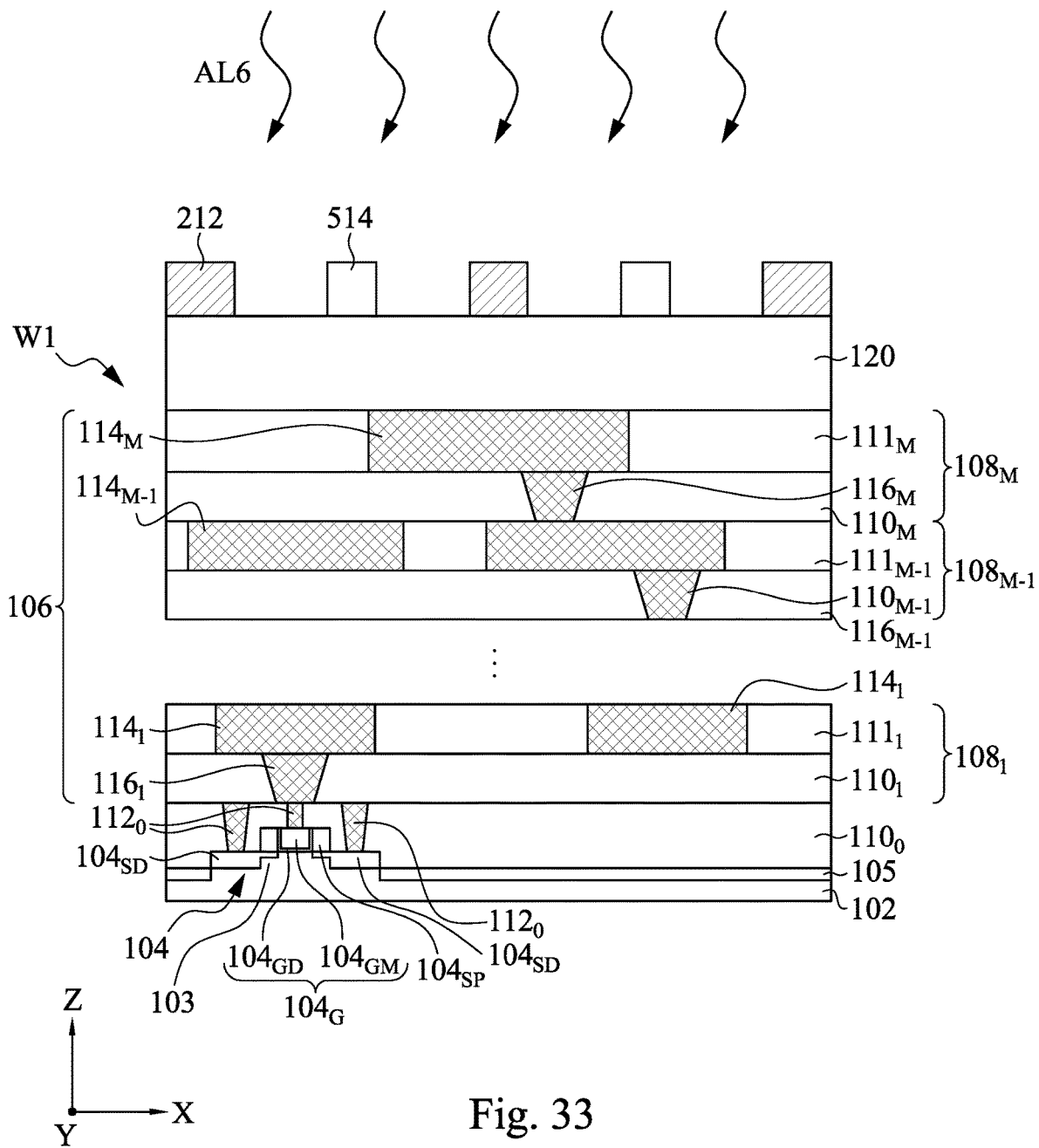

In FIG. 33, an annealing process AL6 is performed to convert the TMD seeds 512 into defect-less TMD seeds 514. In greater detail, the annealing process AL6 is performed such that the crystalline defects (e.g., vacancies and/or interstitials) in each TMD seed diffuse to an edge of the TMD seed and become annihilated, thus decreasing a number of the crystalline defects in each TMD seed to lower than a threshold that qualifies as transistor channel, source, and/or drain. The annealing process AL6 is similar to the annealing process AL1 described previously with respect to FIGS. 6A-6B, and thus is not repeated for the sake of brevity.

Figure 34:
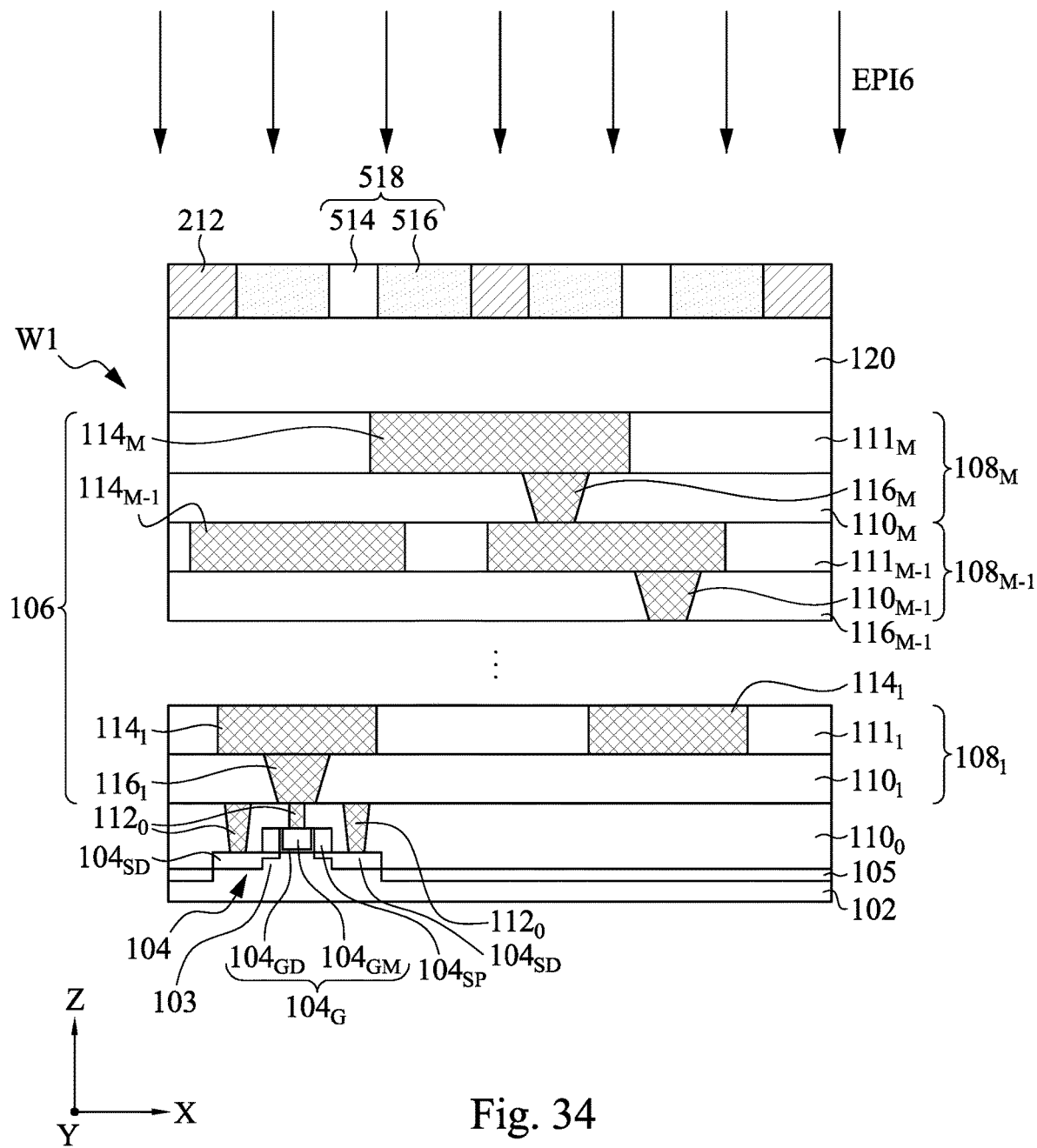

In FIG. 34, an epitaxial growth process EPI6 is performed to laterally grow 2D semiconductor films 516 by using the defect-less TMD seeds 514 as seeds. A defect-less TMD seed 514 and a corresponding 2D semiconductor film 516 laterally grown from the defect-less TMD seed 514 can be collectively referred to as a 2D semiconductor island 518 confined within a grid cell in the dielectric grid 212. In some embodiments, the 2D semiconductor films 516 have a same TMD material as the defect-less TMD seeds 514 or other TMD materials having a similar lattice constant with that of the seeds 514. For example, when the defect-less TMD seeds 514 are formed of $WS_2$, the 2D semiconductor films 516 can be formed of $WS_2$ by using CVD or ALD with $WF_6$ and $H_2S$ as precursors. In that case, $WS_2$ films 516 can be laterally grown from edges of $WS_2$ seeds 514 in a homogenous lateral growth. When the defect-less TMD seeds 514 are formed of $WSe_2$, the 2D semiconductor films 516 can be formed of $MoS_2$ by using CVD with $MoO_3$ and sulfur vapor as precursors. In that case, MoS$_2$ films 516 can be laterally grown from edges of WSe$_2$ seeds 514 in a heterogeneous lateral growth.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that "IC quality" (i.e., having no or negligible crystal defects) 2D semiconductor islands can be formed over an amorphous surface of an interlayer dielectric or inter-metal dielectric. Another advantage is that the IC quality 2D semiconductor islands formed over the ILD or IMD can serve as active regions of transistors, thus forming a 3D IC having lower transistors at a lower level (e.g., lower than an interconnect structure) and higher transistors at a higher level (e.g., higher than the interconnect structure).

In some embodiments, an IC structure comprises a first transistor formed on a substrate, a first interconnect structure over the first transistor, a dielectric layer over the first interconnect structure, a plurality of 2D semiconductor islands on the dielectric layer, and a plurality of second transistors formed on the plurality of 2D semiconductor islands. In some embodiments, the 2D semiconductor islands each comprise a 2D semiconductor seed and a 2D semiconductor film laterally surrounding the 2D semiconductor seed. In some embodiments, the 2D semiconductor film is formed of a same material as the 2D semiconductor seed. In some embodiments, the 2D semiconductor film is formed of a different material than the 2D semiconductor seed. In some embodiments, the 2D semiconductor film has a surface area greater than a surface area of the 2D semiconductor seed. In some embodiments, the 2D semiconductor film has a thickness substantially the same as a thickness of the 2D semiconductor seed. In some embodiments, the 2D semiconductor islands are arranged in rows and columns from top view. In some embodiments, the 2D semiconductor islands are spaced apart from each other. In some embodiments, the IC structure further comprises a dielectric grid over the dielectric layer, and the 2D semiconductor islands are disposed in a plurality of grid cells of the dielectric grid in a one-to-one manner. In some embodiments, adjacent two of the 2D semiconductor islands form a grain boundary. In some embodiments, the IC structure further comprises a second interconnect structure over the plurality of second transistors.

In some embodiments, an IC structure includes an interconnect structure, a dielectric layer, a plurality of 2D semiconductor seeds, a plurality of 2D semiconductor films, and a plurality of transistors. The interconnect structure is above a substrate and comprises a conductive via vertically extending above the substrate and a conductive line laterally extending above the conductive via. The dielectric layer is over the interconnect structure. The 2D semiconductor seeds are arranged in rows and columns on the dielectric layer. The 2D semiconductor films laterally surround the 2D semiconductor seeds, respectively. The transistors are over the 2D semiconductor films. In some embodiments, the 2D semiconductor seeds are made of transition metal dichalcogenide (TMD), graphene, layered III-VI chalcogenide, graphene, hexagonal Boron Nitride (h-BN), or black phosphorus. In some embodiments, the 2D semiconductor films are made of TMD, graphene, layered III-VI chalcogenide, graphene, hexagonal Boron Nitride (h-BN), or black phosphorus. In some embodiments, the 2D semiconductor seeds and the 2D semiconductor films are formed of a same TMD material. In some embodiments, the 2D semiconductor seeds are formed of a first TMD material, and the 2D semiconductor films are formed of a second TMD material different from the first TMD material.

In some embodiments, a method comprises: forming a plurality of first transistors over a substrate; forming an interconnect structure over the plurality of first transistors; forming a dielectric layer over the interconnect structure; forming a plurality of 2D semiconductor seeds over the dielectric layer; annealing the plurality of 2D semiconductor seeds; after annealing the plurality of 2D semiconductor seeds, performing an epitaxy process to laterally grow a plurality of 2D semiconductor films respectively from the plurality of 2D semiconductor seeds; and forming a plurality of second transistors on the plurality of 2D semiconductor films. In some embodiments, forming the 2D semiconductor seeds comprises: depositing a 2D semiconductor layer on a crystalline substrate; transferring the 2D semiconductor layer from the crystalline substrate to the dielectric layer; and patterning the 2D semiconductor layer into the plurality of 2D semiconductor seeds. In some embodiments, forming the 2D semiconductor seeds comprises: depositing a transition metal-containing layer on the dielectric layer; patterning the transition metal-containing layer into a plurality of transition metal-containing pieces; and sulfurizing or selenizing the plurality of transition metal-containing pieces to form the plurality of 2D semiconductor seeds. In some embodiments, forming the 2D semiconductor seeds comprises: performing a surface treatment to treat a plurality of regions of the dielectric layer, while leaving another region of the dielectric layer untreated; and selectively depositing the plurality of 2D semiconductor seeds on the plurality of treated regions of the ILD layer but not on the untreated region of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of first transistors over a substrate;
    forming an interconnect structure over the plurality of first transistors;
    forming a dielectric layer over the interconnect structure;
    forming a plurality of 2D semiconductor seeds over the dielectric layer;
    forming a dielectric grid over the dielectric layer;
    annealing the plurality of 2D semiconductor seeds;
    after annealing the plurality of 2D semiconductor seeds, performing an epitaxy process to laterally grow a plurality of 2D semiconductor films respectively from the plurality of 2D semiconductor seeds; and
    forming a plurality of second transistors on the plurality of 2D semiconductor films.

2. The method of claim 1, wherein forming the plurality of 2D semiconductor seeds comprises:
    depositing a 2D semiconductor layer on a crystalline substrate;

transferring the 2D semiconductor layer from the crystalline substrate to the dielectric layer; and patterning the 2D semiconductor layer into the plurality of 2D semiconductor seeds.

3. The method of claim 1, wherein forming the plurality of 2D semiconductor seeds comprises:

depositing a transition metal-containing layer on the dielectric layer;

patterning the transition metal-containing layer into a plurality of transition metal-containing pieces; and sulfurizing or selenizing the plurality of transition metal-containing pieces to form the plurality of 2D semiconductor seeds.

4. The method of claim 1, wherein forming the plurality of 2D semiconductor seeds comprises:

performing a surface treatment to treat a plurality of regions of the dielectric layer, while leaving another region of the dielectric layer untreated; and selectively depositing the plurality of 2D semiconductor seeds on the plurality of treated regions of the dielectric layer but not on the untreated region of the dielectric layer.

5. The method of claim 1, wherein the dielectric grid is formed after forming the plurality of 2D semiconductor seeds.

6. The method of claim 1, wherein the dielectric grid is formed before annealing the plurality of 2D semiconductor seeds.

7. The method of claim 1, wherein the plurality of 2D semiconductor seeds are respectively in a plurality of grid cells of the dielectric grid.

8. The method of claim 1, wherein the plurality of 2D semiconductor seeds have circular patterns from a top view.

9. The method of claim 1, wherein forming the plurality of second transistors comprises forming source/drain regions in the plurality of 2D semiconductor films.

10. The method of claim 1, wherein forming the plurality of second transistors comprises forming a gate structure over one of the plurality of 2D semiconductor seeds.

11. A method, comprising:

forming a plurality of first transistors over a substrate;

forming an amorphous layer over the plurality of first transistors;

forming a plurality of 2D semiconductor seeds over the amorphous layer;

epitaxially growing a plurality of 2D semiconductor films respectively from the plurality of 2D semiconductor seeds, wherein the plurality of 2D semiconductor films and the plurality of 2D semiconductor seeds have a same material; and forming a plurality of second transistors on the plurality of 2D semiconductor films.

12. The method of claim 11, further comprising:

performing an annealing process on the plurality of 2D semiconductor seeds.

13. The method of claim 12, wherein the annealing process is performed prior to epitaxially growing the plurality of 2D semiconductor films.

14. The method of claim 11, wherein epitaxially growing the plurality of 2D semiconductor films is performed such that the plurality of 2D semiconductor films have substantially planar top surfaces.

15. The method of claim 11, wherein the plurality of 2D semiconductor seeds are formed by sulfurizing or selenizing a plurality of transition metal-containing structures.

16. A method comprising:

forming a plurality of first transistors over a substrate;

forming a dielectric layer over the plurality of first transistors;

forming a plurality of 2D semiconductor seeds over the dielectric layer;

forming a dielectric grid over the dielectric layer, wherein the plurality of 2D semiconductor seeds are respectively within a plurality of grid cells of the dielectric grid;

epitaxially growing a plurality of 2D semiconductor films respectively from the plurality of 2D semiconductor seeds; and forming a plurality of second transistors on the plurality of 2D semiconductor films.

17. The method of claim 16, wherein the dielectric grid is formed after forming the plurality of 2D semiconductor seeds.

18. The method of claim 16, wherein the plurality of 2D semiconductor films are bounded by grid lines of the dielectric grid.

19. The method of claim 16, further comprising:

performing a surface treatment on a plurality of first regions of the dielectric layer, while leaving a second region of the dielectric layer untreated, wherein the plurality of 2D semiconductor seeds are selectively formed on the plurality of first regions and not on the untreated second region.

20. The method of claim 11, further comprising:

forming a dielectric grid over the amorphous layer.

* * * * *